(12) United States Patent
Yamazaki et al.

(10) Patent No.: US 10,141,344 B2
(45) Date of Patent: Nov. 27, 2018

(54) SEMICONDUCTOR DEVICE AND METHOD OF MANUFACTURING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Kiyoshi Kato, Kanagawa (JP); Yuta Endo, Kanagawa (JP); Ryo Tokumaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/811,879

(22) Filed: Nov. 14, 2017

(65) Prior Publication Data

US 2018/0138212 A1  May 17, 2018

(30) Foreign Application Priority Data

Nov. 17, 2016 (JP) .................................. 2016-224503
Nov. 17, 2016 (JP) .................................. 2016-224546

(51) Int. Cl.
*H01L 27/12* (2006.01)
*H01L 21/02* (2006.01)
(Continued)

(52) U.S. Cl.
CPC ...... *H01L 27/1225* (2013.01); *H01L 21/0228* (2013.01); *H01L 21/02274* (2013.01);
(Continued)

(58) Field of Classification Search
CPC combination set(s) only.
See application file for complete search history.

(56) References Cited

U.S. PATENT DOCUMENTS

| 7,674,650 B2 | 3/2010 | Akimoto et al. |
| 8,129,717 B2 | 3/2012 | Yamazaki et al. |

(Continued)

FOREIGN PATENT DOCUMENTS

| JP | 2007-096055 A | 4/2007 |
| JP | 2011-124360 A | 6/2011 |

(Continued)

*Primary Examiner* — Mamadou Diallo
(74) *Attorney, Agent, or Firm* — Fish & Richardson P.C.

(57) ABSTRACT

A semiconductor device having favorable electric characteristics is provided. The semiconductor device includes a first transistor and second transistor. The first transistor includes a first conductor over a substrate; a first insulator thereover; a first oxide thereover; a second insulator over thereover; a second conductor including a side surface substantially aligned with a side surface of the second insulator and being over the second insulator; a third insulator including a side surface substantially aligned with a side surface of the second conductor and being over the second conductor; a fourth insulator in contact with a side surface of the second insulator, a side surface of the second conductor, and a side surface of the third insulator; and a fifth insulator in contact with the first oxide and the fourth insulator. The second transistor includes a third conductor; a fourth conductor at least part of which overlaps with the third conductor; and a second oxide between the third conductor and the fourth conductor. The third conductor and the fourth conductor are electrically connected to the first conductor.

22 Claims, 33 Drawing Sheets

(51) Int. Cl.
  *H01L 21/443* (2006.01)
  *H01L 21/4757* (2006.01)
  *H01L 27/108* (2006.01)
  *H01L 29/10* (2006.01)
  *H01L 29/786* (2006.01)
  *H01L 29/423* (2006.01)

(52) U.S. Cl.
  CPC ...... *H01L 21/443* (2013.01); *H01L 21/47573* (2013.01); *H01L 27/10802* (2013.01); *H01L 27/1255* (2013.01); *H01L 27/1262* (2013.01); *H01L 29/1054* (2013.01); *H01L 29/7869* (2013.01); *H01L 29/78648* (2013.01); *H01L 29/42384* (2013.01); *H01L 29/78696* (2013.01)

(56) References Cited

U.S. PATENT DOCUMENTS

| | | | |
|---|---|---|---|
| 8,222,092 B2 | 7/2012 | Yamazaki et al. | |
| 8,362,538 B2 | 1/2013 | Koyama et al. | |
| 8,384,080 B2 | 2/2013 | Taniguchi et al. | |
| 8,547,771 B2 | 10/2013 | Koyama | |
| 8,586,905 B2 | 11/2013 | Kurokawa | |
| 8,610,696 B2 | 12/2013 | Kurokawa | |
| 8,692,252 B2 | 4/2014 | Takata et al. | |
| 8,737,109 B2 | 5/2014 | Yamazaki et al. | |
| 8,947,158 B2 | 2/2015 | Watanabe | |
| 9,024,317 B2 | 5/2015 | Endo et al. | |
| 9,142,593 B2 | 9/2015 | Okano et al. | |
| 9,159,838 B2 | 10/2015 | Yamazaki et al. | |
| 9,166,192 B2 | 10/2015 | Yamazaki et al. | |
| 9,235,515 B2 | 1/2016 | Tsutsui | |
| 9,240,492 B2 | 1/2016 | Yamazaki | |
| 9,287,878 B2 | 3/2016 | Bjorklund et al. | |
| 9,337,826 B2 | 5/2016 | Koyama et al. | |
| 9,349,751 B2 | 5/2016 | Yamazaki et al. | |
| 9,608,122 B2 | 3/2017 | Yamazaki | |
| 9,660,101 B2 | 5/2017 | Yamazaki | |
| 9,685,500 B2 | 6/2017 | Yamazaki et al. | |
| 9,721,959 B2 | 8/2017 | Takahashi | |
| 9,954,111 B2* | 4/2018 | Yamazaki | H01L 29/7869 |
| 2011/0134680 A1 | 6/2011 | Saito | |
| 2012/0194262 A1 | 8/2012 | Uochi | |
| 2013/0272055 A1 | 10/2013 | Yamamoto | |
| 2015/0263006 A1* | 9/2015 | Kato | H01L 29/7869 257/43 |
| 2015/0270288 A1* | 9/2015 | Yamazaki | H01L 27/1156 257/306 |
| 2015/0287745 A1* | 10/2015 | Kato | H01L 27/0688 257/43 |
| 2016/0035865 A1* | 2/2016 | Nagamatsu | H01L 21/8221 438/104 |
| 2016/0071840 A1* | 3/2016 | Yamamoto | H01L 21/8258 257/43 |
| 2017/0263650 A1 | 9/2017 | Tochibayashi et al. | |
| 2018/0040641 A1* | 2/2018 | Yamazaki | H01L 27/1225 |

FOREIGN PATENT DOCUMENTS

| | | |
|---|---|---|
| JP | 2011-138934 A | 7/2011 |
| JP | 2012-257187 A | 12/2012 |

* cited by examiner

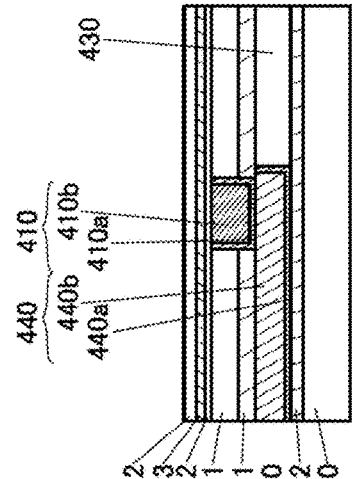
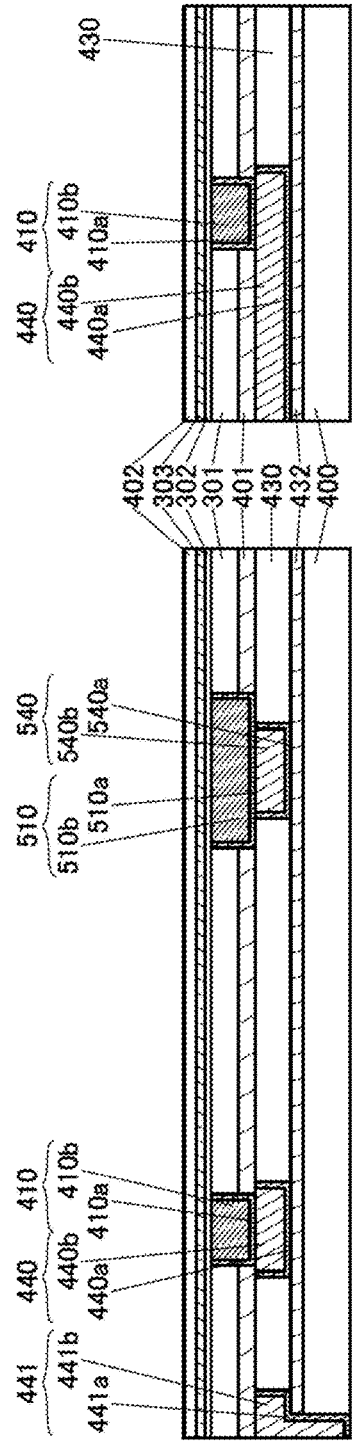
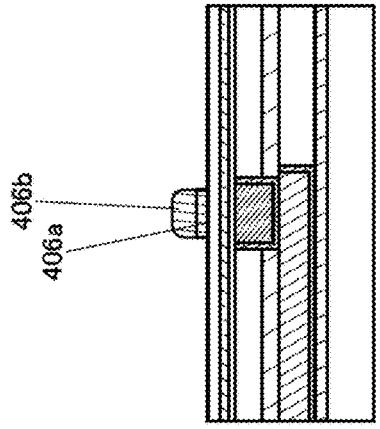
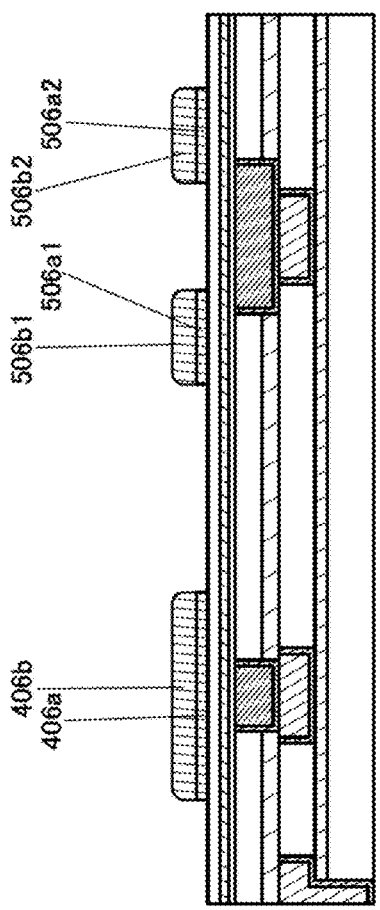

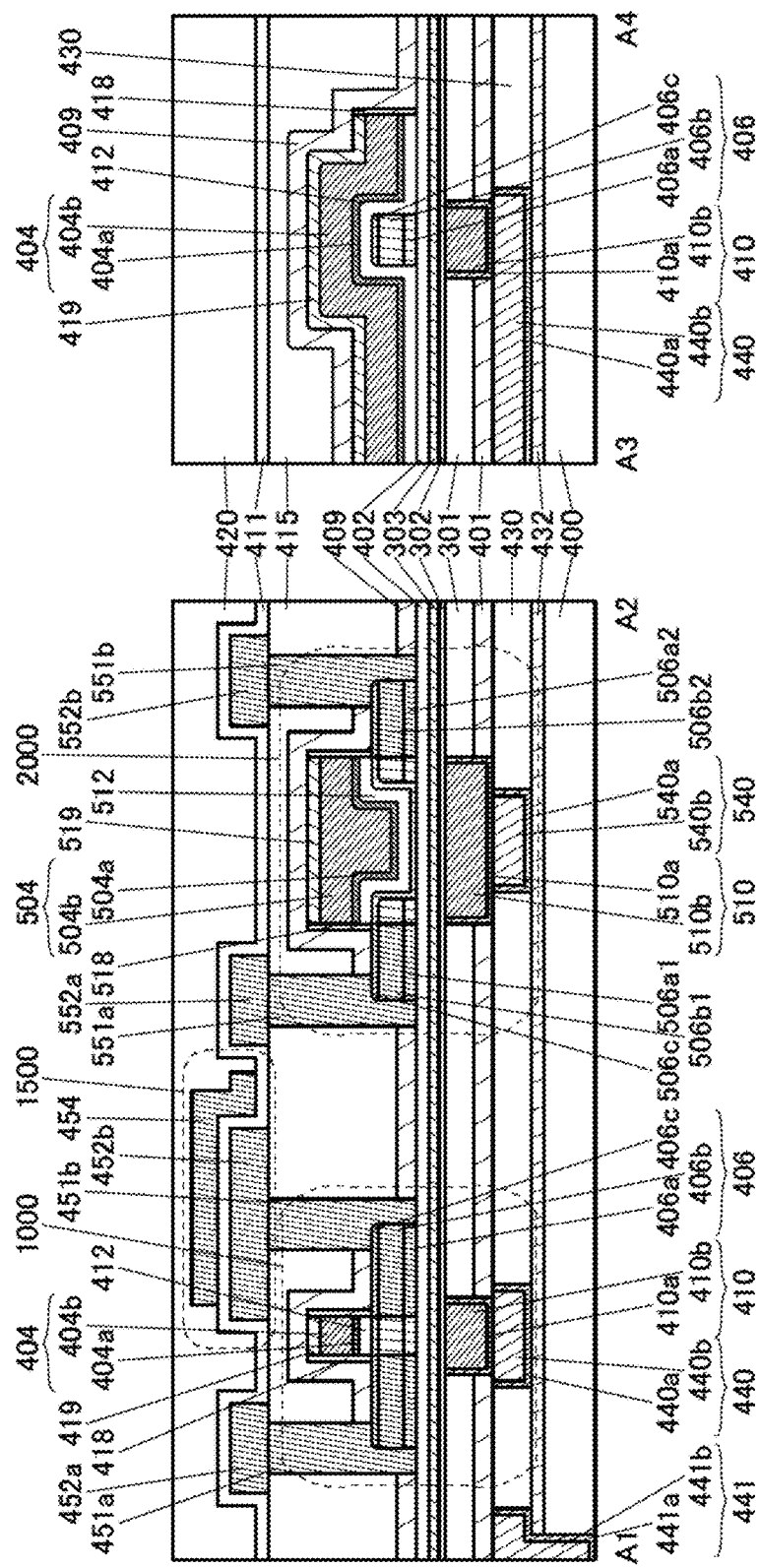

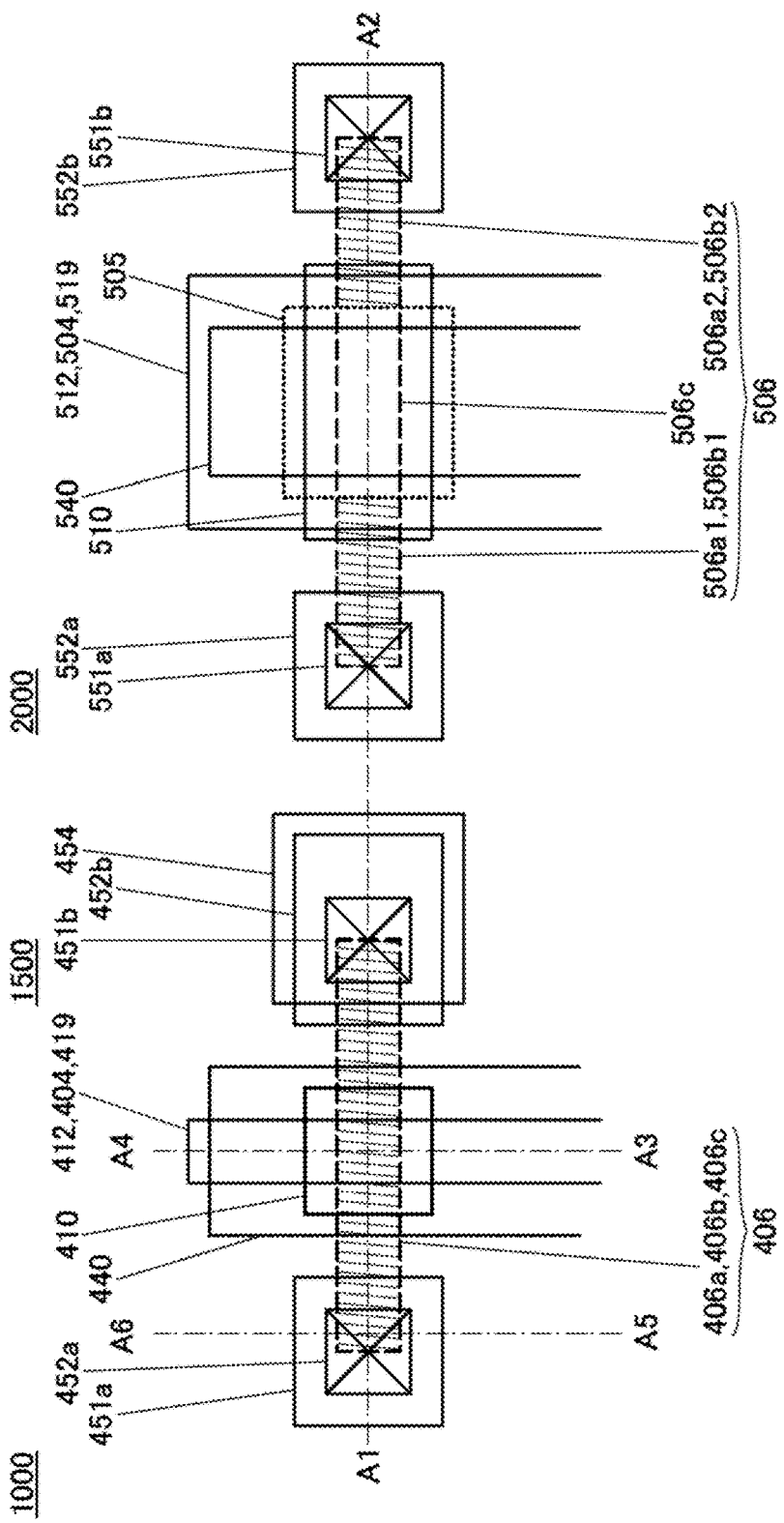

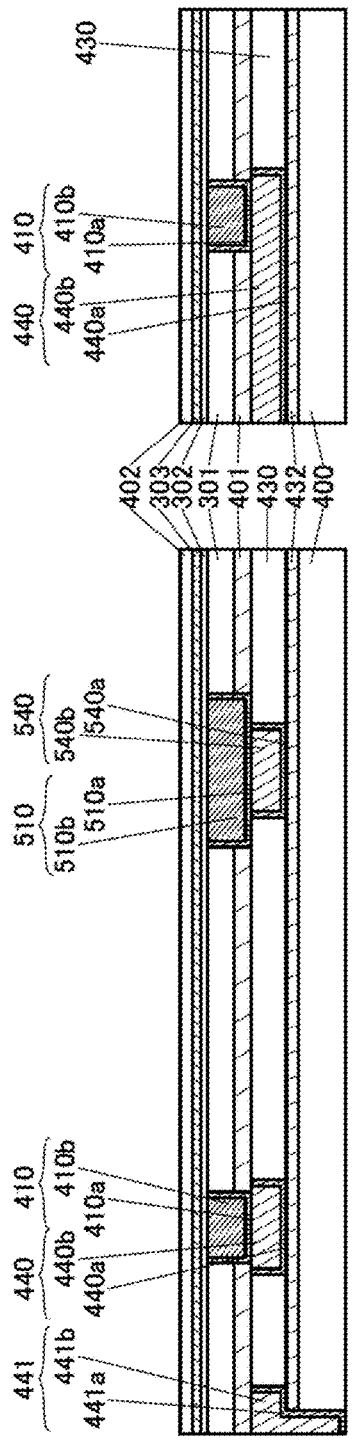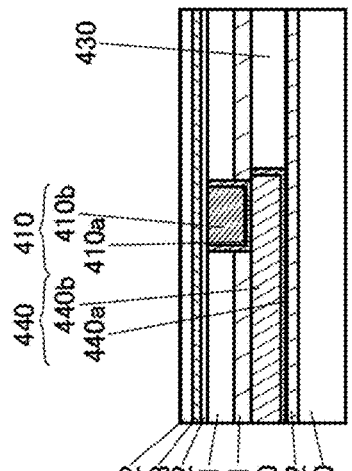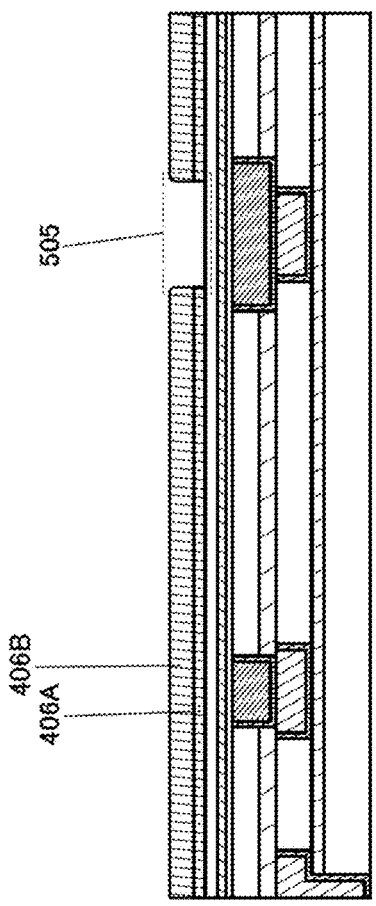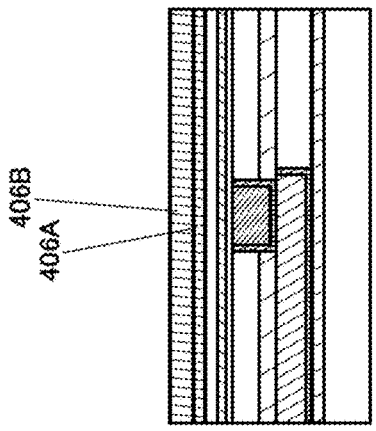

SEMICONDUCTOR DEVICE AND METHOD OF MANUFACTURING THE SAME

BACKGROUND OF THE INVENTION

1. Field of the Invention

One embodiment of the present invention relates to a semiconductor device and a method of manufacturing the semiconductor device. One embodiment of the present invention relates to a semiconductor wafer, a module, and an electronic device.

In this specification and the like, a semiconductor device refers to every device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely small leakage current in an off state. For example, a low-power-consumption CPU utilizing a characteristic of small leakage current of the transistor including an oxide semiconductor has been disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of the semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

SUMMARY OF THE INVENTION

An object of one embodiment of the present invention is to provide a semiconductor device having favorable electrical characteristics. An object of one embodiment of the present invention is to provide a semiconductor device that can be miniaturized or highly integrated. An object of one embodiment of the present invention is to provide a semiconductor device that can be manufactured with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a low-power semiconductor device. An object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A first transistor and a second transistor having different electrical characteristics from those of the first transistor are provided over the same layer. For example, a first transistor having a first threshold voltage and a second transistor having a second threshold voltage are provided over the same layer. A semiconductor layer where a channel of the first transistor is formed and a semiconductor layer where a channel of the second transistor is formed are formed using semiconductor materials having different electron affinities.

Providing transistors having different electrical characteristics in one semiconductor device can increase circuit design flexibility. On the other hand, the transistors need to be separately manufactured; thus, the number of manufacturing steps of the semiconductor device is drastically increased. The drastic increase in manufacturing steps easily leads a decrease in yield, and the productivity of the semiconductor device is significantly decreased in some cases. According to one embodiment of the present invention, transistors having different electrical characteristics can be provided in one semiconductor device, without drastic increase in the manufacturing steps.

In the first transistor and the second transistor, an insulator is provided in contact with a side surface of a gate electrode and a side surface of a gate insulator. Note that the insulator is preferably deposited by an atomic layer deposition (ALD) method, in which case an insulator formed of a film with favorable coverage or a dense film can be obtained. The insulator in contact with the side surface of the gate insulator can prevent outward diffusion of oxygen contained in the gate insulator and entry of impurities such as water or hydrogen into the gate insulator.

One embodiment of the present invention is a semiconductor device including a first transistor and second transistor. The first transistor includes a first conductor over a substrate; a first insulator over the first conductor; a first oxide over the first insulator; a second insulator over the first oxide; a second conductor over the second insulator; a third insulator over the second conductor; a fourth insulator in contact with a side surface of the second insulator, a side surface of the second conductor, and a side surface of the third insulator; and a fifth insulator in contact with the first oxide and the fourth insulator. The second transistor includes a third conductor; a fourth conductor at least part of which overlaps with the third conductor; and a second oxide between the third conductor and the fourth conductor. The third conductor and the fourth conductor are electrically connected to the first conductor.

One embodiment of the present invention is a semiconductor device including a first transistor and a second transistor. The first transistor includes a first conductor over a substrate; a first insulator over the first conductor; a first oxide over the first insulator; a second oxide in contact with at least part of a top surface of the first oxide; a third oxide in contact with at least part of a top surface of the second oxide; a second insulator over the third oxide; a second conductor over the second insulator; a third insulator over the second conductor; a fourth insulator in contact with a side surface of the second insulator, a side surface of the second conductor, and a side surface of the third insulator; and a fifth insulator in contact with the third oxide and the fourth insulator. The second transistor includes a third conductor; a fourth conductor at least part of which overlaps with the third conductor; and a fourth oxide between the third conductor and the fourth conductor. The third conductor and the fourth conductor are electrically connected to the first conductor.

In the above embodiment, each of the first to the fourth oxides preferably includes In, an element M (M is Al, Ga, Y, or Sn), and Zn. In the above embodiment, it is preferable that the first oxide include a first region and a second region that overlaps with the second insulator, at least part of the first region be in contact with the fifth insulator, and the first region have a higher hydrogen concentration and/or a higher nitrogen concentration than the second region. The first region preferably includes a portion overlapping with the fourth insulator and the second insulator. The fifth insulator preferably includes one or both of hydrogen and nitrogen.

One embodiment of the present invention is a semiconductor device including a first transistor and a second transistor. The first transistor includes a first conductor over a substrate; a first insulator over the first conductor; a first oxide over the first insulator; a second oxide in contact with at least part of a top surface of the first oxide; a third oxide in contact with a side surface of the first oxide and a top surface and a side surface of the second oxide, a second insulator over the third oxide; a second conductor over the second insulator; a third conductor over the second conductor; a third insulator over the third conductor; a fourth insulator in contact with a side surface of the second insulator, a side surface of the second conductor, a side surface of the third conductor, and a side surface of the third insulator; and a fifth insulator in contact with a top surface of the third oxide and a side surface of the fourth insulator. A top surface of the third insulator and a top surface of the fourth insulator are substantially aligned with each other. The second transistor includes a fourth conductor over the substrate; a first insulator over the fourth conductor; a fourth oxide and a fifth oxide which are apart from each other over the first insulator; a sixth oxide in contact with at least part of a top surface of the fourth oxide; a seventh oxide in contact with at least part of a top surface of the fifth oxide; an eighth oxide in contact with a side surface of the fourth oxide, a side surface of the fifth oxide, a top surface and a side surface of the sixth oxide, and a top surface and a side surface of the seventh oxide and in contact with the first insulator in a region between the fourth oxide and the fifth oxide; a sixth insulator over the eighth oxide; a fifth conductor which is over the sixth insulator and at least part of which overlaps with a region between the fourth oxide and the fifth oxide; a sixth conductor which is over the fifth conductor and at least part of which overlaps with a region between the fourth oxide and the fifth oxide; a seventh insulator over the sixth conductor; an eighth insulator in contact with a side surface of the sixth insulator, a side surface of the fifth conductor, a side surface of the sixth conductor, and a side surface of the seventh insulator; and a fifth insulator in contact with a top surface of the eighth oxide and a side surface of the eighth insulator. A top surface of the seventh insulator and a top surface of the eighth insulator are substantially aligned with each other.

One embodiment of the present invention is a semiconductor device including a first transistor and a second transistor. The first transistor includes a first conductor over a substrate; a first insulator over the first conductor; a first oxide over the first insulator; a second oxide in contact with at least part of a top surface of the first oxide; a third oxide in contact with at least part of a top surface of the second oxide; a second insulator over the third oxide; a second conductor over the second insulator; a third conductor over the second conductor; a third insulator over the third conductor; a fourth insulator in contact with a side surface of the second insulator, a side surface of the second conductor, a side surface of the third conductor, and a side surface of the third insulator; and a fifth insulator in contact with a top surface of the third oxide and a side surface of the fourth insulator. A top surface of the third insulator and a top surface of the fourth insulator are substantially aligned with each other. The second transistor includes a fourth conductor over the substrate; a first insulator over the fourth conductor; a fourth oxide and a fifth oxide which are apart from each other over the first insulator; a sixth oxide in contact with at least part of a top surface of the fourth oxide; a seventh oxide in contact with at least part of a top surface of the fifth oxide; an eighth oxide in contact with at least part of a top surface of the sixth oxide and at least part of a top surface of the seventh oxide; a sixth insulator over the eighth oxide; a fifth conductor which is over the sixth insulator and at least part of which overlaps with a region between the fourth oxide and the fifth oxide; a sixth conductor which is over the fifth conductor and at least part of which overlaps with a region between the fourth oxide and the fifth oxide; a seventh insulator over the sixth conductor; an eighth insulator in contact with a side surface of the sixth insulator, a side surface of the fifth conductor, a side surface of the sixth conductor, and a side surface of the seventh insulator; and a fifth insulator in contact with a top surface of the sixth oxide and a side surface of the eighth insulator. A top surface of the seventh insulator and a top surface of the eighth insulator are substantially aligned with each other.

In the above embodiment, each of the first oxide to the eighth oxide preferably contains In, an element M (M is Al, Ga, Y, or Sn), and Zn. It is preferable that the second oxide include a first region and a second region overlapping with the second insulator, at least part of the first region be in contact with the fifth insulator, and the first region have a higher hydrogen concentration and/or a higher nitrogen concentration than the second region. Furthermore, the first region preferably includes a portion overlapping with the fourth insulator and the second insulator.

In the above embodiment, the fourth insulator and the eighth insulator preferably contain aluminum oxide or hafnium oxide. The third insulator and the seventh insulator preferably contain aluminum oxide or hafnium oxide. The thickness of each of the third insulator and the seventh insulator is preferably larger than the thickness of each of the fourth insulator and the eighth insulator. The second conductor and the fifth conductor preferably contain conductive oxide. The fifth insulator preferably contains one or both of hydrogen and nitrogen. The third oxide and the eighth oxide preferably have the same composition.

One embodiment of the present invention is a method of manufacturing a semiconductor device. The method includes the steps of: forming a first conductor and a second conductor over a substrate; forming a first insulator over the first conductor and the second conductor; forming a first oxide film and a second oxide film in this order over the first insulator; processing the first oxide film and the second oxide film into an island shape, thereby forming a first oxide, a second oxide over the first oxide, a third oxide, a fourth oxide over the third oxide, a fifth oxide, and a sixth oxide over the fifth oxide; forming a third oxide film over the first insulator and the first oxide to the sixth oxide; processing the third oxide film into an island shape, thereby forming a seventh oxide that covers the first oxide and the second oxide and an eighth oxide that covers the third oxide to the sixth oxide; forming a first insulating film, a first conductive film, a second conductive film, and a second insulating film in this order over the first insulator and the first oxide to the eighth oxide; etching the first insulating film, the first conductive film, the second conductive film, and the second insulating film, thereby forming a second insulator, a third conductor, a fourth conductor, and a third insulator over the seventh oxide and forming a fourth insulator, a fifth conductor, a sixth conductor, and a fifth insulator over the eighth oxide; forming a third insulating film by an ALD method to cover the seventh oxide, the eighth oxide, the second insulator to the fifth insulator, and the third conductor to the sixth conductor; performing dry etching treatment on the third insulating film, thereby forming a sixth insulator in contact with a side surface of the second insulator, a side surface of the third conductor, a side surface of the fourth conductor, and a side surface of the third insulator and forming a seventh insulator in contact with a side surface of the fourth insulator, a side surface of the fifth conductor, a side surface of the sixth conductor, and a side surface of the fifth insulator; and forming an eighth insulator by a PECVD method to cover the seventh oxide, the eighth oxide, the third insulator, the fifth insulator, the sixth insulator, and the seventh insulator.

One embodiment of the present invention is a method of manufacturing a semiconductor device. The method includes the steps of: forming a first conductor and a second conductor over a substrate; forming a first insulator over the first conductor and the second conductor; forming a first oxide film and a second oxide film in this order over the first insulator; forming an opening in the first oxide film and the second oxide film to expose part of the first insulator; forming a third oxide film over the first oxide film and the second oxide film in which the opening is formed and the exposed first insulator; processing the first oxide film and the second oxide film in which the opening is formed and the third oxide film into an island shape, thereby forming a first oxide, a second oxide over the first oxide, a seventh oxide over the second oxide, a third oxide, a fourth oxide over the third oxide, a fifth oxide, a sixth oxide over the fifth oxide, the eighth oxide over the fourth oxide and the sixth oxide; forming a first insulating film, a first conductive film, a second conductive film, and a second insulating film in this order over the first insulator and the first oxide to the eighth oxide; etching the first insulating film, the first conductive film, the second conductive film, and the second insulating film, thereby forming a second insulator, a third conductor, a fourth conductor, and a third insulator over the seventh oxide and forming a fourth insulator, a fifth conductor, a sixth conductor, and a fifth insulator over the eighth oxide; forming a third insulating film by an ALD method to cover the seventh oxide, the eighth oxide, the second insulator to the fifth insulator, and the third conductor to the sixth conductor; performing dry etching treatment on the third insulating film, thereby forming a sixth insulator in contact with a side surface of the second insulator, a side surface of the third conductor, a side surface of the fourth conductor, and a side surface of the third insulator and forming a seventh insulator in contact with a side surface of the fourth insulator, a side surface of the fifth conductor, a side surface of the sixth conductor, and a side surface of the fifth insulator; and forming an eighth insulator by a PECVD method to cover the seventh oxide, the eighth oxide, the third insulator, the fifth insulator, the sixth insulator, and the seventh insulator.

One embodiment of the present invention can provide a semiconductor device having favorable electric characteristics. One embodiment of the present invention can provide a semiconductor device that can be miniaturized or highly integrated. One embodiment of the present invention can provide a semiconductor device with high productivity.

A semiconductor device capable of retaining data for a long time can be provided. A semiconductor device capable of high-speed data writing can be provided. A semiconductor device with high design flexibility can be provided. A low-power semiconductor device can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 5A to 5D are cross-sectional views illustrating a method of manufacturing a semiconductor device of one embodiment of the present invention.

FIGS. 14A and 14B are cross-sectional views illustrating a semiconductor device of one embodiment of the present invention.

FIG. 15 is a top view illustrating a semiconductor device of one embodiment of the present invention.

FIGS. 17A to 17D are cross-sectional views illustrating a method of manufacturing a semiconductor device of one embodiment of the present invention.

DETAILED DESCRIPTION OF THE INVENTION

Figure 1B:
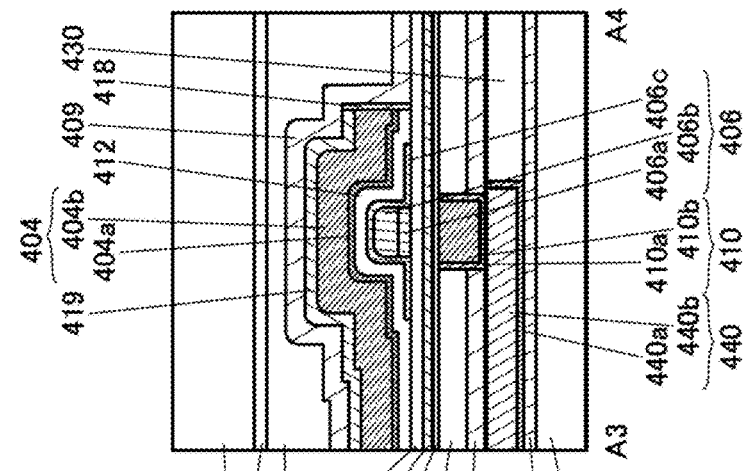
FIGS. 1A and 1B are cross-sectional views illustrating a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in some cases in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer." Moreover, the term "conductor" can be replaced with the term "conductive film" or "conductive layer." Furthermore, the term "semiconductor" can be replaced with the term "semiconductor film" or "semiconductor layer."

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, a barrier film refers to a film having a function of inhibiting the penetration of oxygen and impurities such as water or hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

<Structural Example 1 of Semiconductor Device>

An example of a semiconductor device of one embodiment of the present invention including a transistor 1000 and a transistor 2000 is described below.

Figure 1A:
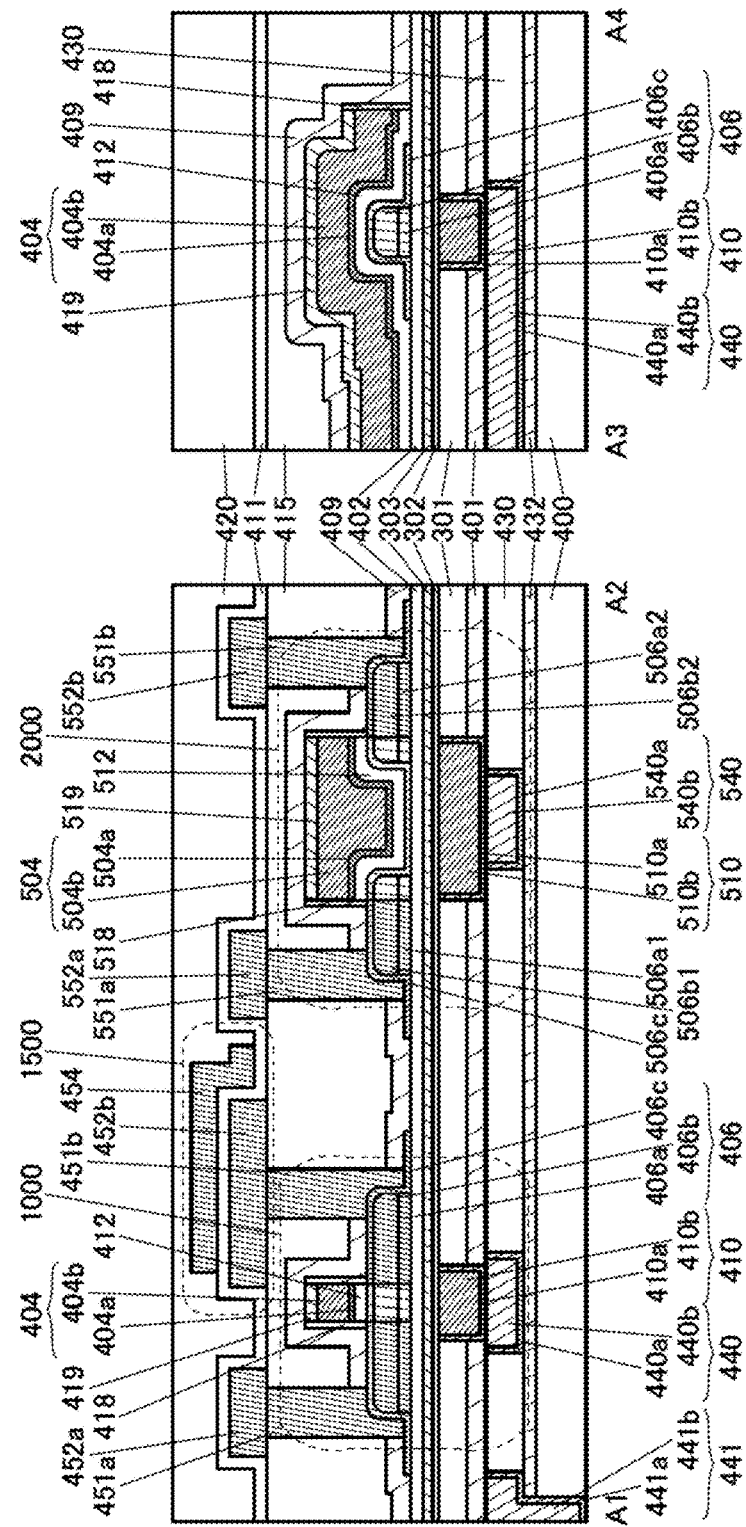
Figure 2:
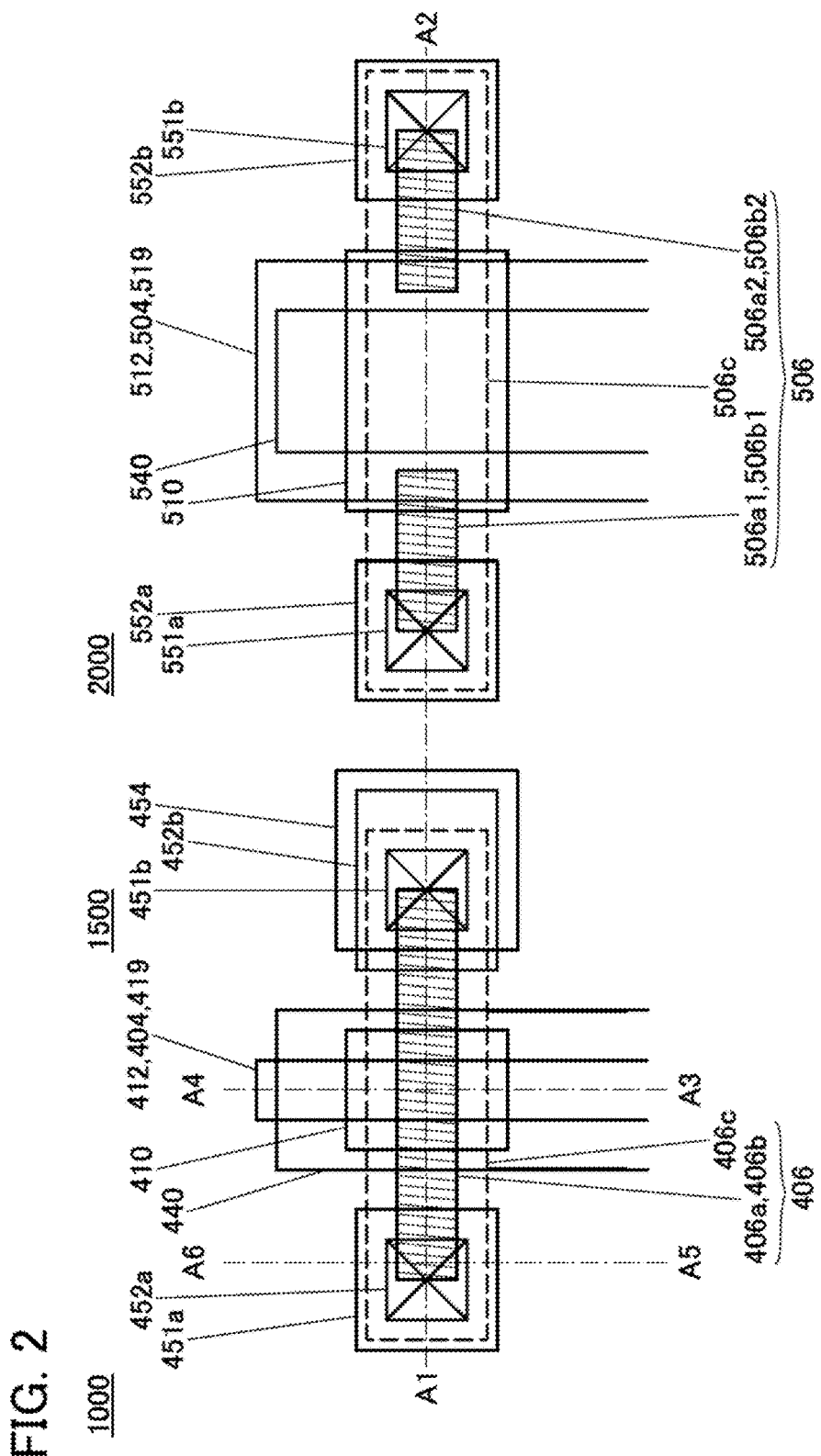
FIG. 2 is a top view illustrating a semiconductor device of one embodiment of the present invention.

FIGS. 1A and 1B are cross-sectional views of the semiconductor device including the transistor 1000 and the transistor 2000, and FIG. 2 is a top view of the semiconductor device. FIG. 1A is a cross-sectional view of a portion indicated by a dashed-dotted line A1-A2 in FIG. 2, which illustrates a cross section of the transistor 1000 in the channel length direction. FIG. 1B is a cross-sectional view of a portion indicated by a dashed-dotted line A3-A4 in FIG. 2, which illustrates a cross section of the transistor 1000 in the channel width direction. For simplification of the drawing, some components are not illustrated in the top view in FIG. 2.

The transistors 1000 and 2000 formed over a substrate (not illustrated) have different structures. For example, the transistor 2000 may have a smaller drain current $I_{cut}$ than the transistor 1000 when a back gate voltage and a top gate voltage are each 0 V. In this specification and the like, $I_{cut}$ is a drain current when a gate voltage that controls switching operation of a transistor is 0 V. The transistor 2000 is a switching element capable of controlling the potential of a back gate of the transistor 1000. Therefore, a charge at a node connected to the back gate of the transistor 1000 can be prevented from being lost by making the node have a desired potential and then turning off the transistor 2000.

The structures of the transistors 1000 and 2000 will be described below with reference to FIGS. 1A and 1B to FIGS. 4A and 4B.

[Transistor 1000]

As illustrated in FIGS. 1A and 1B, the transistor 1000 includes an insulator 401 and an insulator 301 over a substrate (not illustrated); a conductor 410 embedded in the insulator 401 and the insulator 301; an insulator 302 over the insulator 301 and the conductor 410; an insulator 303 over the insulator 302; an insulator 402 over the insulator 303; an oxide 406a over the insulator 402; an oxide 406b in contact with at least part of a top surface of the oxide 406a; an oxide 406c over the oxide 406b; an insulator 412 over the oxide 406c; a conductor 404a over the insulator 412; a conductor 404b over the conductor 404a; an insulator 419 over the conductor 404b; an insulator 418 in contact with side surfaces of the insulator 412, the conductor 404a, the conductor 404b, and the insulator 419; and an insulator 409 in contact with a top surface of the oxide 406c and a side surface of the insulator 418. Here, as illustrated in FIG. 1A, a top surface of the insulator 418 is preferably substantially aligned with a top surface of the insulator 419. Hereinafter the oxide 406a, the oxide 406b, and the oxide 406c are collectively referred to as the oxide 406 in some cases. Furthermore, the insulator 409 is preferably provided to cover the insulator 419, the conductor 404, the insulator 418, and the oxide 406.

Although the oxides 406a, 406b, and 406c are stacked in the transistor 1000, the structure of the present invention is not limited to this structure. For example, only the oxides 406b and 406c may be provided. Furthermore, the conductors 404a and 404b are collectively referred to as the conductor 404 in some cases. Although the conductors 404a and 404b are stacked in the transistor 1000, the structure of the present invention is not limited to this structure. For example, only the conductor 404b may be provided.

In the transistor 1000, an insulator 400 may be provided over the substrate. An insulator 432 may be provided over the insulator 400. The transistor 1000 may further include an insulator 430 provided over the insulator 432 and a conductor 440 embedded in the insulator 430. The insulator 401 may be provided over the insulator 430, and the insulator 301 may be provided over the insulator 401.

The conductor 440 includes a conductor 440a that is in contact with an inner wall of an opening of the insulator 430 and a conductor 440b positioned inside the conductor 440a. Here, top surfaces of the conductors 440a and 440b can have substantially the same level as a top surface of the insulator 430. Although the conductor 440a and the conductor 440b are stacked in the transistor 1000, the structure of the present invention is not limited to this structure. For example, only the conductor 440b may be provided.

It is preferable that the conductor 410 be provided over and in contact with the conductor 440 so as to overlap with the oxide 406 and the conductor 404. In the conductor 410, the conductor 410a is formed in contact with an inner wall of the opening in the insulators 401 and 301, and the conductor 410b is formed inside the conductor 410a. Thus, a structure in which the conductor 410a is in contact with the conductor 440b is preferable. Here, top surfaces of the conductors 410a and 410b can have substantially the same level as a top surface of the insulator 301. Although the conductor 410a and the conductor 410b are stacked in the transistor 1000, the structure of the present invention is not limited to this structure. For example, only the conductor 410b may be provided.

The conductor 404 can function as a top gate (also referred to as a first gate in some cases), and the conductor 410 can function as a back gate (also referred to as a second gate in some cases). By changing the potential of the back gate independently of the potential of the top gate, the threshold voltage of the transistor 1000 can be changed. In particular, by applying a negative potential to the back gate, the threshold voltage of the transistor 1000 can be higher than 0 V, off-state current can be reduced, and $I_{cut}$ can be noticeably reduced.

The conductor 440 extends in the channel width direction in a manner similar to that of the conductor 404, and functions as a wiring through which a potential is applied to the conductor 410, i.e., the back gate. When the conductor 410 is stacked over the conductor 440 functioning as the wiring for the back gate so as to be embedded in the insulators 401 and 301, the insulators 401 and 301 and the like are positioned between the conductor 440 and the conductor 404, reducing the parasitic capacitance between the conductor 440 and the conductor 404 and thereby increasing the withstand voltage. The reduction in the parasitic capacitance between the conductor 440 and the conductor 404 can improve the switching speed of the transistor, so that the transistor can have high frequency characteristics. The increase in the withstand voltage between the conductor 440 and the conductor 404 can improve the reliability of the transistor 1000. Therefore, the thicknesses of the insulators 401 and 301 are preferably large. Note that the extending direction of the conductor 440 is not limited to this example; for example, the conductor 440 may extend in the channel length direction of the transistor 1000.

Here, it is preferable to use conductive materials that have a function of inhibiting the penetration of impurities such as water or hydrogen or hardly transmit such impurities for the conductor 410a and the conductor 440a. For example, a single layer or a stacked layer of tantalum, tantalum nitride, ruthenium, ruthenium oxide, or the like is preferably used. Owing to this, diffusion of impurities such as water or hydrogen from a layer below the insulator 432 into an upper layer through the conductors 440 and 410 can be inhibited. Note that it is preferable that the conductors 410a and 440a have a function of inhibiting the penetration of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule). Furthermore, in the following description, the same applies to a conductive material having a function of inhibiting the penetration of impurities. When the conductors 410a and 440a have a function of inhibiting the penetration of oxygen, the conductivity of the conductors 410b and 440b can be prevented from being lowered because of oxidation.

Moreover, the conductor 410b is preferably formed using a conductive material including tungsten, copper, or aluminum as its main component. Although not illustrated, the conductor 410b may have a stacked structure and be, for example, stacked layers of titanium, titanium nitride, and the above-described conductive material.

The conductor 440b, which serves as a wiring, is preferably formed using a conductor having a higher conductivity than the conductor 410b; a conductive material including copper or aluminum as its main component can be used, for example. Although not illustrated, the conductor 440b may have a stacked structure and be, for example, stacked layers of titanium, titanium nitride, and the above-described conductive material.

Moreover, a conductor 441 may be provided in a manner similar to that of the conductor 440. The conductor 441 is provided in an opening formed in the insulator 400, the insulator 432, and the insulator 430. Part of the conductor 441 formed in the same layer as the insulator 430 functions as a wiring and part of the conductor 441 formed in the same layer as the insulator 400 and the insulator 432 functions as a plug. The conductor 441 includes a conductor 441a that is in contact with an inner wall of the opening and a conductor 441b that is inside the conductor 441a. As the conductor 441a, a conductor that is used as the conductor 440a can be used. As the conductor 441b, a conductor that is used as the conductor 440b can be used. Moreover, top surfaces of the conductors 441a and 441b can have substantially the same level as the top surface of the insulator 430.

The conductor 441 can be connected to a wiring, a circuit element, a semiconductor element, or the like positioned under the insulator 400. Moreover, when a similar wiring and a similar plug are provided over the conductor 441, the conductor 441 can be connected to a wiring, a circuit element, a semiconductor element, or the like positioned over the conductor 441.

The insulator 432 and the insulator 401 can function as barrier insulating films that prevent impurities such as water or hydrogen from entering the transistor from a lower layer. The insulator 432 and the insulator 401 are preferably formed with an insulating material having a function of inhibiting the penetration of impurities such as water or hydrogen. For example, it is preferable that aluminum oxide be used for the insulator 432 and silicon nitride be used for the insulator 401. Accordingly, diffusion of impurities such as water or hydrogen into a layer over the insulator 432 and the insulator 401 can be inhibited. Note that it is preferable that the insulator 432 and the insulator 401 have a function of inhibiting the penetration of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the penetration of impurities.

Furthermore, the insulator 432 and the insulator 401 are preferably formed using an insulating material that has a function of inhibiting the penetration of oxygen (e.g., an oxygen atom or an oxygen molecule). Thus, oxygen contained in the insulator 402 or the like can be prevented from being diffused to lower layers.

Furthermore, with the structure in which the conductor 410 is stacked over the conductor 440, the insulator 401 can be provided between the conductor 440 and the conductor 410. Here, even when a metal that is easily diffused, such as copper, is used as the conductor 440b, silicon nitride or the like provided as the insulator 401 can prevent diffusion of the metal to a layer positioned above the insulator 401.

The insulator 303 is preferably formed using an insulating material that has a function of inhibiting the penetration of oxygen and impurities such as water or hydrogen, and is preferably formed using aluminum oxide or hafnium oxide, for example. Accordingly, diffusion of impurities such as water or hydrogen from a layer under the insulator 303 into a layer over the insulator 303 can be inhibited. Furthermore, oxygen contained in the insulator 402 or the like can be prevented from being diffused to lower layers.

Furthermore, the concentration of impurities such as water, hydrogen, or nitrogen oxide in the insulator 402 is preferably lowered. The amount of hydrogen released from the insulator 402, which is converted into hydrogen molecules per unit area of the insulator 402, is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) in the range of 50° C. to 500° C., for example. The insulator 402 is preferably formed using an insulator from which oxygen is released by heating.

The insulator 412 can function as a first gate insulating film, and the insulator 302, the insulator 303, and the insulator 402 can function as a second gate insulating film. Although the insulator 302, the insulator 303, and the insulator 402 are stacked in the transistor 1000, the present invention is not limited to this structure. For example, any two of the insulators 302, 303, and 402 may be stacked, or any one of the insulators may be used.

In the oxide 406, the oxide 406a, the oxide 406b, and the oxide 406c are stacked in this order. Side surfaces of the oxide 406a and the oxide 406b are preferably substantially aligned with each other and form one surface. The oxide 406c is preferably formed to cover the oxide 406a and the oxide 406b. For example, the oxide 406c is formed in contact with the side surface of the oxide 406a, the top and side surfaces of the oxide 406b, and part of a top surface of the insulator 402. Here, when the oxide 406c is seen from above, the side surface of the oxide 406c is positioned outside the side surfaces of the oxide 406a and the oxide 406b.

The oxide 406 is preferably formed using a metal oxide serving as an oxide semiconductor (hereinafter, such a metal oxide may also be referred to simply as an oxide semiconductor). The metal oxide to be used preferably has an energy gap greater than or equal to 2 eV, further preferably greater than or equal to 2.5 eV. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like, and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, a case where the oxide semiconductor is an In-M-Zn oxide containing indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

Here, the atomic ratio of the element M to the constituent elements in the metal oxide used as the oxide 406a is preferably greater than that in the metal oxide used as the oxide 406b. Moreover, the atomic ratio of the element M to In in the metal oxide used as the oxide 406a is preferably greater than that in the metal oxide used as the oxide 406b. The atomic ratio of In to the element M in the metal oxide used as the oxide 406b is preferably greater than that in the metal oxide used as the oxide 406a. Note that as the oxide 406c, the metal oxide that can be used as the oxide 406a or the oxide 406b can be used. The case in which the metal oxide that can be used as the oxide 406a is employed as the oxide 406c is described below.

When using the above metal oxide as the oxide 406a and the oxide 406c, it is preferable that the conduction band minimum of the oxide 406a and the oxide 406c be higher than the conduction band minimum of the region of the oxide 406b where the conduction band minimum is low. In other words, the electron affinity of the oxide 406a and the oxide 406c is preferably smaller than the electron affinity of the region of the oxide 406b where the conduction band minimum is low.

Here, the energy level of the conduction band minimum is gradually varied in the oxides 406a, 406b, and 406c. In other words, the energy level of the conduction band minimum is continuously varied or continuously connected. To vary the energy level gradually, the density of defect states in a mixed layer formed at the interface between the oxides 406a and 406b and at the interface between the oxides 406b and 406c is decreased.

Specifically, when the oxides 406a and 406b contain and the oxides 406b and 406c contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as the oxides 406a and 406c.

At this time, a narrow-gap portion formed in the oxide 406b serves as a main carrier path. Since the density of defect states at the interface between the oxides 406a and 406b and the interface between the oxides 406b and 406c can be decreased, the influence of interface scattering on carrier conduction is small, and high on-state current can be obtained.

Figure 3A:
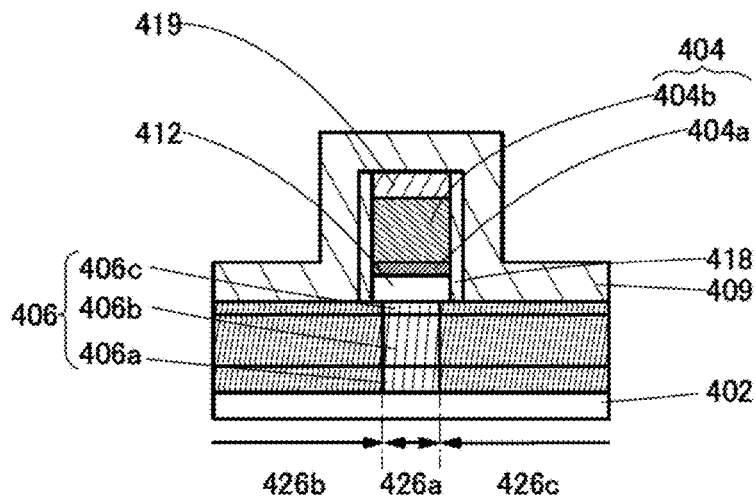
FIGS. 3A and 3B are cross-sectional views illustrating a semiconductor device of one embodiment of the present invention.
Figure 3B:
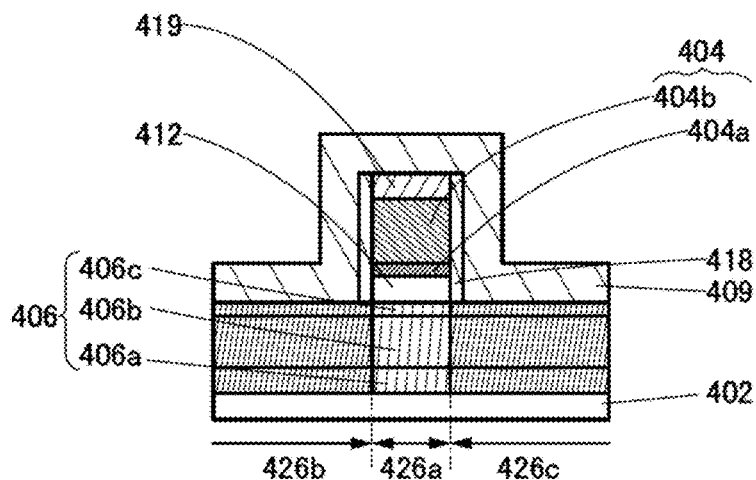

FIGS. 3A and 3B are enlarged views of the oxide 406 and its vicinity illustrated in FIG. 1A. As illustrated in FIGS. 3A and 3B, the oxide 406 includes a region 426a, a region 426b, and a region 426c. As illustrated in FIGS. 3A and 3B, the region 426a is sandwiched between the region 426b and the region 426c. The regions 426b and 426c are reduced in resistance through formation of the insulator 409, and are high in conductivity than the region 426a. Impurity elements such as hydrogen or nitrogen, which are contained in an atmosphere where the insulator 409 is formed, are added to the regions 426b and 426c. Accordingly, oxygen vacancies are formed because of the added impurity elements, and the impurity elements enter the oxygen vacancies, thereby increasing the carrier density and reducing resistance mainly in a region of the oxide 406 which is in contact with the insulator 409.

Thus, it is preferable that the concentration of at least one of hydrogen and nitrogen be higher in the regions 426b and 426c than in the region 426a. The concentration of hydrogen or nitrogen is measured by secondary ion mass spectrometry (SIMS) or the like. As the concentration of hydrogen or nitrogen in the region 426a, the concentration of hydrogen or nitrogen near the center of a region of the oxide 406b that overlaps with the insulator 412 (e.g., a portion of the oxide 406b, which is substantially equally away from the left and right side surfaces of the insulator 412 in the channel length direction) is measured.

The regions 426b and 426c are reduced in resistance when an element forming an oxygen vacancy or an element trapped by an oxygen vacancy is added thereto. Typical examples of such an element are hydrogen, boron, carbon, nitrogen, fluorine, phosphorus, sulfur, chlorine, titanium, and a rare gas element. Typical examples of the rare gas element are helium, neon, argon, krypton, and xenon. Accordingly, the regions 426b and 426c are made to contain one or more of the above elements.

It is preferable in the oxide 406a and the oxide 406c that the atomic ratio of In to the element M in the regions 426b and 426c be substantially the same as that in the oxide 406b. In other words, in the oxide 406a and the oxide 406c, the atomic ratio of In to the element M in the regions 426b and 426c is preferably greater than that in the region 426a. Thus, when the indium content in the oxide 406 is increased, the carrier mobility is increased and the resistance can be decreased. Even when the thickness of the oxide 406c is small and electric resistance of the oxide 406 is high in the manufacturing process of the transistor 1000, the regions 426b and 426c can serve as source and drain regions owing to the sufficiently reduced resistance of the oxide 406 in the regions 426b and 426c. For example, even when the oxide 406c is removed and the thickness of the oxide 406b is small, the regions 426b and 426c in the oxide 406 can serve as source and drain regions owing to the sufficiently reduced resistance of the oxide 406a in the regions 426b and 426c.

As illustrated in FIGS. 3A and 3B, the region 426b and the region 426c are formed in at least the regions of the oxide 406 in contact with the insulator 409. The regions 426b of the oxide 406b can serve as one of a source region and a drain region, and the region 426c of the oxide 406b can serve as the other of the source region and the drain region. The region 426a of the oxide 406b can serve as a channel formation region.

Although the regions 426a, 426b, and 426c are formed in the oxides 406a, 406b, and 406c in FIG. 1A and FIGS. 3A and 3B, one embodiment of the present invention is not limited thereto. For example, it is acceptable as long as these regions are formed at least in the oxide 406b. Although the boundary between the regions 426a and 426b and the boundary between the regions 426a and 426c are substantially perpendicular to the top surface of the oxide 406 in FIG. 1A and FIGS. 3A and 3B and the like, one embodiment of the present invention is not limited thereto. For example, the regions 426b and 426c project to the conductor 404 side in the vicinity of the surface of the oxide 406b and are recessed to the conductor 451a side or the conductor 451b side in the vicinity of a lower surface of the oxide 406a.

In the transistor 1000, the regions 426b and 426c are preferably formed in regions of the oxide 406 that overlap with the insulator 409 and the insulator 418 and overlap with the vicinity of edges of the insulators 418 and 412, as illustrated in FIG. 3A. In that case, portions of the regions 426b and 426c that overlap with the conductor 404 serve as what we call overlap regions (also referred to as Lov regions). With the Lov regions, no high-resistance region is formed between the channel formation region and the source or drain region of the oxide 406; accordingly, the on-state current and the mobility of the transistor can be increased.

However, the semiconductor device described in this embodiment is not limited to the above-described structure. For example, as illustrated in FIG. 3B, the regions 426b and 426c may be formed in regions of the oxide 406 that overlap with the insulator 409 and the insulator 418. The structure illustrated in FIG. 3B can be rephrased as the structure in which the width of the conductor 404 in the channel length direction is substantially the same as the width of the region 426a. Because a high-resistance region is not formed between the source region and the drain region in the structure illustrated in FIG. 3B, the on-state current of the transistor can be increased. Since the gate does not overlap with the source and drain regions in the channel length direction in the structure illustrated in FIG. 3B, formation of unnecessary capacitance can be suppressed.

By appropriately selecting the areas of the regions 426b and 426c in the above manners, a transistor having desired electrical characteristics can be easily provided in accordance with the circuit design.

The insulator 412 is preferably provided in contact with the top surface of the oxide 406c. The insulator 412 is preferably formed using an insulator from which oxygen is released by heating. When the insulator 412 formed using such a material is provided in contact with the top surface of the oxide 406c, oxygen can be supplied to the region 426a of the oxide 406b effectively. Furthermore, the concentration of impurities such as water or hydrogen in the insulator 412 is preferably lowered as in the insulator 402. The thickness of the insulator 412 is preferably 1 nm to 20 nm inclusive (e.g., approximately 1 nm).

The insulator 412 preferably contains oxygen. The amount of oxygen released from the insulator 412, which is converted into oxygen molecules per unit area of the insulator 412, is greater than or equal to $1 \times 10^{14}$ molecules/cm$^2$, preferably greater than or equal to $2 \times 10^{14}$ molecules/cm$^2$, further preferably greater than or equal to $4 \times 10^{14}$ molecules/cm$^2$ in thermal desorption spectroscopy (TDS) in the range of the surface temperatures from 100° C. to 700° C. inclusive or from 100° C. to 500° C. inclusive, for example.

The insulator 412, the conductor 404, and the insulator 419 each include a region that overlaps with the oxide 406b. In addition, it is preferable that side surfaces of the insulator 412, the conductor 404a, the conductor 404b, and the insulator 419 be substantially aligned with each other.

The conductor 404a is preferably formed using a conductive oxide. For example, the metal oxide that can be used as the oxide 406a or the oxide 406b can be used for the conductor 404a. In particular, an In—Ga—Zn-based oxide with an atomic ratio of In:Ga:Zn=4:2:3 to 4:2:4.1 or in the neighborhood thereof, which has high conductivity, is preferably used. When the conductor 404a is formed using such a material, oxygen can be prevented from entering the conductor 404b, and an increase in electric resistance value of the conductor 404b due to oxidation can be prevented.

In addition, by depositing such a conductive oxide by sputtering, oxygen can be added to the insulator 412, which makes it possible to supply oxygen to the oxide 406b. Thus, oxygen vacancies in the region 426a of the oxide 406 can be reduced.

The conductor 404b can be formed using a metal such as tungsten, for example. It is also possible to use, as the conductor 404b, a conductor that can add impurities such as nitrogen to the conductor 404a to improve the conductivity of the conductor 404a. For example, titanium nitride or the like is preferably used for the conductor 404b. Alternatively, the conductor 404b may be a stack including a metal nitride such as titanium nitride and a metal such as tungsten thereover.

Here, the conductor 404 functioning as a gate electrode is provided to cover the top surface of the region 426a and its periphery and the side surface, which is in the channel width direction, of the oxide 406b with the insulator 412 interposed therebetween. Thus, the electric field of the conductor 404 functioning as a gate electrode can electrically surround the top surface of the region 426a and its periphery and the side surface, which is in the channel width direction, of the oxide 406b. The structure of the transistor in which the channel formation region is electrically surrounded by the electric field of the conductor 404 is referred to as a surrounded channel (s-channel) structure. Thus, a channel can be formed in the top surface of the region 426a and its periphery and the side surface, which is in the channel width direction, of the oxide 406b; therefore, a large amount of current can flow between the source and the drain, and a current in an on state (on-state current) can be large. Moreover, since the top surface of the region 426a and its periphery and the side surface, which is in the channel width direction, of the oxide 406b are surrounded by the electric field of the conductor 404, a leakage current in an off state (off-state current) can be small.

The insulator 419 is preferably provided over the conductor 404b. In addition, it is preferable that the position of a side surface of the insulator 412 be substantially the same as the positions of side surfaces of the insulator 419, the conductor 404a, and the conductor 404b when the substrate is perpendicularly seen from above. The insulator 419 is preferably formed by an atomic layer deposition (ALD) method. In that case, the insulator 419 can be formed with a thickness of approximately 1 nm to 20 nm inclusive, preferably approximately 5 nm to 10 nm inclusive. The insulator 419 is preferably formed using an insulating material having a function of inhibiting the penetration of oxygen and impurities such as water or hydrogen, and is preferably formed using aluminum oxide or hafnium oxide, for example.

The insulator 418 is provided in contact with the side surfaces of the insulator 412, the conductor 404, and the insulator 419. Furthermore, it is preferable that the top surface of the insulator 418 be substantially aligned with the top surface of the insulator 419. The insulator 418 is preferably deposited by an ALD method, in which case the thickness of the insulator 418 can be approximately 1 nm to 20 nm inclusive, preferably approximately 1 nm to 3 nm inclusive (e.g., 1 nm).

Like the insulator 419, the insulator 418 is preferably formed using an insulating material that has a function of inhibiting the penetration of oxygen and impurities such as water or hydrogen, and is preferably formed using aluminum oxide or hafnium oxide, for example. In this manner, oxygen in the insulator 412 can be prevented from diffusing outward. In addition, impurities such as water or hydrogen can be prevented from entering the oxide 406 through the side of the insulator 412 or the like.

When the insulators 418 and 419 are provided as described above, the insulators with a function of inhibiting the penetration of oxygen and impurities such as water or hydrogen can cover the top and side surfaces of the conductor 404 and the side surface of the insulator 412. This can prevent entry of impurities such as water or hydrogen into the oxide 406 through the conductor 404 and the insulator 412. Thus, the insulator 418 functions as a side barrier for protecting side surfaces of a gate electrode and a gate insulating film, and the insulator 419 functions a top barrier for protecting a top surface of the gate electrode.

As mentioned above, the regions 426b and 426c of the oxide 406 are formed because of the impurity elements added in the formation of the insulator 409. In the case where a transistor is miniaturized to have a channel length of approximately greater than or equal to 10 nm and less than or equal to 30 nm, impurity elements contained in a source region or a drain region may diffuse and the source region and the drain region may be electrically connected to each other. By contrast, when the insulators 418 and 419 are formed as described in this embodiment, entry of impurities such as water or hydrogen into the insulator 412 and the conductor 404 and outward diffusion of oxygen included in the insulator 412 can be inhibited; thus, the source region and the drain region can be prevented from being electrically connected to each other when the gate voltage is 0 V.

When the insulator 418 is formed as described in this embodiment, the distance between two regions of the oxide 406 that are in contact with the insulator 409 can be longer; thus, the source region and the drain region can be prevented from being electrically connected to each other. Moreover, the insulator 418 formed by an ALD method can have a thickness substantially equal to or less than a miniaturized channel length, which can prevent the distance between the source and drain regions from being longer than necessary and the resistance from increasing.

The insulator 418 is preferably formed in the following manner: an insulating film is deposited by an ALD method and then subjected to anisotropic etching so that a portion of the insulating film in contact with the side surfaces of the insulator 412, the conductor 404, and the insulator 419 remains. Thus, the insulator 418 having a small thickness as described above can be easily formed. At this time, even when the insulator 419 provided over the conductor 404 is partly removed by the anisotropic etching, the portion of the insulator 418 in contact with the insulator 412 and the conductor 404 can be left sufficiently.

Note that a precursor used in the ALD method sometimes contains impurities such as carbon. Thus, the insulator 418 and/or the insulator 419 may contain impurities such as carbon. In the case where the insulator 432 is formed by sputtering and the insulator 418 and/or the insulator 419 are/is formed by an ALD method, for example, the insulator 418 and/or the insulator 419 may contain more impurities such as carbon than the insulator 432 even when the insulator 418 and/or the insulator 419 and the insulator 432 are formed using aluminum oxide. Note that impurities can be quantified by X-ray photoelectron spectroscopy (XPS).

The insulator 409 is provided to cover the insulator 419, the insulator 418, the oxide 406, and the insulator 402. Here, the insulator 409 is provided in contact with the top surface of the insulator 419 and the top and side surfaces of the insulator 418. As mentioned above, the insulator 409 adds impurities such as hydrogen or nitrogen to the oxide 406 to form the regions 426b and 426c. Thus, the insulator 409 preferably contains at least one of hydrogen and nitrogen.

Furthermore, the insulator 409 is preferably provided in contact with side surfaces of the oxides 406b and 406a as well as the top surface of the oxide 406b. This enables a resistance reduction to the side surfaces of the oxides 406a to 406c in the regions 426b 426c.

The insulator 409 is preferably formed using an insulating material that has a function of inhibiting the penetration of oxygen and impurities such as water or hydrogen. For example, the insulator 409 is preferably formed using silicon nitride, silicon nitride oxide, silicon oxynitride, aluminum nitride, or aluminum nitride oxide. When the insulator 409 is formed using any of the above materials, entry of oxygen through the insulator 409 to be supplied to oxygen vacancies in the regions 426b and 426c, which decreases the carrier density, can be prevented. In addition, entry of impurities such as water or hydrogen through the insulator 409, which causes the regions 426b and 426c to excessively extend to the region 426a side, can be prevented.

An insulator 415 is preferably provided over the insulator 409. The concentration of impurities such as water or hydrogen in the insulator 415 is preferably lowered as in the insulator 402 and the like. An insulator that is similar to the insulator 432 may be provided over the insulator 415.

In openings formed in the insulators 415 and 409, conductors 451a and 451b are provided. The conductors 451a and 451b are preferably provided to face each other with the conductor 404 positioned therebetween. Note that the heights of the upper surfaces of the conductor 451a and the conductor 451b can be substantially the same.

Here, the conductor 451a is formed in contact with an inner wall of one opening in the insulators 415 and 409. The region 426b of the oxide 406 is positioned in at least part of a bottom portion of the opening, and the conductor 451a is in contact with the region 426b. Similarly, the conductor 451b is formed in contact with an inner wall of the other opening in the insulators 415 and 409. The region 426c of the oxide 406 is positioned in at least part of a bottom portion of the opening, and the conductor 451b is in contact with the region 426c.

The conductors 451a and 451b are preferably formed using a conductive material including tungsten, copper, or aluminum as its main component. Although not illustrated, the conductors 451a and 451b may have a stacked structure and be, for example, stacked layers of titanium, titanium nitride, and the above-described conductive material.

The conductor 451a is in contact with the region 426b serving as one of a source region and a drain region of the transistor 1000, and the conductor 451b is in contact with the region 426c serving as the other of the source region and the drain region of the transistor 1000. Thus, the conductor 451a can serve as one of a source electrode and a drain electrode, and the conductor 451b can serve as the other of the source electrode and the drain electrode. Because the region 426b and the region 426c are reduced in resistance, the contact resistance between the conductor 451a and the region 426b and the contact resistance between the conductor 451b and the region 426c are reduced, leading to a large on-state current of the transistor 1000.

Figure 4A:
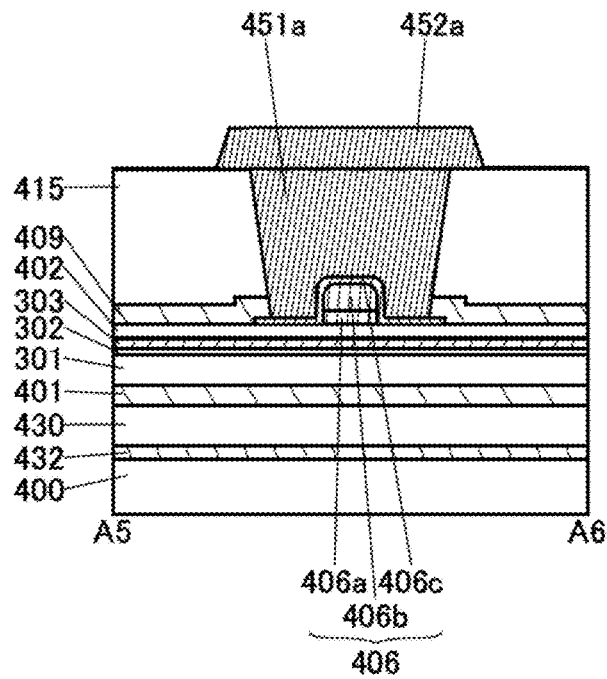
FIGS. 4A and 4B are cross-sectional views illustrating a semiconductor device of one embodiment of the present invention.

Here, FIG. 4A is a cross-sectional view of a portion along the dashed-dotted line A5-A6 in FIG. 2. Although the cross-sectional view in FIG. 4A illustrates the conductor 451a, the conductor 451b has a similar structure.

As illustrated in FIG. 1A and FIG. 4A, the conductor 451a (the conductor 451b) is in contact with at least the top surface of the oxide 406 and is preferably in contact with the side surface of the oxide 406. Specifically, as illustrated in FIG. 4A, the conductor 451a (the conductor 451b) is preferably in contact with one or both of side surfaces (the side surfaces on the A5 side and the A6 side) of the oxide 406 in the channel width direction. As illustrated in FIG. 1A, the conductor 451a (the conductor 451b) may be in contact with the side surface on the A1 side (the A2 side) of the oxide 406 in the channel length direction. Thus, when the structure in which the conductor 451a (the conductor 451b) is in contact with the side surface of the oxide 406 in addition to the top surface of the oxide 406 is employed, the contact area between the conductor 451a (the conductor 451b) and the oxide 406 can be increased without an increase in the area of the top surface of the contact portion, so that the contact resistance between the conductor 451a (the conductor 451b) and the oxide 406 can be reduced. Accordingly, miniaturization of the source electrode and the drain electrode of the transistor can be achieved and, in addition, the on-state current can be increased.

Here, in the oxide 406, the oxide 406a and the oxide 406b are covered with the oxide 406c, and the conductor 451a (the conductor 451b) is in contact with the oxide 406c.

Figure 4B:
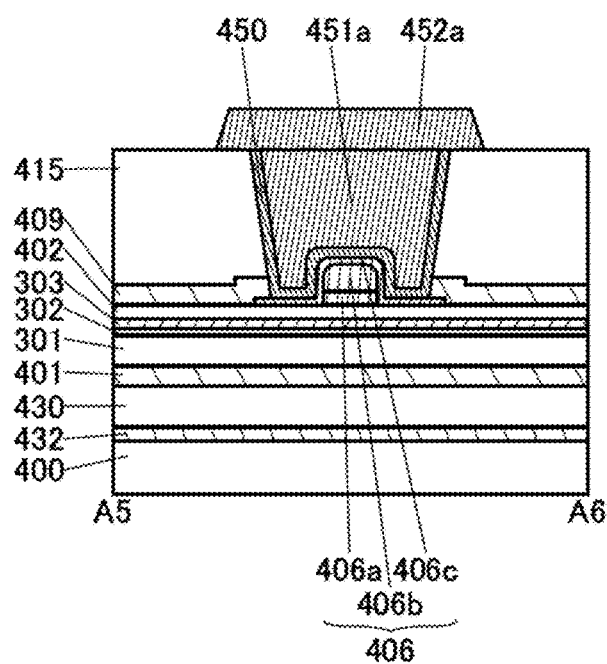

Although the conductor in which the opening is formed is only the conductor 451a (the conductor 451b) in FIG. 4A, this embodiment is not limited to this structure. A structure in which a conductor 450 in contact with inner walls of the insulator 415 and the insulator 409 is formed and the conductor 451a (the conductor 451b) is formed inside the conductor 450 as illustrated in FIG. 4B may be employed. Thus, the conductor 451a (the conductor 451b) is electrically connected to the region 426b (the region 426c) through the conductor 450.

Here, the conductor 450 is preferably formed using a conductive material having a function of inhibiting the penetration of impurities such as water or hydrogen, like the conductor 410a or the like. For example, tantalum, tantalum nitride, titanium, titanium nitride, ruthenium, ruthenium oxide, or the like is preferably used, and a single layer or stacked layers may be used. This can prevent entry of impurities such as water or hydrogen from a layer positioned over the insulator 415 to the oxide 406 through the conductor 451a and the conductor 451b.

It is preferable that a conductor 452a be provided in contact with a top surface of the conductor 451a and a conductor 452b be provided in contact with a top surface of the conductor 451b. The conductor 452a and the conductor 452b are each preferably formed using a conductive material containing tungsten, copper, or aluminum as its main component. Although not shown, the conductor 452a and the conductor 452b may have a stacked layer structure, and for example, stacked layers of titanium, titanium nitride, and the above-described conductive material may be formed. Note that like the conductor 440 or the like, the conductor 452a and the conductor 452b may be embedded in openings in an insulator.

[Transistor 2000]

Next, the transistor 2000 whose electrical characteristics are different from those of the transistor 1000 is described. The transistor 2000 can be formed in parallel with the transistor 1000, and is preferably formed in the same layer as the transistor 1000. By the formation of the transistors 1000 and 2000 in parallel, the transistor 2000 can be formed without increasing a manufacturing step.

As illustrated in FIG. 1A, the transistor 2000 includes an insulator 401 and an insulator 301 over a substrate (not illustrated); a conductor 510 embedded in the insulator 401 and the insulator 301; an insulator 302 over the insulator 301 and the conductor 510; an insulator 303 over the insulator 302; an insulator 402 over the insulator 303; an oxide 506a1 and an oxide 506a2 apart from each other over the insulator 402; an oxide 506b1 in contact with a top surface of the oxide 506a1; an oxide 506b2 in contact with a top surface of the oxide 506a2; an oxide 506c in contact with a top surface of the insulator 402, side surfaces of the oxides 506a1 and the oxide 506a2, top and side surfaces of the oxide 506b1 and the oxide 506b2; an insulator 512 over the oxide 506c; a conductor 504a over the insulator 512; a conductor 504b over the conductor 504a; an insulator 519 over the conductor 504b; an insulator 518 in contact with side surfaces of the insulator 512, the conductor 504a, the conductor 504b, and the insulator 519; and the insulator 409 in contact with a top surface of the oxide 506c and a side surface of the insulator 518. Here, as illustrated in FIG. 1A, the top surface of the insulator 518 is preferably substantially aligned with a top surface of the insulator 519. Furthermore, the insulator 409 is preferably provided to cover the insulator 519, the conductor 504, the insulator 518, and the oxide 506. It is preferable that when the substrate is perpendicularly seen from above, the position of the side surface of the insulator 512 is substantially the same as the positions of the side surfaces of the insulator 519, the conductor 504a, and the conductor 504b.

In the following description, the oxide 506a1, the oxide 506a2, the oxide 506b1, the oxide 506b2, and the oxide 506c are collectively referred to as the oxide 506 in some cases. Although the conductor 504a and the conductor 504b are stacked in the transistor 2000, the structure of the present invention is not limited to this structure. For example, only the conductor 504b may be provided.

Here, the conductors, the insulators, and the oxides included in the transistor 2000 can be formed in the same step as the conductors, the insulators, and the oxides included in the transistor 1000 that is in the same layer as the transistor 2000. That is, the conductor 540 (the conductor 540a and the conductor 540b) corresponds to the conductor 440 (the conductor 440a and the conductor 440b); the oxide 506 (the oxide 506a1, the oxide 506a2, the oxide 506b1, the oxide 506b2, and the oxide 506c) corresponds to the oxide 406 (the oxide 406a, the oxide 406b, and the oxide 406c); the insulator 512 corresponds to the insulator 412; the conductor 504 (the conductor 504a and the conductor 504b) corresponds to the conductor 404 (the conductor 404a and the conductor 404b); the insulator 519 corresponds to the insulator 419; and the insulator 518 corresponds to the insulator 418. Therefore, the conductors, the insulators, and the oxides included in the transistor 2000 can be formed with the materials the same as those for the transistor 1000, and description of the transistor 1000 can be referred to for the transistor 2000.

Furthermore, the transistor 2000 may include the insulator 430 over the insulator 432 and the conductor 540 embedded in the insulator 430. Here, the conductor 540 includes a conductor 540a that is in contact with an inner wall of an opening of the insulator 430 and a conductor 540b positioned inside the conductor 540a. The conductor 540 (the conductor 540a and the conductor 540b) corresponds to the conductor 440 (the conductor 440a and the conductor 440b). The conductor 540 can be formed with a material the same as that for the conductor 440, and description of the conductor 440 can be referred to for the conductor 540.

A conductor 551a and a conductor 551b are placed in openings formed in the insulator 415 and the insulator 409. The conductor 551a and the conductor 551b are preferably oppositely disposed with the conductor 504 sandwiched therebetween. The conductor 551a and the conductor 551b correspond to the conductor 451a and the conductor 451b. The conductor 551a and the conductor 551b can be formed with a material the same as that for the conductor 451a and the conductor 451b, and description of the conductor 451a and the conductor 451b can be referred to for the conductor 551a and the conductor 551b.

It is preferable that the conductor 552a be disposed in contact with a top surface of the conductor 551a and the conductor 552b be disposed in contact with a top surface of the conductor 551b. The conductor 552a and the conductor 552b can be formed with a material the same as that for the conductor 452a and the conductor 452b, and description of the conductor 452a and the conductor 452b can be referred to for the conductor 552a and the conductor 552b.

The oxide 506c is preferably formed to cover the oxide 506a1, the oxide 506b1, the oxide 506a2, and the oxide 506b2. A side surface of the oxide 506a1 and a side surface of the oxide 506b1 are preferably substantially aligned with each other, and a side surface of the oxide 506a2 and a side surface of the oxide 506b2 are preferably substantially aligned with each other. For example, the oxide 506c is formed in contact with the side surfaces of the oxide 506a1 and the oxide 506a2, the top and side surfaces of the oxide 506b1 and the oxide 506b2, and part of the top surface of the insulator 402. Here, when the oxide 506c is seen from above, the side surface of the oxide 506c is positioned outside the side surfaces of the oxide 506a1 and the oxide 506b1 and the side surfaces of the oxide 506a2 and the oxide 506b2.

The oxides 506a1 and 506b1 and the oxides 506a2 and 506b2 are oppositely disposed with the conductor 510, the oxide 506c, the insulator 512, and the conductor 504 sandwiched therebetween.

The oxide 506 includes a region in contact with the insulator 409. The resistance of the region and its vicinity is lowered in a manner similar to that of the region 426b and the region 426c in the transistor 1000. Accordingly, the oxide 506a1, the oxide 506b1, and part of the oxide 506c can function as one of a source region and a drain region of the transistor 2000, and the oxide 506a2, the oxide 506b2, and other part of the oxide 506c can function as the other of the source region and the drain region of the transistor 2000.

A region of the oxide 506c sandwiched between the oxides 506a1 and 506a2 and the oxides 506b1 and 506b2 functions as a channel formation region. Here, the distance between the oxides 506a1 and 506a2 and the oxides 506b1 and 506b2 is preferably long. For example, the distance is preferably longer than the length in the channel length direction of the conductor 404 of the transistor 1000. Thus, the off-state current of the transistor 2000 can be reduced.

The oxide 506c of the transistor 2000 can be formed with a material the same as that of the oxide 406c of the transistor 1000. That is, as the oxide 506c, the metal oxide that can be used as the oxide 406a or the oxide 406b can be used. For example, in the case where an In—Ga—Zn oxide is used as the oxide 506c, the atomic ratio of In to Ga and Zn can be 1:3:2, 4:2:3, 1:1:1, or 1:3:4.

A transistor including the oxide 506c and a transistor including the oxide 406b preferably have different electrical characteristics. For this reason, for example, the oxide 506c and the oxide 406b are preferably different in any of a material of the oxide, the content ratio of elements in the oxide, the thickness of the oxide, and the width and the length of a channel formation region formed in the oxide.

The case in which the metal oxide that can be used as the oxide 406a is employed as the oxide 506c is described below. For example, metal oxide with an atomic ratio of the region C in FIG. 12C, which has a relatively high insulating property, is preferably used as the oxide 506c. In the oxide 506c formed of the metal oxide, the atomic ratio of the element M to constituent elements can be greater than that in the oxide 406b. In addition, in the oxide 506c, the atomic ratio of the element M to In can be greater than that in the oxide 406b. Thus, the threshold voltage of the transistor 2000 can be higher than 0 V, the off-state current can be reduced, and $I_{cut}$ can be noticeably reduced.

In the oxide 506c serving as a channel formation region of the transistor 2000, oxygen vacancies and impurities such as water or hydrogen are preferably reduced as in the oxide 406c of the transistor 1000 or the like. Thus, the threshold voltage of the transistor 2000 can be higher than 0 V, the off-state current can be reduced, and $I_{cut}$ can be noticeably reduced.

The threshold voltage of the transistor 2000 including the oxide 506c is preferably larger than that of the transistor 1000 in which a negative potential is not applied to the back gate. In order to make the threshold voltage of the transistor 2000 higher than that of the transistor 1000, for example, it is preferable that metal oxide with an atomic ratio of the region A in FIG. 12A be used as the oxide 406b in the transistor 1000 and metal oxide with the atomic ratio of the region C in FIG. 12C be used as the oxide 506c in the transistor 2000.

Furthermore, the length of the conductor 504 in the A1-A2 direction of the transistor 2000 is preferably longer than the length of the conductor 404 in the A1-A2 direction of the transistor 1000. Since the channel length of the transistor 2000 can be longer than that of the transistor 1000 in this way, the threshold voltage of the transistor 2000 can be higher than that of the transistor 1000 in which a negative potential is not applied to the back gate.

The channel formation region in the transistor 2000 is formed in the oxide 506c, whereas the channel formation region in the transistor 1000 is formed in the oxide 406a, the oxide 406b, and the oxide 406c. Accordingly, the thickness of the oxide 506 in the channel formation region in the transistor 2000 can be smaller than that of the oxide 406 in the channel formation region in the transistor 1000. Therefore, the threshold voltage of the transistor 2000 can be higher than that of the transistor 1000 in which a negative potential is not applied to the back gate.

A capacitor 1500 may be provided over the transistor 1000 and the transistor 2000. In this embodiment, an example in which the capacitor 1500 is formed using the conductor 452b electrically connected to the transistor 1000 is described.

An insulator 411 is preferably provided over the conductor 452a, the conductor 452b, the conductor 552a, and the conductor 552b. The insulator 411 may be, for example, a single layer of aluminum oxide or silicon oxynitride or a stacked layer of aluminum oxide and silicon oxynitride.

Moreover, a conductor 454 is preferably provided over the insulator 411 to overlap with at least part of the conductor 452b. Like the conductor 452b, the conductor 454 is preferably formed with a conductive material containing tungsten, copper, or aluminum as its main component. Although not illustrated, the conductor 454 may have a stacked structure, and for example, may be a stacked layer of titanium, titanium nitride, and the above-described conductive material. Note that, like the conductor 440, the conductor 454 may be embedded in an opening formed in an insulator.

The conductor 452b functions as one electrode of the capacitor 1500, and the conductor 454 functions as the other electrode of the capacitor 1500. The insulator 411 functions as a dielectric of the capacitor 1500.

An insulator 420 is preferably provided over the insulator 411 and the conductor 454. An insulator that can be used as the insulator 415 may be used as the insulator 420.

Figure 13A:
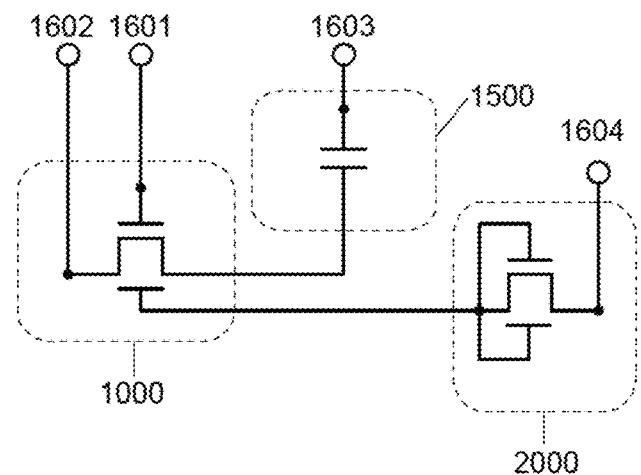
FIGS. 13A and 13B are a circuit diagram and a cross-sectional view illustrating a semiconductor device of one embodiment of the present invention.
Figure 13B:
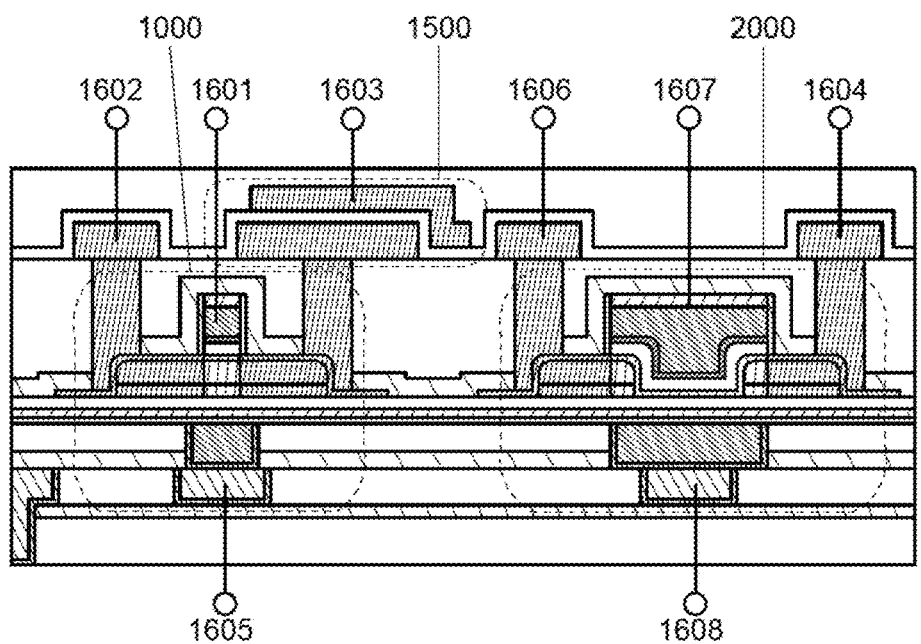

FIG. 13A is a circuit diagram showing an example of connection relation of the transistor 1000, the transistor 2000, and the capacitor 1500 in the semiconductor device described in this embodiment. FIG. 13B is a cross-sectional view, which corresponds to FIG. 1A, of wirings 1601 to 1604 and the like in FIG. 13A.

As illustrated in FIGS. 13A and 13B, in the transistor 1000, the gate is electrically connected to the wiring 1601, one of the source and the drain is electrically connected to the wiring 1602, and the other of the source and the drain is electrically connected to one electrode of the capacitor 1500. The other electrode of the capacitor 1500 is electrically connected to the wiring 1603. The drain of the transistor 2000 is electrically connected to the wiring 1604. As illustrated in FIG. 13B, the back gate of the transistor 1000 and the source, a top gate, and the back gate of the transistor 2000 are electrically connected through a wiring 1605, a wiring 1606, a wiring 1607, and a wiring 1608.

The on/off states of the transistor 1000 can be controlled by application of a potential to the wiring 1601. When the transistor 1000 is on to apply a potential to the wiring 1602, charges can be supplied to the capacitor 1500 through the transistor 1000. At this time, by making the transistor 1000 off, the charges supplied to the capacitor 1500 can be held. By application of a given potential to the wiring 1603, the potential of a connection portion between the transistor 1000 and the capacitor 1500 can be controlled by capacitive coupling. For example, when a ground potential is applied to the wiring 1603, the charges are held easily. Furthermore, by application of a negative potential to the wiring 1604, the negative potential is applied to the back gate of the transistor 1000 through the transistor 2000, whereby the threshold voltage of the transistor 1000 can be higher than 0 V, the off-state current can be reduced, and $I_{cut}$ can be noticeably reduced.

With a structure in which the top gate and the back gate of the transistor 2000 are diode-connected to the source, and the source of the transistor 2000 and the back gate of the transistor 1000 are connected, the back-gate voltage of the transistor 1000 can be controlled by the wiring 1604. When the negative potential of the back gate of the transistor 1000 is held, the voltage between the top gate and the source of the transistor 2000 and the voltage between the back gate and the source of the transistor 2000 are each 0 V. Since the $I_{cut}$ of the transistor 2000 is extremely small and the threshold voltage of the transistor 2000 is significantly higher than that of the transistor 1000, the structure allows the negative potential of the back gate of the transistor 1000 to be held for a long time without supply of power to the transistor 2000.

Moreover, the negative potential of the back gate of the transistor 1000 is held, in which case $I_{cut}$ of the transistor 1000 can be noticeably reduced even without supply of power to the transistor 1000. In other words, the charges can be held in the capacitor 1500 for a long time even without supply of power to the transistor 1000 and the transistor 2000. For example, with use of the semiconductor device as a memory element, data can be held for a long time without power supply. Therefore, a memory device with a low refresh frequency or a memory device that does not need refresh operation can be provided.

Note that the connection relation of the transistor 1000, the transistor 2000, and the capacitor 1500 is not limited to that illustrated in FIGS. 13A and 13B. The connection relation can be modified as appropriate in accordance with a necessary circuit configuration.

Next, components of the transistor 1000 and the transistor 2000 will be described.

<Substrate>

As a substrate over which the transistor 1000 and the transistor 2000 are formed, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method of providing the transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a robust semiconductor device can be provided.

For the substrate that is a flexible substrate, metal, an alloy, resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulator>

The insulator can be an oxide, nitride, oxynitride, nitride oxide, metal oxide, metal oxynitride, metal nitride oxide, or the like having an insulating property.

Note that when the transistor is surrounded by an insulator that has a function of inhibiting the penetration of oxygen and impurities such as water or hydrogen, the electrical characteristics of the transistor can be stabilized. For example, an insulator that has a function of inhibiting the penetration of oxygen and impurities such as water or hydrogen is used for each of the insulators 303, 401, and 432.

The insulator that has a function of inhibiting the penetration of oxygen and impurities such as water or hydrogen can have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 303, 401, and 432 may each be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 303, 401, and 432 preferably contain aluminum oxide, hafnium oxide, or the like.

The insulators 400, 430, 301, 302, 402, 412, 512, and 411 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 400, 430, 301, 302, 402, 412, 512, and 411 each preferably contain silicon oxide, silicon oxynitride, or silicon nitride.

It is preferable that the insulator 302, the insulator 303, the insulator 402, the insulator 412, the insulator 512, and/or the insulator 411 be formed using an insulator with a high dielectric constant. For example, it is preferable that the insulator 302, the insulator 303, the insulator 402, the insulator 412, the insulator 512, and/or the insulator 411 contain gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium. Alternatively, it is preferable that the insulator 302, the insulator 303, the insulator 402, and/or the insulator 412 have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide is positioned in contact with the oxide 406 in each of the insulators 402 and 412, silicon contained in silicon oxide or silicon oxynitride can be prevented from entering the oxide 406. Furthermore, for example, when silicon oxide or silicon oxynitride is in contact with the oxide 406 in each of the insulators 402 and 412, trap centers might be formed at the interface between aluminum oxide, gallium oxide, or hafnium oxide and silicon oxide or silicon oxynitride. The trap centers can shift the threshold voltage of the transistor in the positive direction by trapping electrons, in some cases.

Each of the insulators 400, 430, 301, 415, and 420 preferably includes an insulator with a low dielectric constant. For example, each of the insulators 400, 430, 301, 415, and 420 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulators 400, 430, 301, 415, and 420 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

For the insulators 418, 518, 419, and 519, an insulator having a function of inhibiting the penetration of oxygen and impurities such as water or hydrogen is used. For the insulators 418, 518, 419, and 519, for example, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride can be used.

<Conductor>

The conductors 404a and 404b, the conductors 504a and 504b, the conductors 410a and 410b, a conductor 510a, a conductor 510b, the conductors 440a and 440b, the conductors 540a and 540b, the conductors 441a and 441b, the conductor 450, the conductors 451a and 451b, the conductors 551a and 551b, the conductors 452a and 452b, the conductors 552a and 552b, and the conductor 454 can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon containing an impurity element such as phosphorus, or silicide such as nickel silicide may be used.

For the above-described conductors, especially for the conductors 404a, 504a, 410a, 510a, 440a, 540a, and 450, a conductive material containing oxygen and a metal element included in a metal oxide that can be used for the oxide 406 may be used. A conductive material containing the above-described metal element and nitrogen may be used. For example, a conductive material containing nitrogen such as titanium nitride or tantalum nitride may be used. An indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used. An indium gallium zinc oxide containing nitrogen may be used. With the use of such a material, hydrogen contained in the oxide 406 can be captured in some cases. Alternatively, hydrogen entering from an external insulator or the like can be captured in some cases.

A stack including a plurality of conductive layers formed using the above materials may be used. For example, a stacked-layer structure formed using a combination of a material containing the above-described metal element and a conductive material containing oxygen may be used. Alternatively, a stacked-layer structure formed using a combination of a material containing the above-described metal element and a conductive material containing nitrogen may be used. Alternatively, a stacked-layer structure formed using a combination of a material containing the above-described metal element, a conductive material containing oxygen, and a conductive material containing nitrogen may be used.

When the oxide is used for the channel formation region of the transistor, a stacked-layer structure formed using a material containing the above-described metal element and a conductive material containing oxygen is preferably used for the gate electrode. In that case, the conductive material containing oxygen is preferably formed on the channel formation region side. When the conductive material containing oxygen is formed on the channel formation region side, oxygen released from the conductive material is likely to be supplied to the channel formation region.

<Metal Oxide Applicable to Oxides 406 and 506>

The oxides 406 and 506 of one embodiment of the present invention will be described below. For the oxides 406 and 506, a metal oxide functioning as an oxide semiconductor (hereinafter, the metal oxide is also referred to as an oxide semiconductor) is preferably used.

The oxide semiconductor preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, or the like may be contained.

Here, a case where the oxide semiconductor is an InMZnO containing indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

Here, the case where the metal oxide contains indium, the element M, and zinc is considered. The terms of the atomic ratio of indium to the element M and zinc contained in the metal oxide are denoted by [In], [M], and [Zn], respectively.

Preferred ranges of the atomic ratio of indium to the element M and zinc contained in the metal oxide that can be used for the oxides 406a and 406b are described with reference to FIGS. 12A to 12C. Note that the proportion of oxygen atoms is not shown in FIGS. 12A to 12C. The terms of the atomic ratio of indium to the element M and zinc contained in the metal oxide are denoted by [In], [M], and [Zn], respectively.

Figure 12A:
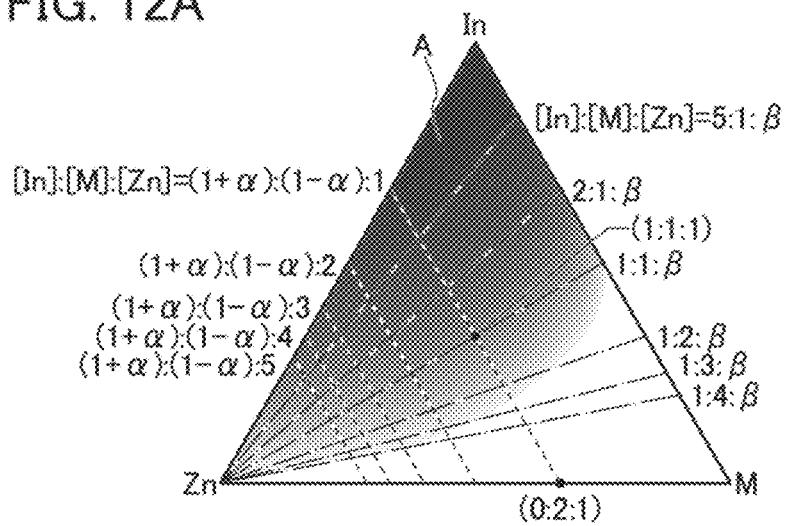
FIGS. 12A to 12C each illustrate an atomic ratio range of metal oxide of one embodiment of the present invention.
Figure 12B:
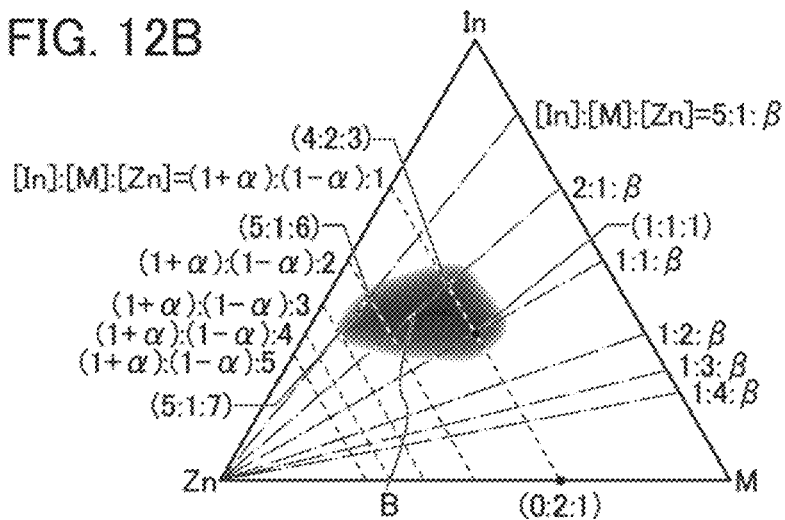
Figure 12C:
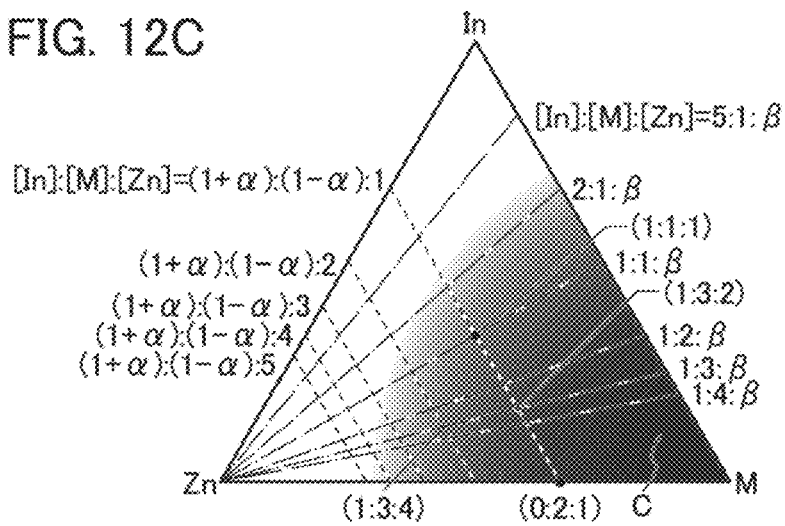

In FIGS. 12A to 12C, broken lines indicate a line where the atomic ratio [In]:[M]:[Zn] is $(1+\alpha):(1-\alpha):1$ $(-1\leq\alpha\leq1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $5:1:\beta$ $(\beta\geq0)$, a line where the atomic ratio [In]:[M]:[Zn] is $2:1:\beta$ a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, a metal oxide with the atomic ratio of [In]:[M]:[Zn]=0:2:1 or a neighborhood thereof in FIGS. 12A to 12C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 12A represents an example of the preferred range of the atomic ratio of indium, the element M, and zinc contained in the metal oxide.

In addition, the metal oxide having a higher content of indium can have higher carrier mobility (electron mobility). Thus, a metal oxide having a high content of indium has higher carrier mobility than a metal oxide having a low content of indium.

By contrast, when the indium content and the zinc content in a metal oxide become lower, carrier mobility becomes lower. Thus, with an atomic ratio of [In]:[M]:[Zn]=0:1:0 and the neighborhood thereof (e.g., the region C in FIG. 12C), insulation performance becomes better.

For example, the metal oxide used as the oxide 406b, the oxide 506b1, and the oxide 506b2 preferably have an atomic ratio represented by the region A in FIG. 12A. The metal oxide with the atomic ratio has high carrier mobility. The atomic ratio of In to Ga and Zn of the metal oxide used as the oxide 406b, the oxide 506b1, and the oxide 506b2 may be 4:2:3 to 4:2:4.1 or in the neighborhood thereof, for example. By contrast, the metal oxide used as the oxide 406a, the oxide 506a1, and the oxide 506a2 preferably have an atomic ratio represented by the region C in FIG. 12C. The metal oxide with the atomic ratio has relatively high insulating properties. The atomic ratio of In to Ga and Zn of the metal oxide used as the oxide 406a, the oxide 506a1, and the oxide 506a2 may be approximately 1:3:4, for example. Note that the metal oxide that is used as the oxide 406c and the oxide 506c may be the metal oxide that can be used as the oxide 406a, the oxide 506a1, and the oxide 506a2 or the metal oxide that can be used as the oxide 406b, the oxide 506b1, and the oxide 506b2.

A metal oxide having an atomic ratio in the region A, particularly in a region B in FIG. 12B, has high carrier mobility and high reliability and is excellent.

Note that the region B includes an atomic ratio of [In]:[M]:[Zn]=4:2:3 to 4:2:4.1 and the neighborhood thereof. The neighborhood includes an atomic ratio of [In]:[M]:[Zn]=5:3:4. Note that the region B includes an atomic ratio of [In]:[M]:[Zn]=5:1:6 and the neighborhood thereof and an atomic ratio of [In]:[M]:[Zn]=5:1:7 and the neighborhood thereof.

In the case where the metal oxide is formed of an In-M-Zn oxide, it is preferable to use a target containing a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of the target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

<Composition of Metal Oxide>

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

<Structure of Metal Oxide>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Containing Oxide Semiconductor>

Next, the case where the oxide semiconductor is used for a transistor will be described.

When the oxide semiconductor is used in a transistor, the transistor can have high field-effect mobility. In addition, the transistor can have high reliability.

Moreover, the carrier density in the region 426a of the oxide 406b in the transistor is preferably low. In order to reduce the carrier density of the oxide semiconductor film, the concentration of impurities in the oxide semiconductor film is reduced so that the density of defect states can be reduced. In this specification and the like, a state with a low impurity concentration and a low density of defect states is referred to as a highly purified intrinsic or substantially highly purified intrinsic state. The region 426a of the oxide 406b has, for example, a carrier density lower than $8 \times 10^{11}/\text{cm}^3$, preferably lower than $1 \times 10^{11}/\text{cm}^3$, and further preferably lower than $1 \times 10^{10}/\text{cm}^3$, and higher than or equal to $1 \times 10^{-9}/\text{cm}^3$.

A highly purified intrinsic or substantially highly purified intrinsic oxide semiconductor film has a low density of defect states and accordingly has a low density of trap states in some cases.

Charge trapped by the trap states in the oxide semiconductor takes a long time to be released and may behave like fixed charge. Thus, a transistor whose channel region is formed in the oxide semiconductor having a high density of trap states has unstable electrical characteristics in some cases.

In order to obtain stable electrical characteristics of the transistor, it is effective to reduce the concentration of impurities in the region 426a of the oxide 406b. In addition, in order to reduce the concentration of impurities in the region 426a of the oxide 406b, the concentration of impurities in a film that is adjacent to the region 426a is preferably reduced. As examples of the impurities, hydrogen, nitrogen, alkali metal, alkaline earth metal, iron, nickel, silicon, and the like are given.

<Impurity>

Here, the influence of impurities in the oxide semiconductor is described.

When silicon or carbon that is one of Group 14 elements is contained in the oxide, defect states are formed. Thus, the concentration of silicon or carbon (the concentration is measured by SIMS) in the region 426a of the oxide 406b is set to be lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the region 426a of the oxide 406b. Specifically, the concentration of alkali metal or alkaline earth metal in the region 426a of the oxide 406b, which is measured by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor containing nitrogen in the region 426a of the oxide 406b tends to have normally-on characteristics. For this reason, nitrogen in the region 426a of the oxide 406b is preferably reduced as much as possible; for example, the concentration of nitrogen in the region 426a of the oxide 406b measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the transistor containing much hydrogen in the region 426a of the oxide 406b tends to have normally-on characteristics. For this reason, hydrogen in the region 426a of the oxide 406b is preferably reduced as much as possible. Specifically, the hydrogen concentration of the oxide semiconductor measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

By reducing impurities in the region 426a of the oxide 406b to an enough level, the transistor can have stable electrical characteristics.

<Method 1 of Manufacturing Semiconductor Device>

Next, a method of manufacturing the transistor 1000 and the transistor 2000 in parallel which are included in the semiconductor device of one embodiment of the present invention is described with reference to FIGS. 5A to 5D to FIGS. 11A to 11D. FIGS. 5A and 5C, FIGS. 6A and 6C, FIGS. 7A and 7C, FIGS. 8A and 8C, FIGS. 9A and 9C, FIGS. 10A and 10C, and FIGS. 11A and 11C are cross-sectional views taken along the dashed-dotted line A1-A2 in FIG. 2. FIGS. 5B and 5D, FIGS. 6B and 6D, FIGS. 7B and 7D, FIGS. 8B and 8D, FIGS. 9B and 9D, FIGS. 10B and 10D, and FIGS. 11B and 11D are cross-sectional views taken along the dashed-dotted line A3-A4 in FIG. 2.

First, a substrate (not illustrated) is prepared, and the insulator 400 is formed over the substrate. The insulator 400 and the insulator 432 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The use of a PECVD method can provide a high-quality film at a relatively low temperature. A thermal CVD method does not use plasma and thus causes less plasma damage to an object. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, when a thermal CVD method not using plasma is employed, such plasma damage is not caused and the yield of semiconductor devices can be increased. A thermal CVD method does not cause plasma damage during deposition, so that a film with few defects can be obtained.

An ALD method also causes less plasma damage to an object. Since an ALD method does not cause plasma damage during deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method can provide favorable step coverage almost regardless of the shape of an object. In particular, an ALD method can provide excellent step coverage and excellent thickness uniformity and thus can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with the flow rate ratio of a source gas. For example, by a CVD method or an ALD method, a film with a certain composition can be formed depending on the flow rate ratio of a source gas. Moreover, by changing the flow rate ratio of a source gas during deposition by a CVD method or an ALD method, a film whose composition is continuously changed can be formed. In the case where a film is formed while changing the flow rate ratio of a source gas, as compared to the case where a film is formed using a plurality of deposition chambers, time taken for the deposition can be reduced because time taken for transfer and pressure adjustment is omitted. Thus, semiconductor devices can be manufactured with improved productivity in some cases.

In this embodiment, silicon oxynitride is deposited as the insulator 400 by a CVD method.

Then, the insulator 432 is formed over the insulator 400. In this embodiment, aluminum oxide is deposited as the insulator 432 by a sputtering method. The insulator 432 may have a multilayer structure. For example, aluminum oxide may be formed by a sputtering method and another aluminum oxide may be formed by an ALD method over the aluminum oxide. Alternatively, aluminum oxide may be formed by an ALD method and another aluminum oxide may be formed by a sputtering method over the aluminum oxide.

Then, the insulator 430 is formed over the insulator 432. The insulator 430 can be formed by a sputtering method, a CVD method, an MBE method, a PLD method, an ALD method, or the like. In this embodiment, silicon oxide was deposited as the insulator 430 by a CVD method.

Next, a groove that reaches the insulator 432 is formed in the insulator 430. Examples of the groove include a hole and an opening. In forming the groove, wet etching may be employed; however, dry etching is preferably employed in terms of microfabrication. The insulator 432 is preferably an insulator that functions as an etching stopper film used in forming the groove by etching the insulator 430. In the case where a silicon oxide film is used for the insulator 430 in which the groove is to be formed, the insulator 432 is preferably formed using a silicon nitride film, an aluminum oxide film, or a hafnium oxide film, for example.

After the formation of the groove, the conductive film to be the conductor 440a, the conductor 540a, and the conductor 441a is formed. The conductive film desirably contains a conductor that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductor 440 can be formed by a sputtering method, a CVD method, an MBE method, a PLD method, an ALD method, or the like.

In this embodiment, as a conductive film to be the conductor 440a, the conductor 540a, and the conductor 441a, tantalum nitride or a stacked film obtained by stacking titanium nitride over tantalum nitride is formed by a sputtering method. With use of such metal nitride for the conductor 440a, the conductor 540a, and the conductor 441a, even when metal that easily diffuses, such as copper, is used for the conductor 440b, the conductor 540b, and the conductor 441b to be described later, the metal can be prevented from diffusing from the conductor 440a, the conductor 540a, and the conductor 441a to the outside.

Next, a conductive film to be the conductor 440b, the conductor 540b, and the conductor 441b is formed over the conductive film to be the conductor 440a, the conductor 540a, and the conductor 441a. The conductive film can be formed by a sputtering method, a CVD method, an MBE method, a PLD method, an ALD method, or the like. In this embodiment, as the conductive film to be the conductor 440b, the conductor 540b, and the conductor 441b, a film of a low resistance conductive material, such as copper, is formed.

Next, CMP treatment is performed to remove a portion above the insulator 430 of the conductive film to be the conductor 440a, the conductor 540a, and the conductor 441a and a portion above the insulator 430 of the conductive film to be the conductor 440b, the conductor 540b, and the conductor 441b. As a result, the conductive film to be the conductor 440a, the conductor 540a, and the conductor 441a and the conductive film to be the conductor 440b, the conductor 540b, and the conductor 441b remain only in the grooves. Thus, the conductor 440 including the conductor 440a and the conductor 440b whose top surfaces are flat, the conductor 540 including the conductor 540a and the conductor 540b whose top surfaces are flat, and the conductor 441 including the conductor 441a and the conductor 441b whose top surfaces are flat can be formed (see FIGS. 5A and 5B).

For example, the conductor 441, the conductor 440, and the conductor 540 can be formed in parallel by a dual damascene method. In this case, when the groove in which the conductor 440 is embedded and the groove in which the conductor 540 is embedded are formed in the insulator 430, the groove in which the conductor 441 is embedded can be formed in the insulator 400, the insulator 432, and the insulator 430 in parallel to the groove in which the conductor 440 is embedded and the groove in which the conductor 540 is embedded.

Next, the insulator 401 is formed over the conductor 440, the conductor 540, the conductor 441, and the insulator 430. The insulator 401 can be formed by a sputtering method, a CVD method, an MBE method, a PLD method, an ALD method, or the like. In this embodiment, silicon nitride is deposited as the insulator 401 by a CVD method. With use of the insulator that is less likely to transmit copper, such as silicon nitride, as the insulator 401, even when metal that easily diffuses, such as copper, is used for the conductor 440b, the conductor 441b, and the like, the metal can be prevented from diffusing into layers above the insulator 401.

Next, the insulator 301 is formed over the insulator 401. The insulator 301 can be formed by a sputtering method, a CVD method, an MBE method, a PLD method, an ALD method, or the like. In this embodiment, silicon oxide is deposited as the insulator 301 by a CVD method.

Next, grooves that reach the conductor 440 and the conductor 540 are formed in the insulator 401 and the insulator 301. Examples of the groove include a hole and an opening. In forming the groove, wet etching may be employed; however, dry etching is preferably employed in terms of microfabrication.

After the formation of the grooves, a conductive film to be the conductor 410a and the conductor 510a is formed. The conductive film to be the conductor 410a and the conductor 510a desirably contains a conductive material that has a function of inhibiting the penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 410a can be formed by a sputtering method, a CVD method, an MBE method, a PLD method, an ALD method, or the like.

In this embodiment, tantalum nitride is deposited by a sputtering method for the conductive film to be the conductor 410a and the conductor 510a.

Next, a conductive film to be the conductor 410b and the conductor 510b is formed over the conductive film to be the conductor 410a and the conductor 510a. The conductive film can be formed by a sputtering method, a CVD method, an MBE method, a PLD method, an ALD method, or the like.

In this embodiment, for the conductive film to be the conductor 410*b* and the conductor 510*b*, titanium nitride is deposited by a CVD method and tungsten is deposited by a CVD method over the titanium nitride.

Next, CMP treatment is performed to remove a portion above the insulator 301 of the conductive film to be the conductor 410*a* and the conductor 510*a* and a portion above the insulator 301 of the conductive film to be the conductor 410*b* and the conductor 510*b*. As a result, the conductive film to be the conductor 410*a* and the conductor 510*a* and the conductive film to be the conductor 410*b* and the conductor 510*b* remain only in the grooves. Thus, the conductor 410 including the conductor 410*a* and the conductor 410*b* whose top surfaces are flat and the conductor 510 including the conductor 510*a* and the conductor 510*b* whose top surfaces are flat can be formed (see FIGS. 5A and 5B).

Then, the insulator 302 is formed over the insulator 301, the conductor 410, and the conductor 510. The insulator 302 can be formed by a sputtering method, a CVD method, an MBE method, a PLD method, an ALD method, or the like.

Subsequently, the insulator 303 is formed over the insulator 302. The insulator 303 can be formed by a sputtering method, a CVD method, an MBE method, a PLD method, an ALD method, or the like.

After that, the insulator 402 is formed over the insulator 303. The insulator 402 can be formed by a sputtering method, a CVD method, an MBE method, a PLD method, an ALD method, or the like (see FIGS. 5A and 5B).

Next, first heat treatment is preferably performed. The first heat treatment can be performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The first heat treatment is performed in a nitrogen atmosphere, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen. By the first heat treatment, impurities such as water or hydrogen contained in the insulator 402 can be removed, for example. In the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas is performed with the apparatus, plasma treatment using oxygen may be performed in order to compensate for released oxygen. Note that the first heat treatment is not necessary in some cases.

Alternatively, the heat treatment can be performed after the formation of the insulator 302, after the formation of the insulator 303, and after the formation of the insulator 402. Although each heat treatment can be performed under the conditions for the first heat treatment, the heat treatment after the formation of the insulator 302 is preferably performed in an atmosphere containing nitrogen.

In this embodiment, the first heat treatment is performed at 400° C. in a nitrogen atmosphere for one hour after the insulator 402 is formed.

Next, an oxide film to be the oxide 406*a*, the oxide 506*a*1, and the oxide 506*a*2 and an oxide film to be the oxide 406*b*, the oxide 506*b*1, and the oxide 506*b*2 are formed in this order over the insulator 402. Note that it is preferable that the oxide films be successively formed without being exposed to the atmosphere. In that case, impurities or moisture in the atmosphere can be prevented from being attached onto the oxide film to be the oxide 406*a*, the oxide 506*a*1, and the oxide 506*a*2, and the interface between the oxide film to be the oxide 406*a*, the oxide 506*a*1, and the oxide 506*a*2 and the oxide film to be the oxide 406*b*, the oxide 506*b*1, and the oxide 506*b*2 and the vicinity of the interface can be kept clean.

The oxide film to be the oxide 406*a*, the oxide 506*a*1, and the oxide 506*a*2 and the oxide film to be the oxide 406*b*, the oxide 506*b*1, and the oxide 506*b*2 can be formed by a sputtering method, a CVD method, an MBE method, a PLD method, an ALD method, or the like.

In the case where the oxide film to be the oxide 406*a*, the oxide 506*a*1, and the oxide 506*a*2 and the oxide film to be the oxide 406*b*, the oxide 506*b*1, and the oxide 506*b*2 are formed by a sputtering method, for example, oxygen or a mixed gas of oxygen and a rare gas is used as a sputtering gas. When the proportion of oxygen in the sputtering gas is increased, the amount of excess oxygen in the oxide films to be formed can be increased. In the case where the oxide films are formed by a sputtering method, the above-described In-M-Zn oxide target can be used.

In particular, part of oxygen contained in the sputtering gas is supplied to the insulator 402 in some cases, at the formation of the oxide film to be the oxide 406*a*, the oxide 506*a*1, and the oxide 506*a*2.

Note that the proportion of oxygen contained in the sputtering gas for the oxide film to be the oxide 406*a*, the oxide 506*a*1, and the oxide 506*a*2 is 70% or higher, preferably 80% or higher, and further preferably 100%.

In the case where the oxide film to be the oxide 406*b*, the oxide 506*b*1, and the oxide 506*b*2 is formed by a sputtering method, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In the case where an oxygen-deficient oxide semiconductor is used for the oxide film to be the oxide 406*b*, the oxide 506*b*1, and the oxide 506*b*2, an oxide film containing excess oxygen is preferably used as the oxide film to be the oxide 406*a*, the oxide 506*a*1, and the oxide 506*a*2. Oxygen doping treatment may be performed after the formation of the oxide film to be the oxide 406*b*, the oxide 506*b*1, and the oxide 506*b*2.

In this embodiment, the oxide film to be the oxide 406*a*, the oxide 506*a*1, and the oxide 506*a*2 is formed by a sputtering method using a target containing In, Ga, and Zn at an atomic ratio of 1:3:4, and the oxide film to be the oxide 406*b*, the oxide 506*b*1, and the oxide 506*b*2 is formed by a sputtering method using a target containing In, Ga, and Zn at an atomic ratio of 4:2:4.1.

After that, second heat treatment may be performed. For the second heat treatment, the conditions for the first heat treatment can be used. By the second heat treatment, impurities such as water or hydrogen contained in the oxide film to be the oxide 406a, the oxide 506a1, and the oxide 506a2 and the oxide film to be the oxide 406b, the oxide 506b1, and the oxide 506b2 can be removed. In this embodiment, the second heat treatment is performed in such a manner that treatment at 400° C. in a nitrogen atmosphere is performed for one hour and then treatment at 400° C. in an oxygen atmosphere is successively performed for one hour.

Next, the oxide film to be the oxide 406a, the oxide 506a1, and the oxide 506a2 and the oxide film to be the oxide 406b, the oxide 506b1, and the oxide 506b2 are processed into island shapes to form the oxide 406a, the oxide 506a1, the oxide 506a2, the oxide 406b, the oxide 506b1, and the oxide 506b2 (see FIGS. 5C and 5D). Here, the oxides 406a and 406b are formed so that at least parts thereof overlap with the conductor 410. At least part of the conductor 510 overlaps with a region between the oxides 506a1 and 506b1 and the oxides 506a2 and 506b2. When the oxide films are collectively processed, the side surface of the oxide 406b and the side surface of the oxide 406a preferably form one surface. The side surface of the oxide 506b1 and the side surface of the oxide 506a1 preferably form one surface. The side surface of the oxide 506b2 and the side surface of the oxide 506a2 preferably form one surface. A lithography method may be employed for the processing of the oxide films. Alternatively, a dry etching method or a wet etching method may be used for the processing. A dry etching method is suitable for minute processing.

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light such as KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

Instead of the resist mask, a hard mask formed of an insulator or a conductor may be used. In the case where a hard mask is used, a hard mask with a desired shape can be formed in the following manner: an insulating film or a conductive film that is the material of the hard mask is formed over the oxide film to be the oxide 406b, the oxide 506b1, and the oxide 506b2, a resist mask is formed thereover, and then the material of the hard mask is etched. The etching of the oxide film to be the oxide 406a, the oxide 506a1, and the oxide 506a2 and the oxide film to be the oxide 406b, the oxide 506b1, and the oxide 506b2 may be performed after or without removal of the resist mask. In the latter case, the resist mask may be eliminated during the etching. The hard mask may be removed by etching after the etching of the oxide films. The hard mask does not need to be removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers are applied to one of the parallel plate electrodes. Further alternatively, high-frequency powers with the same frequency are applied to the parallel plate electrodes. Still further alternatively, high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Note that after the processing of the oxide films, the oxides 406a and 406b, the oxides 506a1 and 506b1, and the oxides 506a2 and 506b2 may have tapered cross sections. The taper angle to a plane parallel to the bottom surface of the substrate is, for example, greater than or equal to 30° and less than 75°. Owing to such a taper angle, the coverage with films formed later in the manufacturing process can be improved. A dry etching method is suitable the processing into a tapered shape.

In some cases, treatment such as dry etching performed in the above process causes the attachment or diffusion of impurities due to an etching gas or the like to a surface or an inside of the oxide 406a, the oxide 506a1, the oxide 506a2, the oxide 406b, the oxide 506b1, the oxide 506b2, or the like. Examples of the impurities include fluorine and chlorine.

To remove the impurities or the like, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, third heat treatment may be performed. For the third heat treatment, the conditions for the first heat treatment can be used. Note that the third heat treatment is not necessary in some cases. In this embodiment, the third heat treatment is not performed.

Figure 6B:
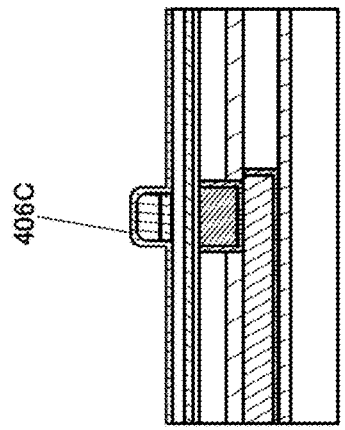
FIGS. 6A to 6D are cross-sectional views illustrating a method of manufacturing a semiconductor device of one embodiment of the present invention.
Figure 6D:
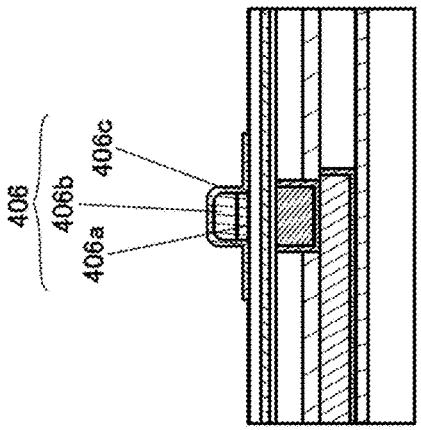
Figure 6A:
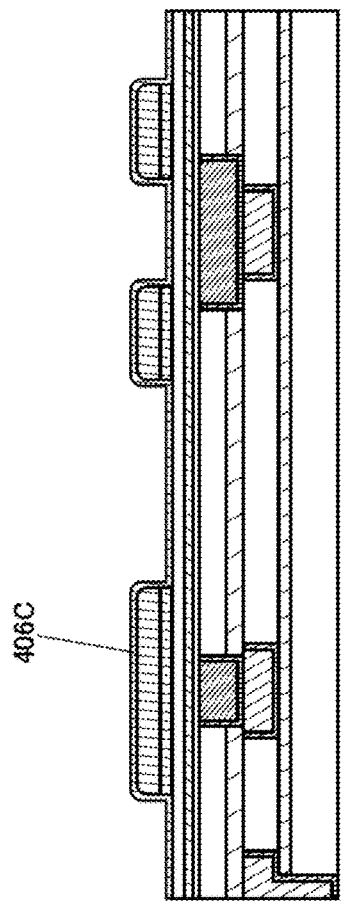
Figure 6C:
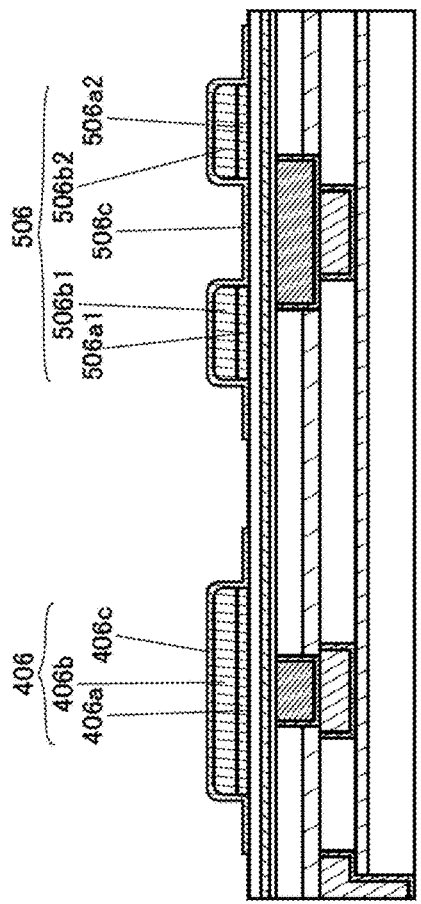

Next, the oxide film 406C is formed over the insulator 402, the oxide 406a, the oxide 506a1, the oxide 506a2, the oxide 406b, the oxide 506b1, and the oxide 506b2 (see FIGS. 6A and 6B). The oxide film 406C can be formed by a sputtering method, a CVD method, an MBE method, a PLD method, an ALD method, or the like.

The oxide film 406C is an oxide film to be the oxide 406c and the oxide 506c. Therefore, in accordance with characteristics required for the oxide 406c and the oxide 506c, the oxide film 406C is formed by a method similar to the method of forming the oxide film to be the oxide 406a, the oxide 506a1, and the oxide 506a2 or the method of forming the oxide film to be the oxide 406b, the oxide 506b1, and the oxide 506b2. In this embodiment, the oxide film 406C is formed by a sputtering method using a target with an atomic ratio of In:Ga:Zn=4:2:4.1.

Next, the oxide film 406C is processed into an island shape to form the oxide 406c and the oxide 506c (see FIGS.

6C and 6D). Here, the oxide 406c preferably covers the oxide 406a and the oxide 406b. In addition, the oxide 506c preferably covers the oxide 506a1, the oxide 506b1, the oxide 506a2, and the oxide 506b2. A lithography method may be employed for the processing of the oxide film 406C. Alternatively, a dry etching method or a wet etching method may be used for the processing. A dry etching method is suitable for minute processing. In the lithography method, a hard mask may be used instead of a resist mask.

Next, an insulating film to be the insulator 412 and the insulator 512, a conductive film to be the conductor 404a and the conductor 504a, a conductive film to be the conductor 404b and the conductor 504b, and an insulating film to be the insulator 419 and the insulator 519 are formed in this order over the insulator 402, the oxide 406c, and the oxide 506c.

The insulating film to be the insulator 412 and the insulator 512 can be formed by a sputtering method, a CVD method, an MBE method, a PLD method, an ALD method, or the like.

Note that oxygen is excited by a microwave to generate high-density oxygen plasma, and the insulating film to be the insulator 412 and the insulator 512 is exposed to the oxygen plasma, whereby oxygen can be supplied to the insulator 412, the insulator 512, the oxide 406, and the oxide 506. Furthermore, in a later step, by heat treatment performed after the formation of the insulator 418 and the insulator 518, oxygen contained in the insulator 412 and the insulator 512 can be selectively diffused into the oxide 406 and the oxide 506, leading to a reduction in oxygen vacancies in the oxide 406 and the oxide 506.

Here, fourth heat treatment can be performed. For this heat treatment, the conditions for the first heat treatment can be used. The fourth heat treatment can reduce the moisture concentration and the hydrogen concentration in the insulating film to be the insulator 412 and the insulator 512. Note that the fourth heat treatment is not necessary in some cases.

The conductive film to be the conductor 404a and the conductor 504a can be formed by a sputtering method, a CVD method, an MBE method, a PLD method, an ALD method, or the like. As the conductive film, conductive oxide that can be used as the conductor 404a or the like is deposited by a sputtering method in an atmosphere containing oxygen, whereby oxygen can be added to the insulator 412 and the insulator 512 and oxygen can be supplied to the oxide 406b, the oxide 406c, and the oxide 506c.

The conductive film to be the conductor 404b and the conductor 504b can be formed by a sputtering method, a CVD method, an MBE method, a PLD method, an ALD method, or the like. By forming the conductive film by a sputtering method, the conductive film to be the conductor 404a and the conductor 504a can have reduced electric resistance and become a conductor. Such a conductor can be called an oxide conductor (OC) electrode. Another conductor may be formed by a sputtering method or the like over the conductor over the OC electrode.

Here, fifth heat treatment can be performed. For the fifth heat treatment, the conditions for the first heat treatment can be used. The fifth heat treatment is necessarily be performed in some cases. In this embodiment, the fifth heat treatment is performed in a nitrogen atmosphere at 400° C. for one hour.

The insulating film to be the insulator 419 and the insulator 519 can be formed by a sputtering method, a CVD method, an MBE method, a PLD method, an ALD method, or the like. In particular, an ALD method is preferred. The insulating film to be the insulator 419 and the insulator 519 formed by an ALD method can have a thickness of greater than or equal to 1 nm and less than or equal to 20 nm, preferably greater than or equal to 5 nm and less than or equal to 10 nm. Here, this thickness is preferably larger than that of the insulating film to be the insulator 418 and the insulator 518. With this structure, the insulator 419 is likely to be left over the conductor 404 and the insulator 519 is likely to be left over the conductor 504 in a later step of forming the insulator 418 and the insulator 518.

Figure 7B:
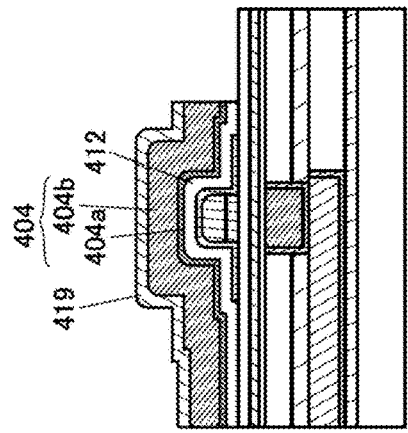
FIGS. 7A to 7D are cross-sectional views illustrating a method of manufacturing a semiconductor device of one embodiment of the present invention.
Figure 7D:
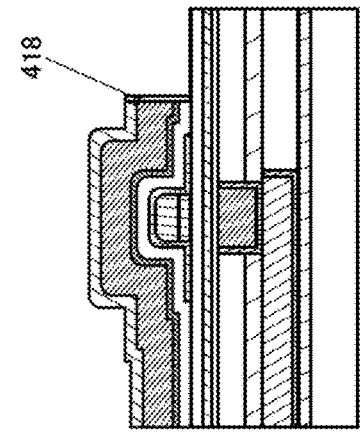
Figure 7A:
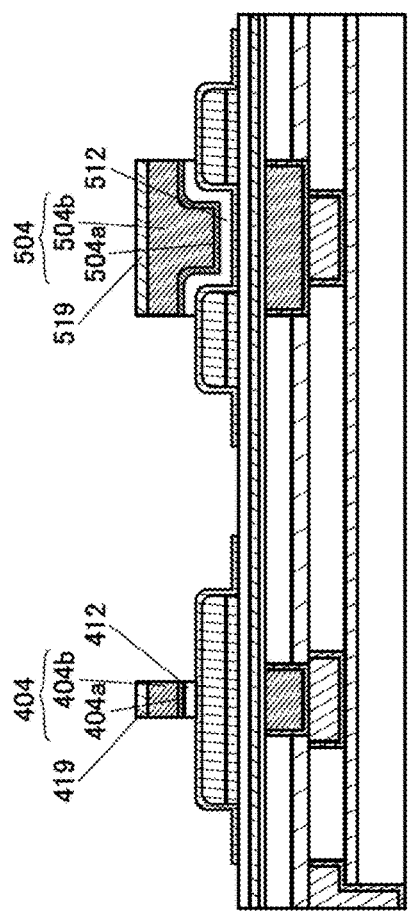

Next, the insulating film to be the insulator 412 and the insulator 512, the conductive film to be the conductor 404a and the conductor 504a, the conductive film to be the conductor 404b and the conductor 504b, and the insulating film to be the insulator 419 and the insulator 519 are etched to form the insulator 412, the insulator 512, the conductor 404a, the conductor 504a, the conductor 404b, the conductor 504b, the insulator 419, and the insulator 519 (see FIGS. 7A and 7B). At least part of the insulator 412, part of the conductor 404a, part of the conductor 404b, and part of the insulator 419 overlap with the conductor 410 and the oxide 406. Furthermore, at least part of the insulator 512, part of the conductor 504a, part of the conductor 504b, and part of the insulator 519 overlap with the conductor 510 and the oxide 506. A lithography method may be employed for the processing of the insulating films.

Here, it is preferable that the position of a side surface of the insulator 412 be substantially the same as positions of side surfaces of the insulator 419, the conductor 404a, and the conductor 404b when the substrate is perpendicularly seen from above. In addition, it is preferable that the position of a side surface of the insulator 512 be substantially the same as positions of side surfaces of the insulator 519, the conductor 504a, and the conductor 504b when the substrate is perpendicularly seen from above.

Here, a cross section of the insulator 412, the conductor 404a, the conductor 404b, and the insulator 419 and a cross section of the insulator 512, the conductor 504a, the conductor 504b, and the insulator 519 are preferably tapered as little as possible. In that case, the insulator 418 and the insulator 518 are likely to be left in a later formation step of the insulator 418 and the insulator 518.

Note that an upper portion of the oxide 406c in a region not overlapping with the insulator 412 may be etched by the above etching. In that case, the oxide 406c is thicker in the region overlapping with the insulator 412 than in the region not overlapping with the insulator 412. The same applies to a region of the oxide 506c which does not overlap with the insulator 512.

Next, the insulating film to be the insulator 418 and the insulator 518 is formed by an ALD method to cover the insulator 402, the oxide 406, the insulator 412, the conductor 404, the insulator 419, the oxide 506, the insulator 512, the conductor 504, and the insulator 519. The insulating film formed by an ALD method can have a thickness of greater than or equal to 1 nm and less than or equal to 20 nm, preferably greater than or equal to 1 nm and less than or equal to 3 nm, and approximately 1 nm, for example. Furthermore, by an ALD method, even when the aspect ratio of a structure body formed of the insulator 412, the conductor 404, and the insulator 419 is extremely high, the insulating film can be formed on a top surface and a side surface of the structure body to have few pinholes and uniform thickness. In this embodiment, aluminum oxide is formed as the insulating film by an ALD method.

Figure 7C:
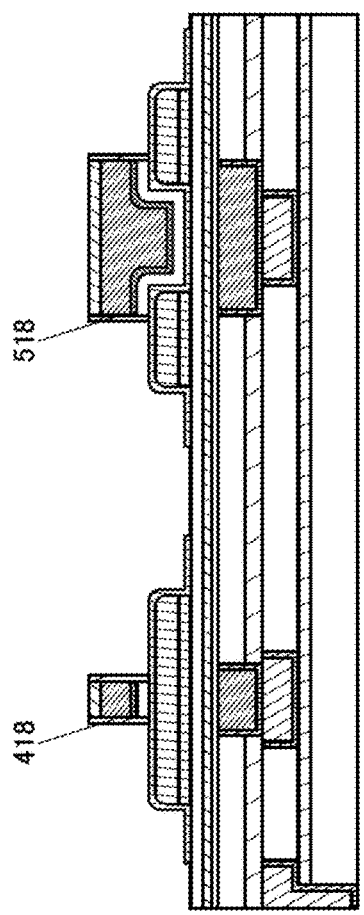

Next, the insulating film to be the insulator 418 and the insulator 518 is subjected to anisotropic etching to form the insulator 418 in contact with side surfaces of the insulator 412, the conductor 404, and the insulator 419 and the insulator 518 in contact with side surfaces of the insulator 512, the conductor 504, and the insulator 519 (see FIGS. 7C and 7D). Dry etching is preferably performed as the anisotropic etching. In this manner, the insulating film in a region on a plane substantially parallel to the substrate can be removed, so that the insulator 418 and the insulator 518 can be formed in a self-aligned manner.

Here, the thicknesses of the insulator 419 and the insulator 519 are set larger than the thickness of the insulating film to be the insulator 418 and the insulator 518, in which case the insulator 419, the insulator 418, the insulator 519, and the insulator 518 can be left even after upper portions of the insulator 419 and the insulator 418 and upper portions of the insulator 519 and the insulator 518 are removed. Furthermore, when the oxide 406 and the oxide 506 have tapered edges, time for removing the insulating film to be the insulator 418 and the insulator 518 formed in contact with the side surfaces of the oxide 406 and the oxide 506 can be shortened, which facilitates formation of the insulator 418 and the insulator 518.

An insulator may be left on the side surface of the oxide 406 and/or the side surface of the oxide 506. The insulator on the side surface of the oxide 406 and/or the side surface of the oxide 506 can reduce impurities such as water or hydrogen that enter the oxide 406 and/or the oxide 506 and can prevent outward diffusion of oxygen from the oxide 406 and/or the oxide 506, in some cases.

Figure 8B:
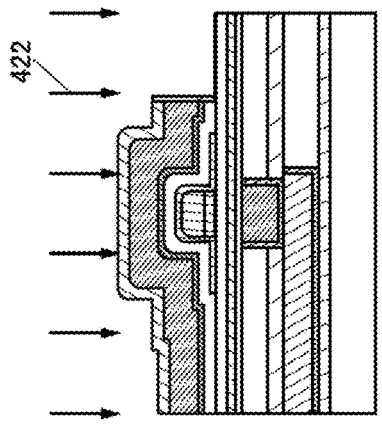
FIGS. 8A to 8D are cross-sectional views illustrating a method of manufacturing a semiconductor device of one embodiment of the present invention.
Figure 8D:
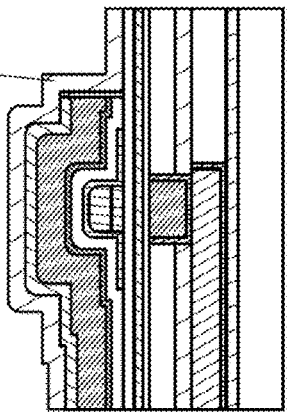
Figure 8A:
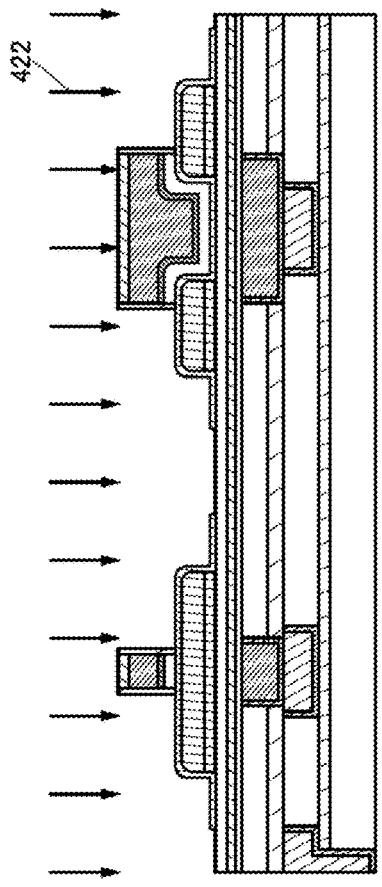

Next, the oxide 406 and the oxide 506 are subjected to plasma treatment using plasma 422, with use of the insulator 412, the conductor 404, the insulator 418, the insulator 419, the insulator 512, the conductor 504, the insulator 518, and the insulator 519 as masks (see FIGS. 8A and 8B). The plasma treatment is performed in an atmosphere containing the above-described element forming an oxygen vacancy or an element trapped by an oxygen vacancy. For example, the plasma treatment is performed using an argon gas and a nitrogen gas.

Instead of the plasma treatment, a dopant may be added. For the addition of the dopant, an ion implantation method by which an ionized source gas is subjected to mass separation and then added, an ion doping method by which an ionized source gas is added without mass separation, a plasma immersion ion implantation method, or the like can be used. In the case where mass separation is performed, an ion species to be added and its concentration can be strictly controlled. By contrast, in the case where mass separation is not performed, ions at a high concentration can be added in a short time. Alternatively, an ion doping method in which atomic or molecular clusters are generated and ionized may be employed. Instead of the term "dopant," the term "ion," "donor," "acceptor," "impurity," "element," or the like may be used.

As the dopant, the element forming an oxygen vacancy, the element trapped by an oxygen vacancy, or the like may be used. Typical examples of such an element are hydrogen, boron, carbon, nitrogen, fluorine, phosphorus, sulfur, chlorine, titanium, and a rare gas element. Typical examples of the rare gas element are helium, neon, argon, krypton, and xenon.

As described above, when the indium content in the oxide 406 and the oxide 506 is increased, the carrier density can be increased and the resistance can be decreased. For example, a metal element such as indium which increases the carrier density of the oxide 406 can be used as the dopant. Here, the dopant is preferably added such that the concentration of indium has a peak in the oxide 406a, the oxide 506a1, and the oxide 506a2.

In this way, it is preferable that the atomic ratio of indium to the element M in the regions 426b and 426c in the oxide 406a be substantially the same as the atomic ratio of indium to the element M in the oxide 406b. In other words, in the oxide 406a, the atomic ratio of indium to the element M in the regions 426b and 426c is preferably larger than the atomic ratio of indium to the element M in the region 426a.

With indium added in the above manner, even when the oxide 406c is removed, the thickness of the oxide 406b is small, and electric resistance of the oxide 406b is high in the manufacturing process of the transistor 1000, the region 426b and the region 426c in the oxide 406 can serve as source and drain regions owing to the sufficiently reduced resistance of the oxide 406a in the region 426b and the region 426c.

Figure 8C:
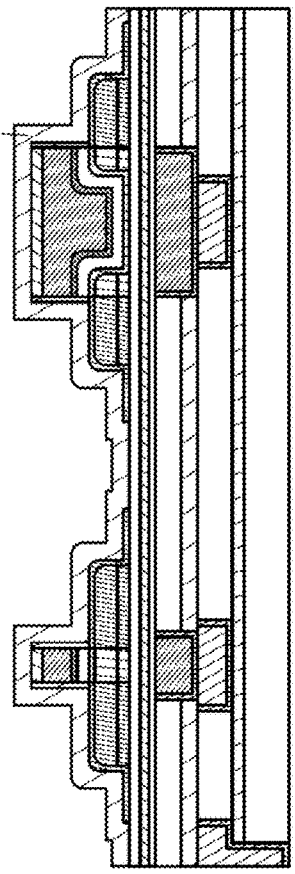

Next, the insulator 409 is formed to cover the insulator 402, the oxide 406, the insulator 418, the insulator 419, the insulator 502, the oxide 506, the insulator 518, and the insulator 519 (see FIGS. 8C and 8D). The insulator 409 can be formed by a sputtering method, a CVD method, an MBE method, a PLD method, an ALD method, or the like.

The insulating film 409 is preferably formed in an atmosphere containing at least one of nitrogen and hydrogen. In that case, oxygen vacancies are formed mainly in the regions of the oxide 406b and the oxide 406c not overlapping with the insulator 412 and the oxygen vacancies and impurity elements such as nitrogen or hydrogen are bonded to each other, leading to an increase in carrier density. In this manner, the regions 426b and 426c with reduced resistance can be formed. In addition, regions of the oxide 506b and the oxide 506c which do not overlap with the insulator 512 and the vicinity of the regions can have high carrier density and low resistance. For the insulator 409, for example, silicon nitride, silicon nitride oxide, or silicon oxynitride can be formed by a CVD method. In this embodiment, silicon nitride oxide is used for the insulator 409.

As described above, in the method for manufacturing a semiconductor device described in this embodiment, a source region and a drain region can be formed in a self-aligned manner owing to the formation of the insulator 409, even in a minute transistor whose channel length is approximately 10 nm to 30 nm. Thus, minute or highly integrated semiconductor devices can be manufactured with high yield.

Here, the top and side surfaces of the conductor 404 and the insulator 412 are covered with the insulator 419 and the insulator 418, whereby impurity elements such as nitrogen or hydrogen can be prevented from entering the conductor 404 and the insulator 412. Thus, the impurity elements such as nitrogen or hydrogen can be prevented from passing through the conductor 404 and the insulator 412 and entering the region 426a that functions as the channel formation region of the transistor 1000. Similarly, the top and side surfaces of the conductor 504 and the insulator 512 are covered with the insulator 519 and the insulator 518, whereby the impurity elements can be prevented from entering the channel formation region of the transistor 2000. Therefore, the transistor 1000 and the transistor 2000 with favorable electrical characteristics can be provided.

An insulating material having a function of inhibiting the penetration of oxygen and impurities such as water or hydrogen, is preferably used for the insulator 409. When such an insulator is provided over the regions 426b and 426c, oxygen or impurities such as water or hydrogen can be prevented from entering the regions 426b and 426c, leading to the prevention of a change in carrier density.

Note that the case where the region 426b and the region 426c are formed through the plasma treatment using the plasma 422 and the formation of the insulator 419 is described above, but this embodiment is not limited to this case. For example, the region 426b and the region 426c may be formed through one of the plasma treatment using the plasma 422 and the formation of the insulator 419.

Figure 9B:
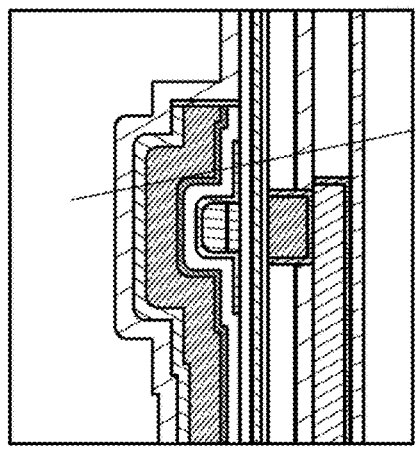
FIGS. 9A to 9D are cross-sectional views illustrating a method of manufacturing a semiconductor device of one embodiment of the present invention.
Figure 9D:
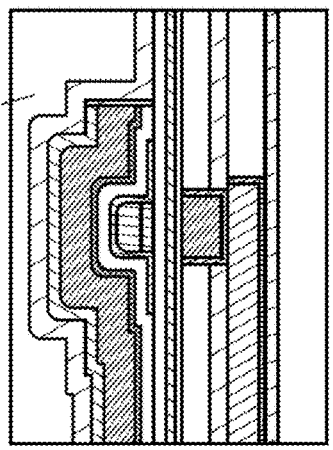
Figure 9A:
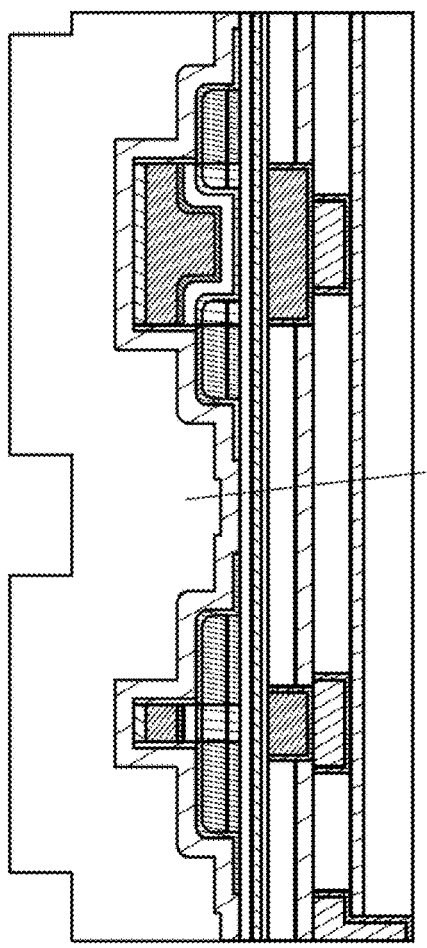

Next, an insulating film 415A is deposited over the insulator 409 (see FIGS. 9A and 9B). The insulating film 415A can be deposited by a sputtering method, a CVD method, an MBE method, a PLD method, an ALD method, or the like. Alternatively, the insulating film 415A can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulating film 415A.

Figure 9C:
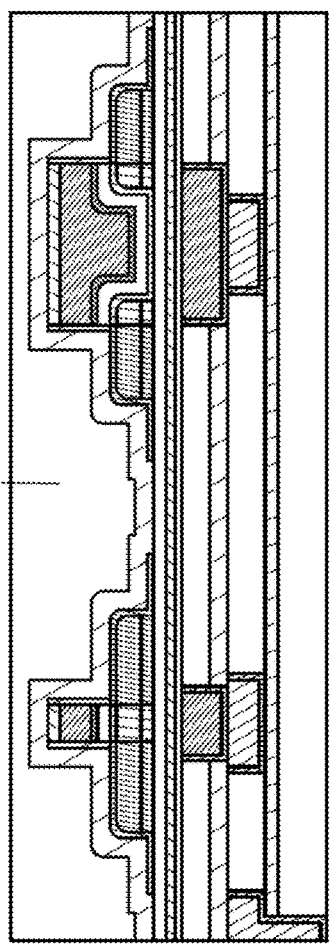

Next, the insulating film 415A is partly removed to form the insulator 415 (see FIGS. 9C and 9D). The insulator 415 is preferably formed to have a flat top surface. For example, the top surface of the insulating film 415A may be flat immediately after the film formation. Alternatively, the insulator 415 may have flatness in the following manner, for example: an insulator and the like are removed from the top surface after the film formation so that the top surface of the insulator 415 becomes parallel to a reference surface such as the rear surface of the substrate. Such treatment is referred to as planarization treatment. Examples of the planarization treatment include CMP treatment and dry etching treatment. In this embodiment, CMP treatment is performed as the planarization treatment. Note that the top surface of the insulator 415 is not necessarily flat.

Next, an opening reaching the region 426b of the oxide 406, an opening reaching the region 426c of the oxide 406, an opening reaching a portion of the oxide 506b1 that overlaps with the oxide 506c, and an opening reaching a portion of the oxide 506b2 that overlaps with the oxide 506c are formed in the insulator 415 and the insulator 409. A lithography method may be employed for the formation of the openings. Here, the openings reaching the oxide 406 are formed so that the side surfaces of the oxide 406 are exposed and the conductor 451a and the conductor 451b are in contact with the side surfaces of the oxide 406. Similarly, the openings reaching the oxide 506 are formed so that the side surfaces of the oxide 506 are exposed and the conductor 551a and the conductor 551b are in contact with the side surfaces of the oxide 506.

Next, a conductive film to be the conductor 451a, the conductor 451b, the conductor 551a, and the conductor 551b is formed. The conductive film can be formed by a sputtering method, a CVD method, an MBE method, a PLD method, an ALD method, or the like.

Next, CMP treatment is performed to remove a portion above the insulator 415 of the conductive film to be the conductor 451a, the conductor 451b, the conductor 551a, and the conductor 551b. As a result, the conductive film is left only in the openings, whereby the conductor 451a, the conductor 451b, the conductor 551a, and the conductor 551b with flat top surfaces can be formed.

Figure 10B:
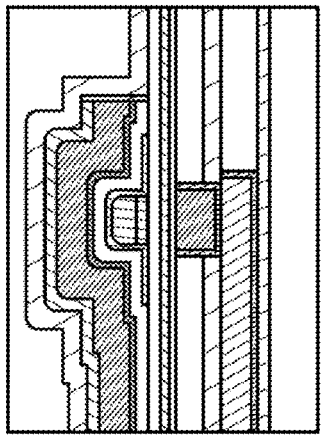
FIGS. 10A to 10D are cross-sectional views illustrating a method of manufacturing a semiconductor device of one embodiment of the present invention.
Figure 10D:
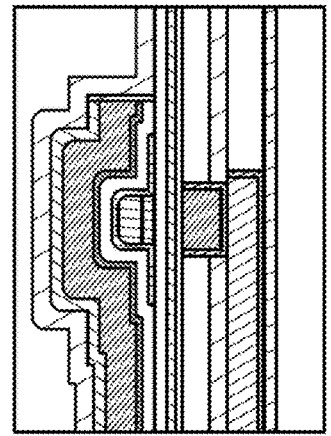
Figure 10A:
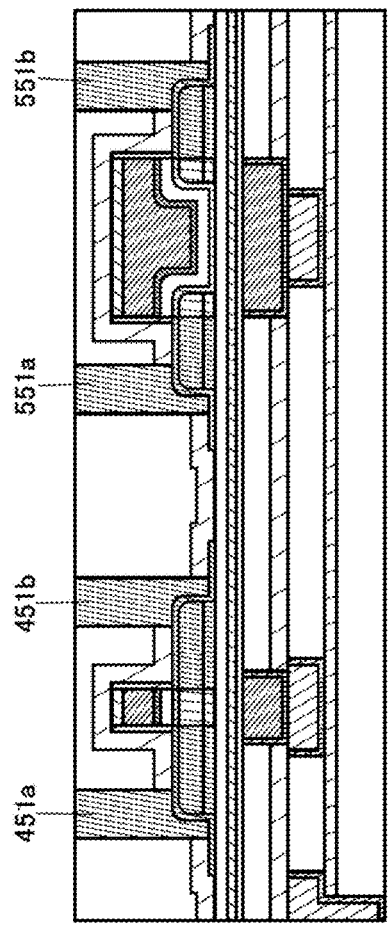
Figure 10C:
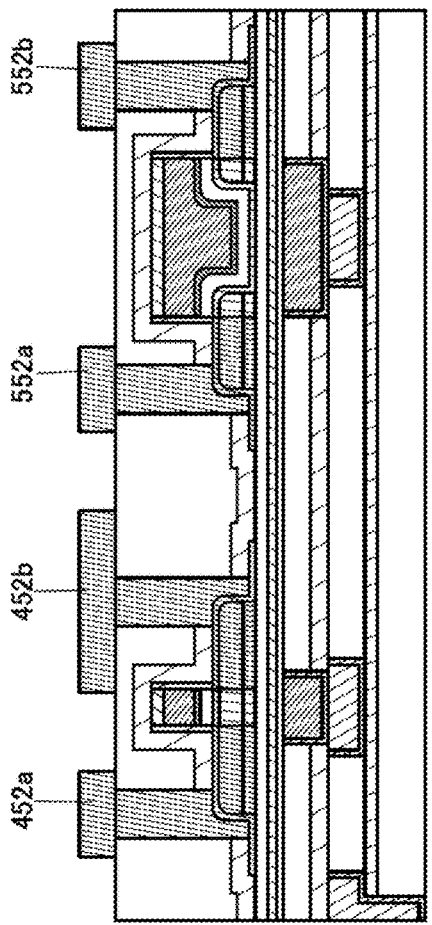

Next, a conductive film is formed and processed by a photolithography method to form the conductor 452a, the conductor 452b, the conductor 552a, and the conductor 552b (see FIGS. 10C and 10D). The conductive film can be formed by a sputtering method, a CVD method, an MBE method, a PLD method, an ALD method, or the like. Like the conductor 440, the conductors 452a, 452b, 552a, and 552b may be embedded in an insulator.

Figure 11A:
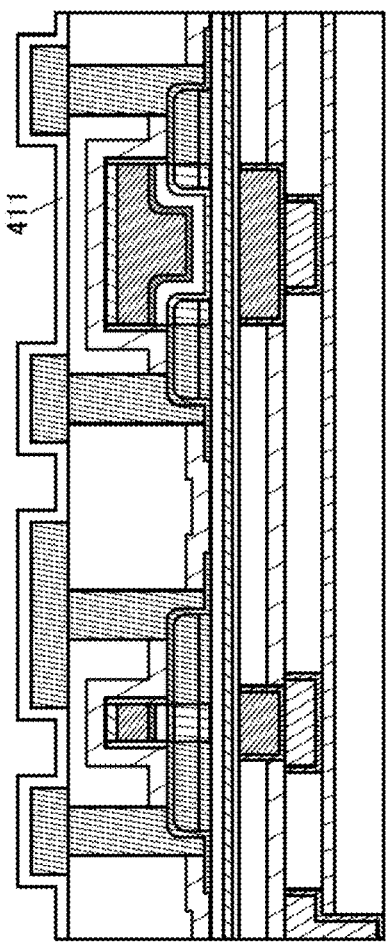
FIGS. 11A to 11D are cross-sectional views illustrating a method of manufacturing a semiconductor device of one embodiment of the present invention.
Figure 11B:
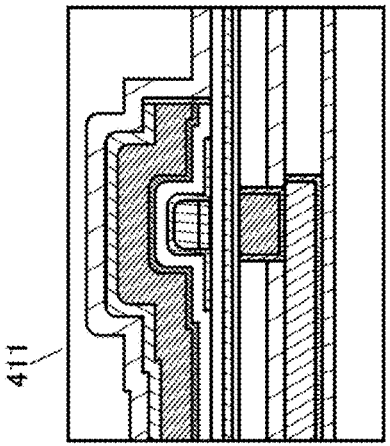

Next, the insulator 411 is formed over the insulator 415, the conductor 452a, the conductor 452b, the conductor 552a, and the conductor 552b (see FIGS. 11A and 11B). The insulator 411 can be formed by a sputtering method, a CVD method, an MBE method, a PLD method, an ALD method, or the like. In this embodiment, a stacked-layer film of aluminum oxide formed by an ALD method and silicon oxynitride formed by a CVD method is used as the insulator 411.

Next, a conductive film is formed over the insulator 411 and processed by a photolithography method to form the conductor 454. The conductive film can be formed by a sputtering method, a CVD method, an MBE method, a PLD method, an ALD method, or the like. Like the conductor 440, the conductor 454 may be embedded in an insulator.

Figure 11C:
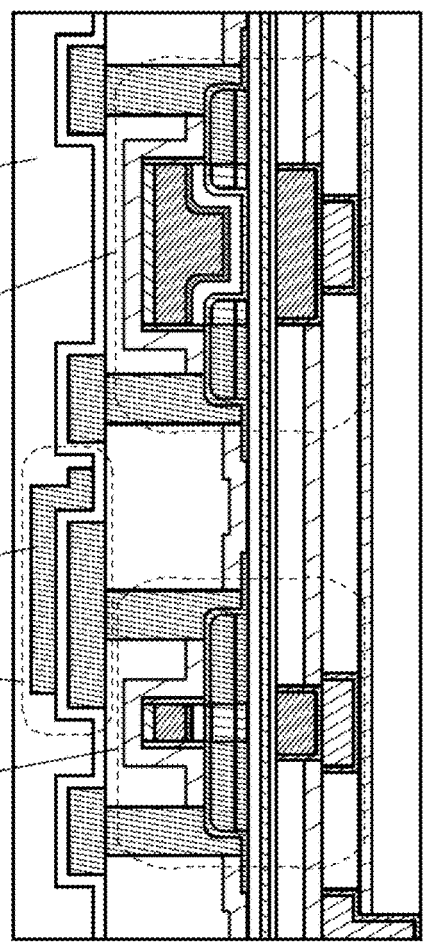
Figure 11D:
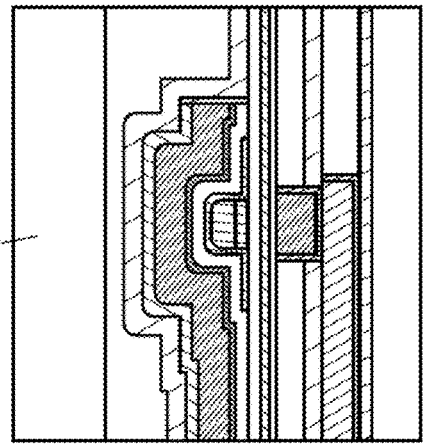

Next, the insulator 420 is formed over the insulator 411 and the conductor 454 (see FIGS. 11C and 11D). The insulator 420 can be formed by a sputtering method, a CVD method, an MBE method, a PLD method, an ALD method, or the like. Alternatively, the insulator 420 can be formed by a spin coating method, a dipping method, a droplet discharging method (such as an ink-jet method), a printing method (such as screen printing or offset printing), a doctor knife method, a roll coater method, a curtain coater method, or the like. Note that a top surface of the insulator 420 is preferably planarized by CMP treatment or the like.

Through the above process, the semiconductor device including the transistor 1000, the transistor 2000, and the capacitor 1500 can be manufactured (see FIGS. 1A and 1B). As illustrated in FIGS. 5A to 5D to FIGS. 11A to 11D, by the method of manufacturing a semiconductor device described in this embodiment, the transistor 1000 and the transistor 2000 can be formed in parallel, whereby the productivity of the semiconductor device can be improved.

As described above, according to one embodiment of the present invention, a semiconductor device that can be miniaturized or highly integrated, a semiconductor device having good electrical characteristics, a semiconductor device with low off-state current, a transistor with high on-state current, a highly reliable semiconductor device, a semiconductor device with low power consumption, or a semiconductor device that can be manufactured with high productivity can be provided.

<Structural Example 2 of Semiconductor Device>

An example of a semiconductor device of one embodiment of the present invention including a transistor 1000 and a transistor 2000 is described below.

FIGS. 14A and 14B are cross-sectional views of the semiconductor device including the transistor 1000 and the transistor 2000, and FIG. 15 is a top view of the semiconductor device. FIG. 14A is a cross-sectional view of a portion indicated by a dashed-dotted line A1-A2 in FIG. 15, which illustrates a cross section of the transistor 1000 in the channel length direction. FIG. 14B is a cross-sectional view of a portion indicated by a dashed-dotted line A3-A4 in FIG. 15, which illustrates a cross section of the transistor 1000 in the channel width direction. For simplification of the drawing, some components are not illustrated in the top view in FIG. 15.

Note that in the semiconductor device illustrated in FIGS. 14A and 14B and FIG. 15, components having the same functions as the components in the semiconductor device described in <Structural example 1 of semiconductor device> are denoted by the same reference numerals.

The structures of the transistors 1000 and 2000 will be described below with reference to FIGS. 14A and 14B, FIG. 15, and FIGS. 16A and 16B. Note that as materials of the transistor 1000 and the transistor 2000 in this section, the materials described in <Structural example 1 of semiconductor device> can be used.

[Transistor 1000]

As illustrated in FIGS. 14A and 14B, the transistor 1000 differs from that in the semiconductor device described in <Structural example 1 of semiconductor device> in at least the shape of the oxide 406*c*.

In the oxide 406, the oxide 406*a*, the oxide 406*b*, and the oxide 406*c* are stacked in this order. Side surfaces of the oxides 406*a*, 406*b*, and 406*c* are preferably substantially aligned with one another. The side surface of the oxide 406*b* and the side surface of the oxide 406*a* preferably form one surface. The side surface of the oxide 406*c* and the side surface of the oxide 406*b* preferably form one surface. The side surface of the oxide 406*c* and the side surface of the oxide 406*a* preferably form one surface. That is, it is preferable that when the substrate is perpendicularly seen from above, the position of the side surface of the oxide 406*c* be substantially the same as the positions of the side surfaces of the oxide 406*a* and the oxide 406*b*.

Therefore, the oxide 406*a*, the oxide 406*b*, and the oxide 406*c* can be formed in the same step, which improves the productivity. Furthermore, the formation of the oxides 406*a*, 406*b*, and 406*c* in the same step facilitates miniaturization and high integration of the transistor 1000.

Figure 16A:
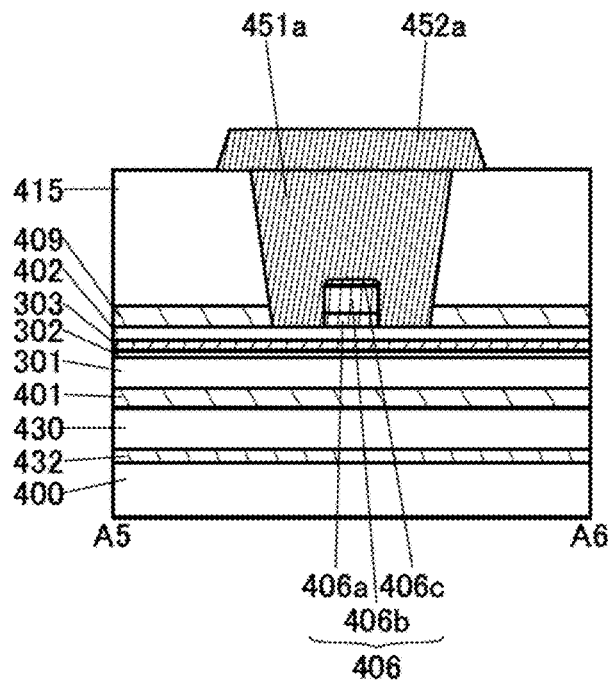
FIGS. 16A and 16B are cross-sectional views each illustrating a semiconductor device of one embodiment of the present invention.

As illustrated in FIG. 16A, the conductor 451*a* (the conductor 451*b*) is in contact with the side surfaces of the oxide 406*a*, the side surface of the oxide 406*b*, and the top and side surfaces of the oxide 406*c* which are included in the oxide 406.

Figure 16B:
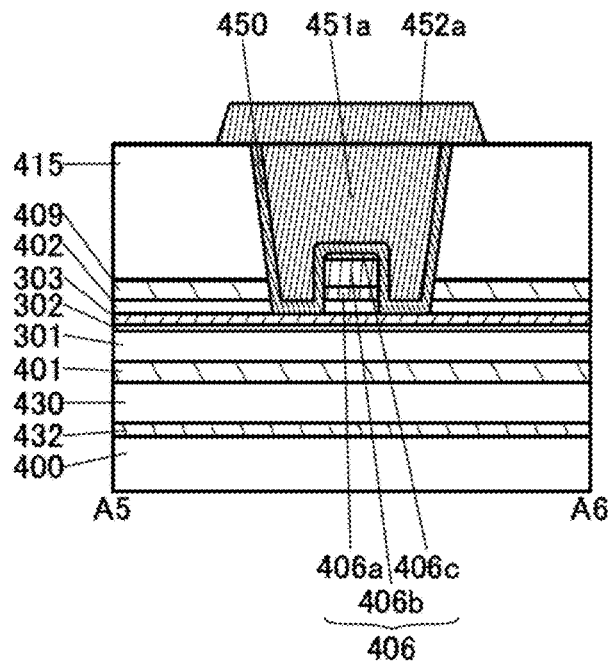

Although the conductor in which the opening is formed is only the conductor 451*a* (the conductor 451*b*) in FIG. 16A, this embodiment is not limited to this structure. A structure in which a conductor 450 in contact with inner walls of the insulator 415 and the insulator 409 is formed and the conductor 451*a* (the conductor 451*b*) is formed inside the conductor 450 as illustrated in FIG. 16B may be employed. Thus, the conductor 451*a* (the conductor 451*b*) is electrically connected to the region 426*b* (the region 426*c*) through the conductor 450.

Part of the insulator 402 may be removed when an opening is formed in the insulator 415 and the insulator 409. In that case, the insulator 302 is preferably an insulator that serves as an etching stopper film used in forming the groove by etching the insulators 415, 409, and 402. The insulator 303 serving as an etching stopper film can inhibit conduction with a wiring between the substrate and the insulator 302.

[Transistor 2000]

As illustrated in FIGS. 14A and 14B, the transistor 2000 differs from that in the semiconductor device described in <Structural example 1 of semiconductor device> in at least the shape of the oxide 506*c*.

As illustrated in FIGS. 14A and 14B, the transistor 2000 includes an insulator 401 and an insulator 301 over a substrate (not illustrated); a conductor 510 embedded in the insulator 401 and the insulator 301; an insulator 302 over the insulator 301 and the conductor 410; an insulator 303 over the insulator 302; an insulator 402 over the insulator 303; an oxide 506*a*1 and an oxide 506*a*2 apart from each other over the insulator 402; an oxide 506*b*1 in contact with a top surface of the oxide 506*a*1; an oxide 506*b*2 in contact with a top surface of the oxide 506*a*2; an oxide 506*c* in contact with top surfaces of the oxide 506*b*1 and the oxide 506*b*2; an insulator 512 over the oxide 506*c*; a conductor 504*a* over the insulator 512; a conductor 504*b* over the conductor 504*a*; an insulator 519 over the conductor 504*b*; an insulator 518 in contact with side surfaces of the insulator 512, the conductor 504*a*, the conductor 504*b*, and the insulator 519; and the insulator 409 in contact with side surfaces of the oxides 506*a* and 506*b*, top and side surfaces of the oxide 506*c*, and a side surface of the insulator 518. Here, as illustrated in FIG. 14A, the top surface of the insulator 518 is preferably substantially aligned with a top surface of the insulator 519. Furthermore, the insulator 409 is preferably provided to cover the insulator 519, the conductor 504, the insulator 518, and the oxide 506. It is preferable that when the substrate is perpendicularly seen from above, the position of the side surface of the insulator 512 is substantially the same as the positions of the side surfaces of the insulator 519, the conductor 504*a*, and the conductor 504*b*.

The oxide 506*a*1, the oxide 506*b*1, the oxide 506*a*2, and the oxide 506*b*2 preferably overlap with part of the oxide 506*c*. The side surface of the oxide 506*a*1 and the side surface of the oxide 506*b*1 are preferably substantially aligned with each other, and the side surface of the oxide 506*a*2 and the side surface of the oxide 506*b*2 are preferably substantially aligned with each other. For example, the oxide 506*c* is formed in contact with the side surfaces of the oxide 506*a*1 and the oxide 506*a*2, the top and side surfaces of the oxide 506*b*1 and the oxide 506*b*2, and part of the top surface of the insulator 402. That is, as illustrated in FIG. 15, the stacked structure of the oxide 506*a*1 and the oxide 506*b*1 and the stacked structure of the oxide 506*a*2 and the oxide 506*b*2 are preferably disposed in a region that is the projected area of the oxide 506*c*.

The oxides 506*a*1 and 506*b*1 and the oxides 506*a*2 and 506*b*2 are oppositely disposed with the conductor 510, the oxide 506*c*, the insulator 512, and the conductor 504 sandwiched therebetween.

The oxide 506 includes a region in contact with the insulator 409. The resistance of the region and its vicinity is lowered in a manner similar to that of the region 426*b* and the region 426*c* in the transistor 1000. Accordingly, the oxide 506*a*1, the oxide 506*b*1, and part of the oxide 506*c* can function as one of a source region and a drain region of the transistor 2000, and the oxide 506*a*2, the oxide 506*b*2, and other part of the oxide 506*c* can function as the other of the source region and the drain region of the transistor 2000.

<Method 2 of Manufacturing Semiconductor Device>

Next, a method of manufacturing the transistor 1000 and the transistor 2000 in parallel which are included in the semiconductor device of one embodiment of the present invention is described with reference to FIGS. 17A to 17D to FIG. 23. FIGS. 17A and 17C and FIGS. 18A and 18C are cross-sectional views taken along the dashed-dotted line A1-A2 in FIG. 15. FIGS. 17B and 17D and FIGS. 18B and 18D are cross-sectional views taken along the dashed-dotted line A3-A4 in FIG. 15.

First, the structure illustrated in FIGS. 17A and 17B is formed by a manufacturing method similar to the manufacturing method described in <Method 1 of manufacturing semiconductor device>.

Next, the oxide film to be the oxide 406*a*, the oxide 506*a*1, and the oxide 506*a*2 and the oxide film to be the oxide 406*b*, the oxide 506*b*1, and the oxide 506*b*2 are formed. Note that the oxide films can be formed in a manner similar to that in the manufacturing method described in <Method 1 of manufacturing semiconductor device>.

Then, an opening 505 is formed by removing part of the oxide film to expose part of the insulator 402, whereby an oxide 406A and an oxide 406B are formed (see FIGS. 17C and 17D). Note that a lithography method may be employed for the processing of the oxide films. Alternatively, a dry etching method or a wet etching method may be used for the processing. A dry etching method is suitable for minute processing.

Note that after the processing of the oxide films, the opening 505 may have a tapered cross section. The taper angle to a plane parallel to the bottom surface of the substrate is, for example, greater than or equal to 30° and less than 75°, preferably greater than or equal to 30° and less than 70°. Owing to such a taper angle, the coverage with films formed later in the manufacturing process can be improved. A dry etching method is suitable the processing into a tapered shape.

In some cases, treatment such as dry etching performed in the above process causes the attachment or diffusion of impurities due to an etching gas or the like to a surface or an inside of the oxide 406A, the oxide 406B, or the like. Examples of the impurities include fluorine and chlorine. To remove the impurities or the like, cleaning may be performed.

The oxide 406A and the oxide 406B may be subjected to heat treatment. For the heat treatment, the conditions for the first heat treatment can be used.

Figure 18B:
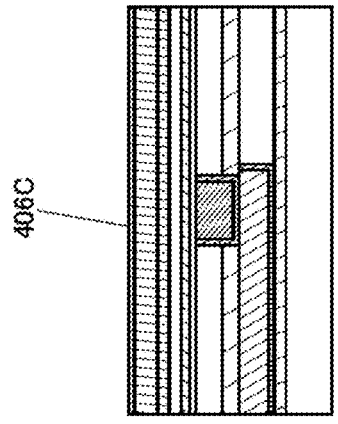
FIGS. 18A to 18D are cross-sectional views illustrating a method of manufacturing a semiconductor device of one embodiment of the present invention.
Figure 18A:
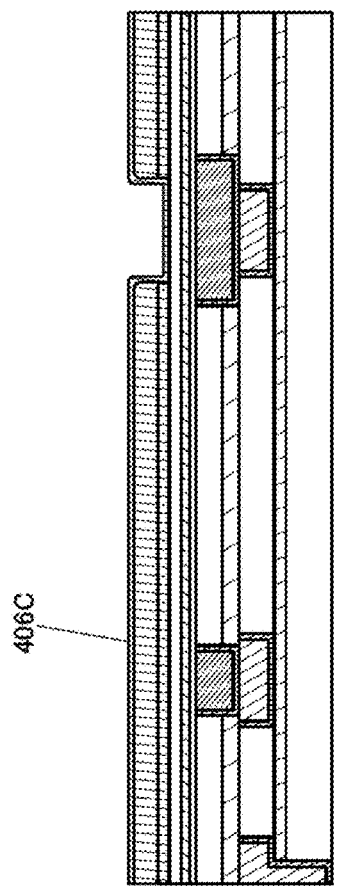

Next, the oxide film 406C is formed over the insulator 402 exposed in the opening 505, the oxide 406A, and the oxide 406B (see FIGS. 18A and 18B). The oxide film 406C can be formed by a sputtering method, a CVD method, an MBE method, a PLD method, an ALD method, or the like.

The oxide film 406C is an oxide film to be the oxide 406c and the oxide 506c. Therefore, in accordance with characteristics required for the oxide 406c and the oxide 506c, the oxide film 406C is formed by a method similar to the method of forming the oxide film to be the oxide 406a, the oxide 506a1, and the oxide 506a2 or the method of forming the oxide film to be the oxide 406b, the oxide 506b1, and the oxide 506b2. In this embodiment, the oxide film 406C is formed by a sputtering method using a target with an atomic ratio of In:Ga:Zn=4:2:4.1.

Figure 18D:
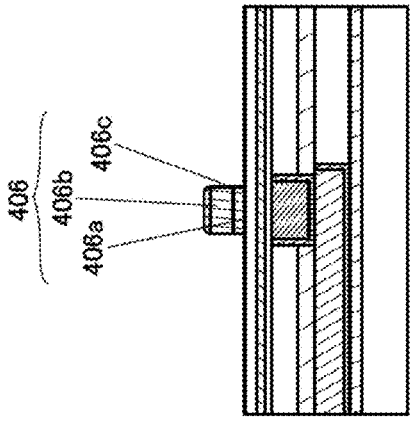
Figure 18C:
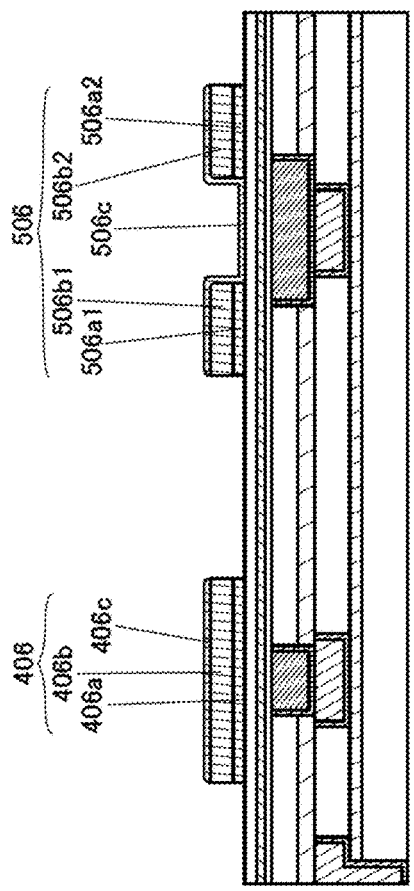

Next, the oxide 406A, the oxide 406B, and the oxide film 406C are processed into island shapes to form the oxide 406a, the oxide 506a1, the oxide 506a2, the oxide 406b, the oxide 506b1, the oxide 506b2, the oxide 406c, and the oxide 506c (see FIGS. 18C and 18D). Here, at least part of the oxide 406a, part of the oxide 406b, and part of the oxide 406c overlap with the conductor 410. At least part of the conductor 510 overlaps with a region between the oxides 506a1 and 506b1 and the oxides 506a2 and 506b2. Note that a lithography method may be employed for the processing of the oxide 406A, the oxide 406B, and the oxide film 406C. Alternatively, a dry etching method or a wet etching method may be used for the processing. A dry etching method is suitable for minute processing. In the lithography method, a hard mask may be used instead of a resist mask.

Note that the side surface of the oxide 406b and the side surface of the oxide 406a preferably form one surface. The side surface of the oxide 406b and the side surface of the oxide 406c preferably form one surface. The side surface of the oxide 406c and the side surface of the oxide 406a preferably form one surface. The side surface of the oxide 506b1 and the side surface of the oxide 506a1 preferably form one surface. One side surface of the oxide 506c and the side surface of the oxide 506a1 preferably form one surface. The one side surface of the oxide 506c and the side surface of the oxide 506b1 preferably form one surface. The side surface of the oxide 506b2 and the side surface of the oxide 506a2 preferably form one surface. The other side surface of the oxide 506c and the side surface of the oxide 506a2 preferably form one surface. The other side surface of the oxide 506c and the side surface of the oxide 506b2 preferably form one surface.

The oxide 406A, the oxide 406B, and the oxide film 406C are collectively processed, so that the side surfaces of the oxide 406a, the oxide 406b, and the oxide 406c are substantially aligned with one another. The side surfaces of the oxide 506a1 and the oxide 506b1 are substantially aligned with each other, and the side surfaces of the oxide 506a2 and the oxide 506b2 are substantially aligned with each other. In addition, the oxide 506a1, the oxide 506b1, the oxide 506a2, and the oxide 506b2 overlap with part of the oxide 506c. That is, as illustrated in FIG. 15, the stacked structure of the oxide 506a1 and the oxide 506b1 and the stacked structure of the oxide 506a2 and the oxide 506b2 are formed in a region that is the projected area of the oxide 506c.

The following steps can be formed in a manner similar to that in the manufacturing method described in <Method 1 of manufacturing semiconductor device>.

The structures, the methods, and the like described in this embodiment can be used in appropriate combination with any of the structures, the methods, and the like described in the other embodiments.

Embodiment 2

In this embodiment, one embodiment of a semiconductor device will be described with reference to FIG. 19 to FIG. 22.

[Memory Device 1]

Figure 19:
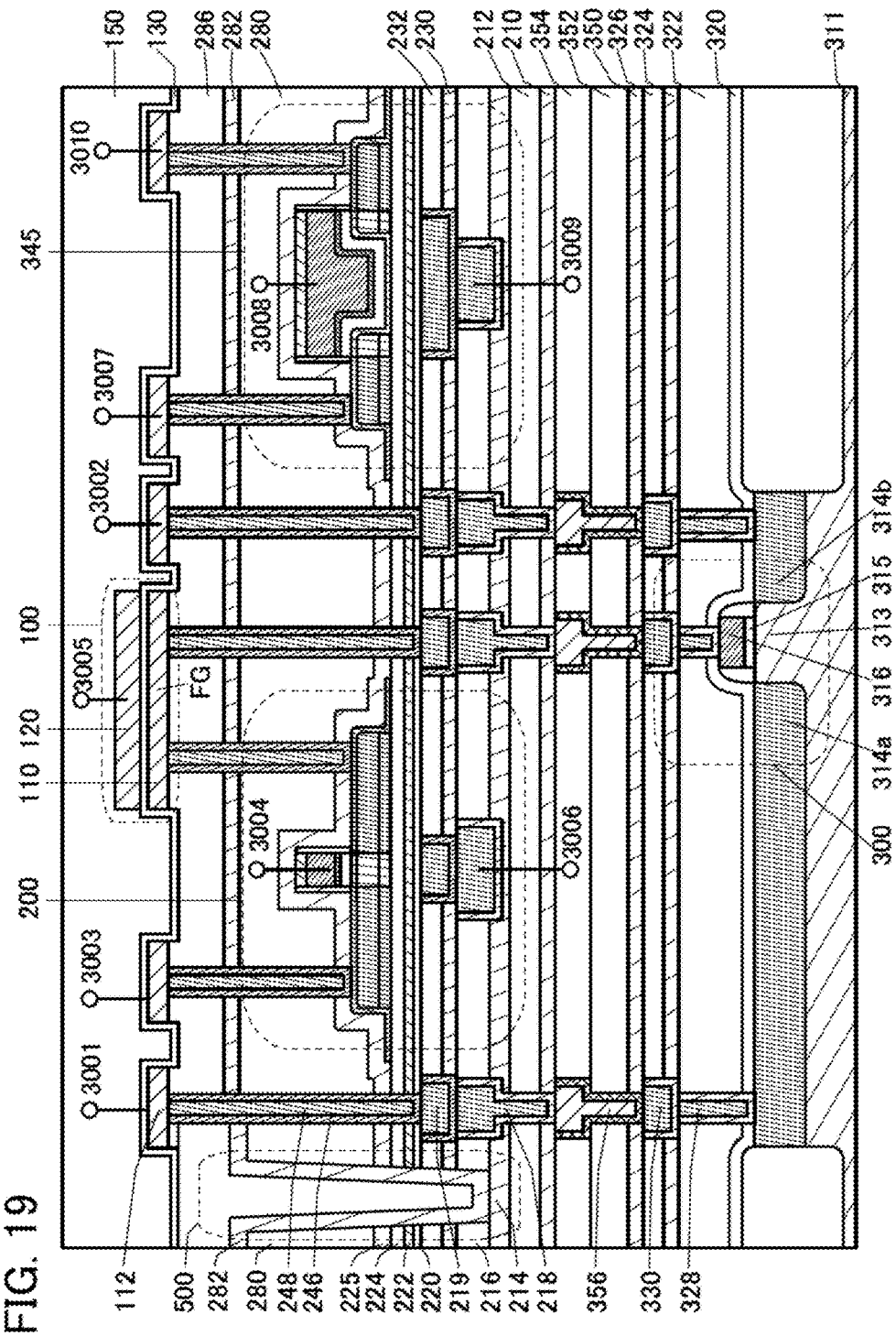
FIG. 19 is a cross-sectional view illustrating a structure of a memory device of one embodiment of the present invention.
Figure 20:
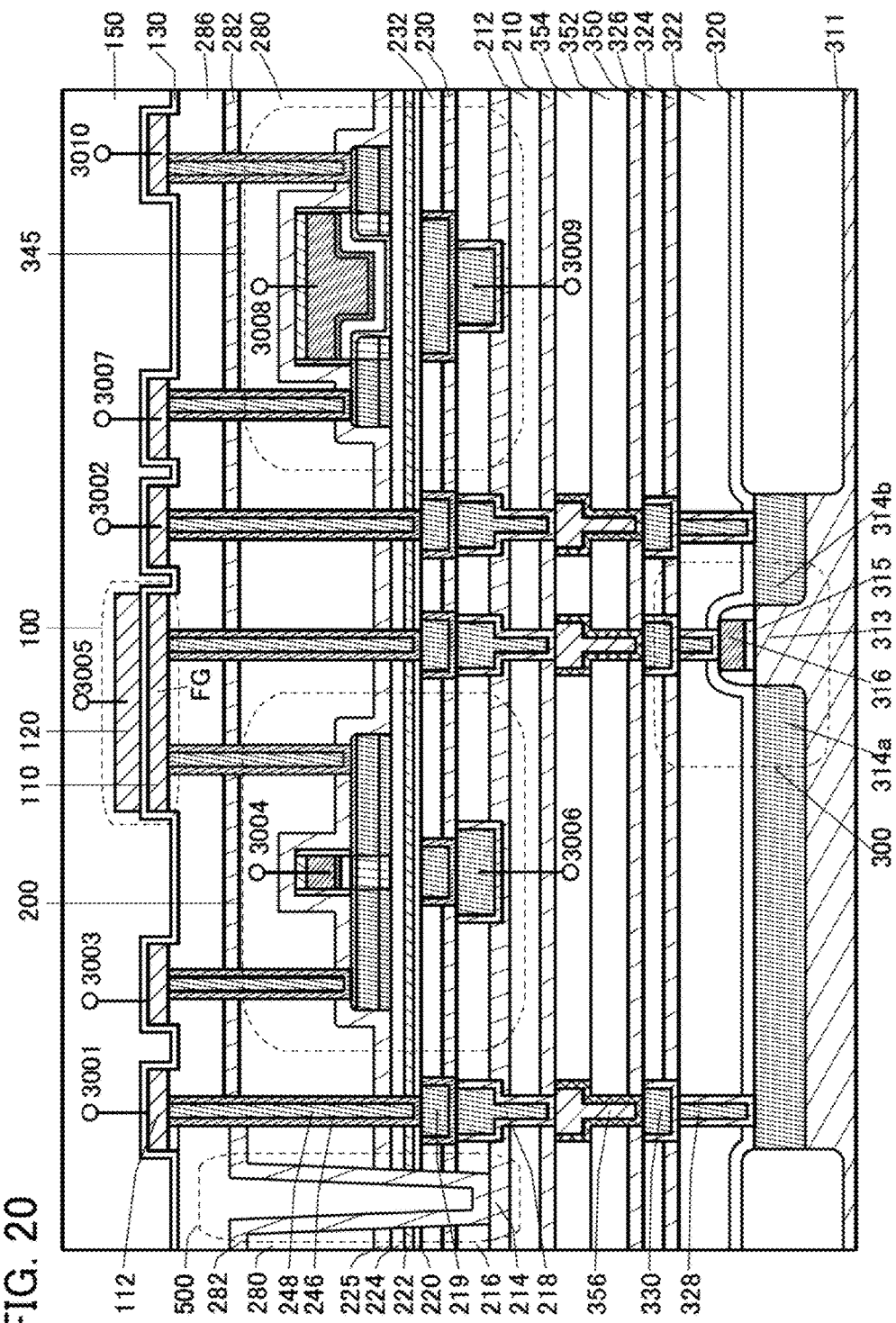
FIG. 20 is a cross-sectional view illustrating a structure of a memory device of one embodiment of the present invention.

Semiconductor devices illustrated in FIG. 19 and FIG. 20 each include a transistor 300, a transistor 200, a transistor 345, and a capacitor 100.

The transistor 200 is a transistor in which a channel is formed in a semiconductor layer containing an oxide semiconductor, and can be the transistor described in Embodiment 1. Since the transistor described in Embodiment 1 can be formed with high yield even when it is miniaturized, the transistor 200 can be miniaturized. The use of such a transistor in a memory device allows miniaturization or high integration of the memory device. Since the off-state current of the transistor described in Embodiment 1 is low, a memory device including the transistor can retain stored data for a long time. In other words, such a memory device does not require refresh operation or has an extremely low frequency of the refresh operation, which leads to a sufficient reduction in power consumption of the memory device.

In each of FIG. 19 and FIG. 20, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a first gate of the transistor 200. A wiring 3006 is electrically connected to a second gate of the transistor 200. A gate of the transistor 300 and the other of the source and the drain of the transistor 200 are electrically connected to one electrode of the capacitor 100. A wiring 3005 is electrically connected to the other electrode of the capacitor 100.

In each of FIG. 19 and FIG. 20, the wiring 3001 is electrically connected to the source of the transistor 300. The wiring 3002 is electrically connected to the drain of the transistor 300. The wiring 3003 is electrically connected to one of the source and the drain of the transistor 200. The wiring 3004 is electrically connected to a gate of the transistor 200. The wiring 3006 is electrically connected to a back gate of the transistor 200. The gate of the transistor 300 and the other of the source and the drain of the transistor 200 are electrically connected to one electrode of the capacitor 100. The wiring 3005 is electrically connected to the other electrode of the capacitor 100. A wiring 3007 is electrically connected to a source of the transistor 345, a wiring 3008 is electrically connected to a gate of the transistor 345, a wiring 3009 is electrically connected to a back gate of the transistor 345, and a wiring 3010 is electrically connected to a drain of the transistor 345. The wiring 3006, the wiring 3007, the wiring 3008, and the wiring 3009 are electrically connected to one another.

The transistor 1000, the transistor 2000, and the capacitor 1500 in FIGS. 13A and 13B described in the above embodiment correspond to the transistor 200, the transistor 345, and the capacitor 100, respectively. The wiring 1605, the wiring 1606, the wiring 1607, and the wiring 1608 in FIGS. 13A and 13B correspond to the wiring 3006, the wiring 3007, the wiring 3008, and the wiring 3009, respectively.

The semiconductor devices illustrated in FIG. 19 and FIG. 20 each have a feature that the potential of the gate of the transistor 300 can be retained and thus enable writing, retaining, and reading of data as follows.

By arranging the memory devices illustrated in FIG. 19 and FIG. 20 in a matrix, a memory cell array can be formed. Note that one transistor 345 can control back-gate voltages of the plurality of transistors 200. For this reason, the number of transistors 345 can be smaller than the number of transistors 200.

Writing and retaining of data are described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained in the node FG (retaining).

In the case where the off-state current of the transistor 200 is low, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$ at the time when a low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between $V_{th\_H}$ and $V_{th\_L}$, whereby the charge supplied to the node FG can be determined. For example, in the case where a high-level charge is supplied to the node FG in writing and the potential of the wiring 3005 is $V_0$ ($>V_{th\_H}$), the transistor 300 is turned on. Meanwhile, in the case where a low-level charge is supplied to the node FG in writing, even when the potential of the wiring 3005 is $V_0$ ($<V_{th\_L}$), the transistor 300 remains off. Thus, the data retained in the node FG can be read by determining the potential of the wiring 3002.

<Structure of Semiconductor Device 1>

The semiconductor device of one embodiment of the present invention includes the transistor 300, the transistor 200, a transistor 345, and the capacitor 100 as illustrated in FIG. 19 and FIG. 20. The transistor 200 and the transistor 345 are provided above the transistor 300, and the capacitor 100 is provided above the transistor 300, the transistor 200, and the transistor 345.

The transistor 300 is provided over a substrate 311 and includes a conductor 316, an insulator 315, a semiconductor region 313 that is a part of the substrate 311, and low-resistance regions 314a and 314b functioning as a source region and a drain region.

The transistor 300 may be a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embed-dability of the conductor, it is preferable to use a stacked layer of metal materials such as tungsten and aluminum as the conductor. In particular, tungsten is preferable in terms of heat resistance.

Note that the transistor 300 illustrated in FIG. 19 and FIG. 20 is only an example and is not limited to the structure illustrated therein; an appropriate transistor may be used in accordance with a circuit configuration or a driving method.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like into a region where the transistor 200 is formed.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 300 and the transistor 200 and between the transistor 300 and the transistor 345. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are provided in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 19 and FIG. 20, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300, the transistor 200, and the transistor 345 can be separated by a barrier layer, so that the diffusion of hydrogen from the transistor 300 to the transistor 200 and the transistor 345 can be prevented.

Note that as the conductor having a barrier property against hydrogen, tantalum nitride may be used, for example. By stacking tantalum nitride and tungsten, which has high conductivity, the diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 19 and FIG. 20, an insulator 210, an insulator 212, an insulator 214, and an insulator 216 are stacked in this order over the insulator 354. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 300 is formed, or the like to a region where the transistor 200 or the transistor 345 is formed. Therefore, the insulators 210 and 214 can be formed using a material similar to that used for forming the insulator 324.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 300 and the transistor 200 and between the transistor 300 and the transistor 345. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as water or hydrogen and moisture which cause a change in electrical characteristics of the transistor. Accordingly, the use of aluminum oxide can prevent entry of impurities such as water or hydrogen and moisture into the transistor 200 and the transistor 345 in and after a manufacturing process of the transistor. In addition, release of oxygen from the oxide in the transistor 200 and the transistor 345 can be prevented. Therefore, aluminum oxide is suitably used as a protective film for the transistor 200 and the transistor 345.

For example, the insulators 212 and 216 can be formed using a material similar to that used for forming the insulator 320. In the case where interlayer films formed of a material with a relatively low permittivity are used for the insulators, the parasitic capacitance between wirings can be reduced.

For example, a silicon oxide film, a silicon oxynitride film, or the like can be used for the insulators 212 and 216.

A conductor 218, a conductor included in the transistor 200, a conductor included in the transistor 345, and the like are provided in the insulators 210, 212, 214, and 216. Note that the conductor 218 functions as a plug or a wiring that is electrically connected to the capacitor 100 or the transistor 300. The conductor 218 can be formed using a material similar to those used for forming the conductors 328 and 330.

In particular, part of the conductor 218 which is in contact with the insulators 210 and 214 is preferably a conductor with a barrier property against oxygen, hydrogen, and water. In such a structure, the transistor 300 and the transistors 200 and 345 can be completely separated by the layer with a barrier property against oxygen, hydrogen, and water. As a result, the diffusion of hydrogen from the transistor 300 to the transistor 200 and the transistor 345 can be prevented.

The transistor 200 and the transistor 345 are provided over the insulator 216. Note that the transistor included in the semiconductor device described in the above embodiment may be used as the transistor 200 and the transistor 345. For example, the transistor 1000 can be used as the transistor 200, and the transistor 2000 can be used as the transistor 345. FIG. 19 and FIG. 20 illustrate an example in which the transistor 1000 is used as the transistor 200 and the transistor 2000 is used as the transistor 345. Note that the transistor 200 and the transistor 345 in FIG. 19 and FIG. 20 are only examples and are not limited to the structures illustrated therein, and an appropriate transistor may be used in accordance with a circuit configuration or a driving method.

An insulator 230 and an insulator 232 are stacked in this order over the insulator 216 and the conductor 218. A material having a barrier property against oxygen or hydrogen is preferably used for at least one of the insulator 230 and the insulator 232.

The insulators 230 and 232 are preferably formed using, for example, a film having a barrier property that prevents hydrogen and impurities from diffusing from the substrate 311, a region where the transistor 300 is formed, or the like to a region where the transistor 200 or the transistor 345 is formed. Therefore, the insulators 230 and 232 can be formed using a material similar to that used for forming the insulator 324.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 300 and the transistor 200 and between the transistor 300 and the transistor 345. Specifically, the film that prevents hydrogen diffusion is a film from which hydrogen is less likely to be released.

A conductor 219 is embedded in the insulator 230 and the insulator 232. Note that the conductor 219 serves as a plug that is electrically connected to a back gate electrode of the transistor 200 and a back gate electrode of the transistor 345, a plug that is electrically connected to the capacitor 100 or the transistor 300, or a wiring. The conductor 219 can be formed with a material similar to that of the conductor 328 and the conductor 330.

The insulator 230 and the insulator 232 are provided between the back gate electrodes of the transistor 200 and the transistor 345 and the top gate electrodes of the transistor 200 and the transistor 345, whereby parasitic capacitance between the back gate electrode and the top gate electrode of the transistor 200 and parasitic capacitance between the back gate electrode and the top gate electrode of the transistor 345 can be reduced.

The insulator 280 is provided over the transistor 200 and the transistor 345. In the insulator 280, an excess-oxygen region is preferably formed. In particular, in the case of using an oxide semiconductor in the transistor 200 and the transistor 345, when an insulator including an excess-oxygen region is provided in an interlayer film or the like in the vicinity of the transistor 200 and the transistor 345, oxygen vacancies in the oxide included in the transistor 200 and the transistor 345 are reduced, whereby the reliability can be improved. The insulator 280 that covers the transistor 200 and the transistor 345 may function as a planarization film that covers a roughness thereunder.

As the insulator including the excess-oxygen region, specifically, an oxide that releases part of oxygen by heating is preferably used. The oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 282 is provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as water and hydrogen which cause a change in electrical characteristics of the transistor. Accordingly, the use of aluminum oxide can prevent entry of impurities such as water and hydrogen into the transistor 200 and the transistor 345 in and after a manufacturing process of the transistor. In addition, release of oxygen from the oxide in the transistor 200 and the transistor 345 can be prevented. Therefore, aluminum oxide is suitably used as a protective film for the transistor 200 and the transistor 345.

Note that in the case where the transistor 1000 is provided as the transistor 200 and the transistor 2000 is provided as the transistor 345, the insulator 214 corresponds to the insulator 432, the conductor 218 corresponds to the conductor 440, the insulator 216 corresponds to the insulator 430, the insulator 230 corresponds to the insulator 401, the insulator 232 corresponds to the insulator 301, an insulator 220 corresponds to the insulator 302, an insulator 222 corresponds to the insulator 303, an insulator 224 corresponds to the insulator 402, an insulator 225 corresponds to the insulator 409, and the insulator 280 corresponds to the insulator 415. Therefore, description of the corresponding structures described in the above embodiment can be referred to.

The insulator 286 is provided over the insulator 282. The insulator 286 can be formed using a material similar to that of the insulator 320. In the case where a material with a relatively low permittivity is used for an interlayer film, the parasitic capacitance between wirings can be reduced. For example, a silicon oxide film, a silicon oxynitride film, or the like can be used for the insulator 286.

The conductors 246, the conductors 248, and the like are provided in the insulators 220, 222, 224, 280, 282, and 286.

The conductors 246 and 248 function as plugs or wirings that are electrically connected to the capacitor 100, the transistor 200, the transistor 345, or the transistor 300. The conductors 246 and 248 can be formed using a material similar to those used for forming the conductors 328 and 330.

The capacitor 100 is provided above the transistor 200 and the transistor 345. The capacitor 100 includes a conductor 110, a conductor 120, and an insulator 130.

A conductor 112 may be provided over the conductors 246 and 248. Note that the conductor 112 functions as a plug or a wiring that is electrically connected to the capacitor 100, the transistor 200, the transistor 345, or the transistor 300. The conductor 110 functions as the one electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 19 and FIG. 20; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may function as a planarization film that covers a roughness thereunder.

Description is made on a dicing line (also referred to as a scribe line, a dividing line, or a cutting line) that is provided when a large-sized substrate is divided into semiconductor elements so that a plurality of semiconductor devices are each formed in a chip form. In an example of a dividing method, for example, a groove (dicing line) for separating the semiconductor elements is formed on the substrate, and then the substrate is cut along the dicing line so that a plurality of semiconductor devices that are separated are obtained. For example, FIG. 19 and FIG. 20 are cross-sectional views of a structure 500 around the dicing line.

As in the structure 500, for example, openings are provided in the insulators 280, 225, 224, 222, 220, 232, 230, and 216 around a region overlapping with the dicing line formed in an end portion of the memory cell including the transistor 200 or the transistor 345. Furthermore, the insulator 282 is provided to cover the side surfaces of the insulator 280, the insulator 225, the insulator 224, the insulator 222, the insulator 220, the insulator 232, the insulator 230, and the insulator 216.

Thus, in the openings, the insulator 214 is in contact with the insulator 282. At that time, the insulator 214 is formed using the same material and method as those used for forming the insulator 282, whereby the adhesion therebetween can be improved. Aluminum oxide can be used, for example.

With such a structure, the insulator 280, the transistor 200, and the transistor 345 can be enclosed with the insulator 214 and the insulator 282. Since the insulators 210, 222, and 282 have functions of preventing the diffusion of oxygen, hydrogen, and water, even when the substrate is divided into circuit regions each of which is provided with the semiconductor elements in this embodiment to form a plurality of chips, the entry and diffusion of impurities such as water or hydrogen from the direction of a side surface of the divided substrate to the transistor 200 or the transistor 345 can be prevented.

Furthermore, in the structure, excess oxygen in the insulator 280 can be prevented from diffusing to the outside of the insulators 282 and 222. Accordingly, excess oxygen in the insulator 280 is efficiently supplied to the oxide where the channel is formed in the transistor 200 or the transistor 345. The oxygen can reduce oxygen vacancies in the oxide where the channel is formed in the transistor 200 or the transistor 345. Thus, the oxide where the channel is formed in the transistor 200 or the transistor 345 can be an oxide semiconductor with a low density of defect states and stable characteristics. That is, a change in electrical characteristics of the transistor 200 or the transistor 345 can be prevented and the reliability can be improved.

The above is the description of the structural example. With the use of the structure, a change in electrical characteristics can be prevented and reliability can be improved in a semiconductor device including a transistor including an oxide semiconductor. The power consumption of a semiconductor device including a transistor including an oxide semiconductor can be reduced. Miniaturization or high integration of a semiconductor device including a transistor including an oxide semiconductor can be achieved. A miniaturized or highly integrated semiconductor device can be provided with high productivity.

<Structure of Memory Cell Array>

Figure 21:
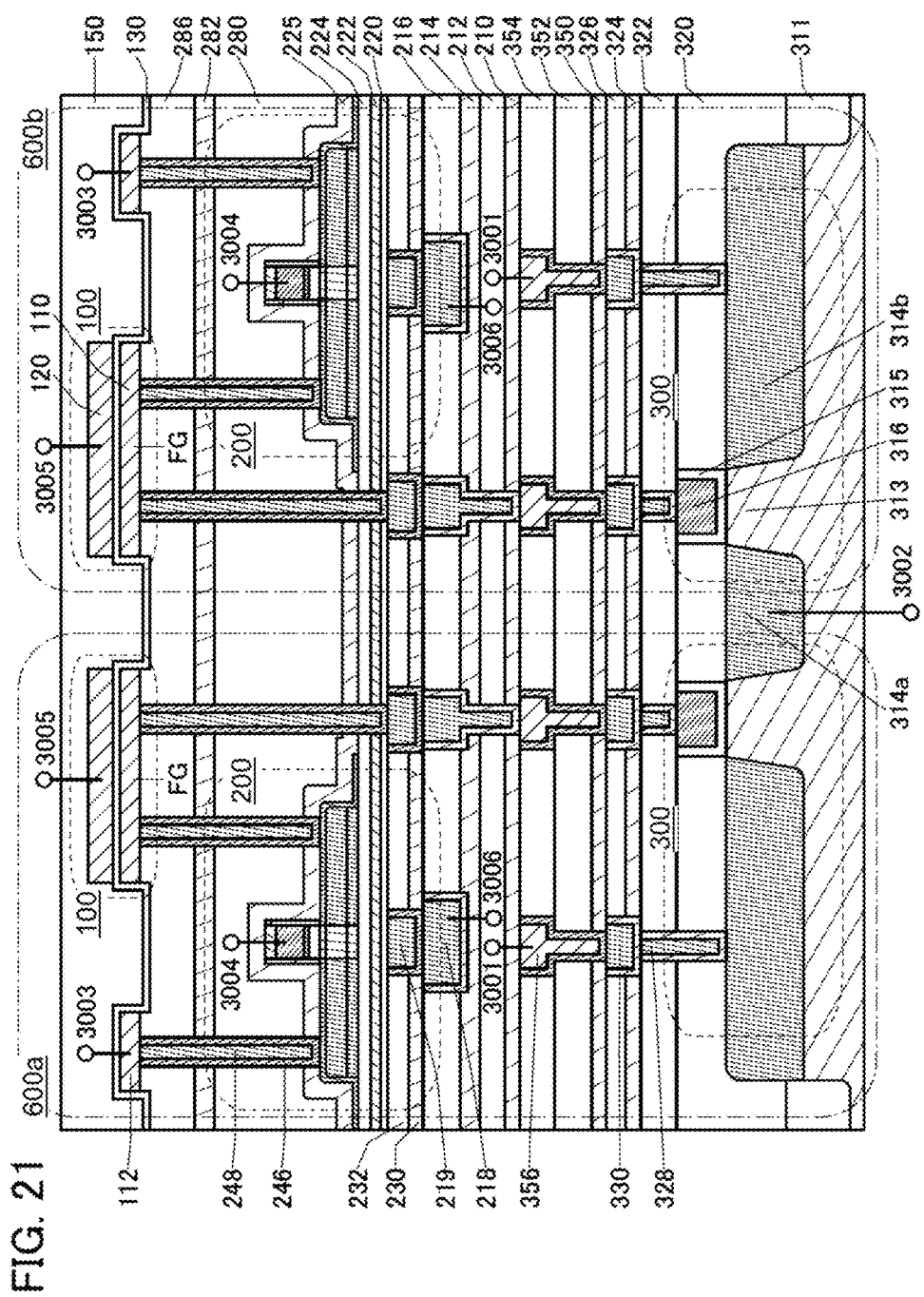
FIG. 21 is a cross-sectional view illustrating a structure of a memory device of one embodiment of the present invention.
Figure 22:
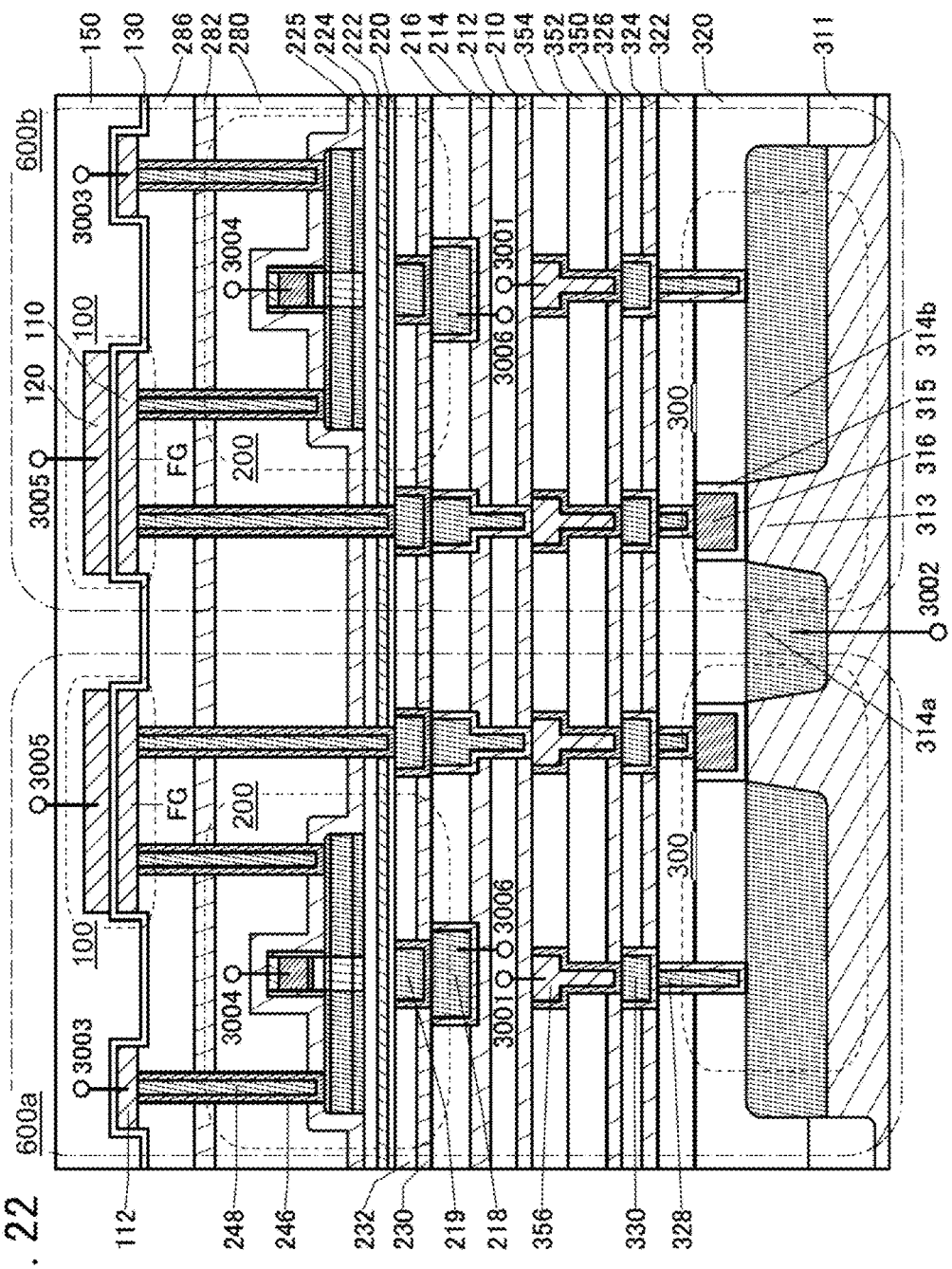
FIG. 22 is a cross-sectional view illustrating a structure of a memory device of one embodiment of the present invention.

Next, FIG. 21 and FIG. 22 illustrate an example of a memory cell array of this embodiment. When the memory devices each of which is illustrated in FIG. 19 or FIG. 20 are arranged as memory cells in a matrix, a memory cell array can be formed. Note that in FIG. 21 and FIG. 22, the transistor 345 illustrated in FIG. 19 and FIG. 20 is omitted. FIG. 21 and FIG. 22 are cross-sectional views that illustrate part of a row in which the memory devices each of which is illustrated in FIG. 19 and FIG. 20 are arranged in a matrix.

The structure of the transistor 300 in FIG. 21 and FIG. 22 is different from that of the transistor 300 in FIG. 19 and FIG. 20. In the transistor 300 illustrated in FIG. 21 and FIG. 22, the semiconductor region 313 (part of the substrate 311) in which a channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

In the memory device illustrated in FIG. 21 and FIG. 22, a memory cell 600a and a memory cell 600b are arranged adjacent to each other. The transistors 300 and 200 and the capacitor 100 are included and electrically connected to the wirings 3001, 3002, 3003, 3004, 3005, and 3006 in each of the memory cells 600a and 600b. Also in the memory cells 600a and 600b, a node where a gate of the transistor 300 and one electrode of the capacitor 100 are electrically connected to each other is referred to as the node FG. Note that the wiring 3002 is shared by the memory cells 600a and 600b adjacent to each other.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$, is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$, is supplied to the wiring 3005 connected to the memory cells from which data is not read.

With the use of the structure, a change in electrical characteristics can be prevented and reliability can be improved in a semiconductor device including a transistor including an oxide semiconductor. The power consumption of a semiconductor device including a transistor including an oxide semiconductor can be reduced. Miniaturization or high integration of a semiconductor device including a transistor including an oxide semiconductor can be achieved. A miniaturized or highly integrated semiconductor device can be provided with high productivity.

The structures, the methods, and the like described in this embodiment can be combined as appropriate with any of the structures, the methods, and the like described in the other embodiments.

Embodiment 3

In this embodiment, a frame memory including a semiconductor device of one embodiment of the present invention, which can be used in a display controller IC, a source driver IC, or the like, is described.

Figure 23:
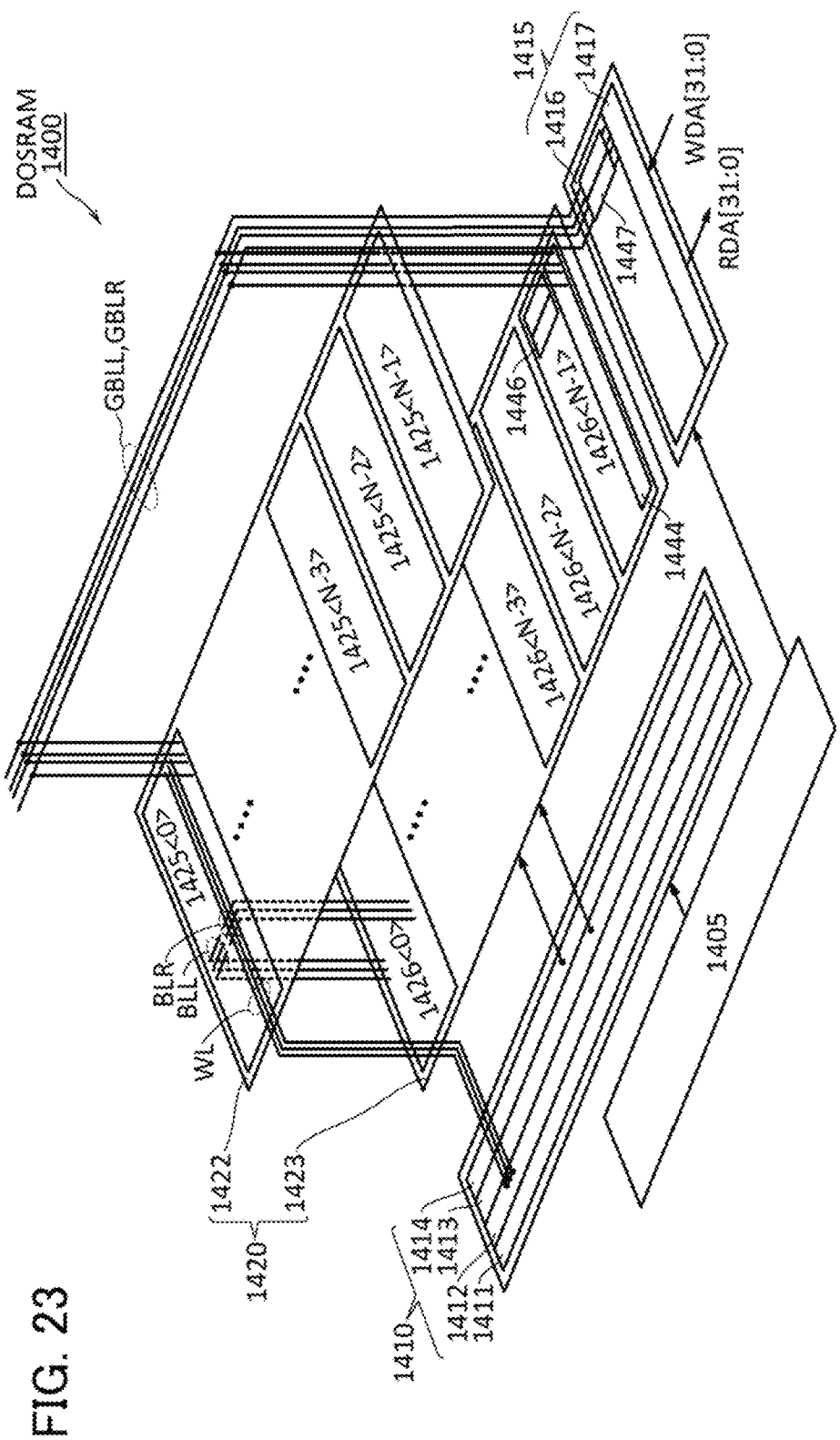
FIG. 23 is a block diagram illustrating a structural example of a memory device of one embodiment of the present invention.

A dynamic random access memory (DRAM) including memory cells of 1T1C (one transistor, one capacitor) type can be used as the frame memory, for example. A memory device in which OS transistors are used in memory cells (hereinafter referred to as an OS memory) can also be used. Here, a RAM including memory cells of 1T1C type is described as an example of the OS memory. Such a RAM is herein referred to as a dynamic oxide semiconductor RAM (DOSRAM). FIG. 23 illustrates a configuration example of a DOSRAM.

<<DOSRAM 1400>>

The DOSRAM 1400 includes a controller 1405, a row circuit 1410, a column circuit 1415, and a memory cell and sense amplifier array 1420 (hereinafter referred to as MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

Figure 24A:
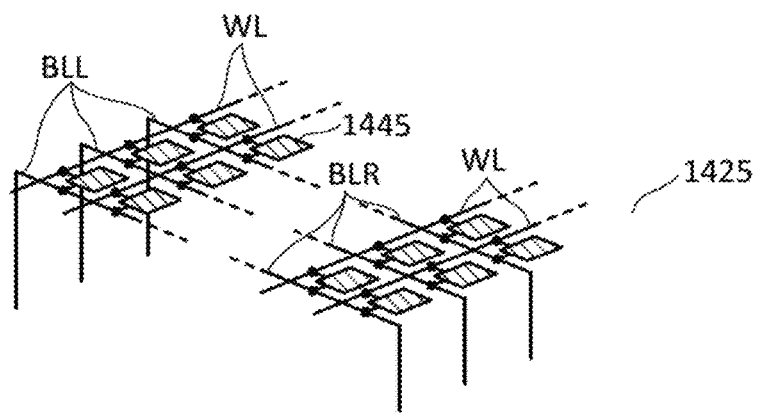
FIGS. 24A and 24B are a block diagram and a circuit diagram illustrating a structural example of a memory device of one embodiment of the present invention.

The memory cell array 1422 includes N local memory cell arrays 1425<0> to 1425<N−1>, where N is an integer greater than or equal to 2. FIG. 24A illustrates a configuration example of the local memory cell array 1425. The local memory cell array 1425 includes a plurality of memory cells 1445, a plurality of word lines WL, and a plurality of bit lines BLL and BLR. In the example in FIG. 24A, the local memory cell array 1425 has an open bit-line architecture but may have a folded bit-line architecture.

Figure 24B:
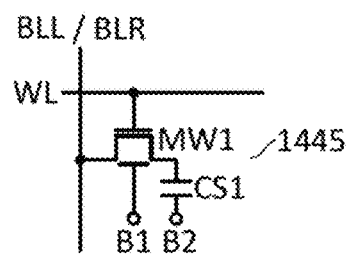

FIG. 24B illustrates a circuit configuration example of the memory cell 1445. The memory cell 1445 includes a transistor MW1, a capacitor CS1, and terminals B1 and B2. The transistor MW1 has a function of controlling the charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to the terminal B2. A constant voltage (e.g., low power supply voltage) is input to the terminal B2.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the source, or the drain of the transistor MW1. Alternatively, the transistor MW1 does not necessarily include the back gate.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, a bit line BLL and a bit line BLR form one bit line pair. A global bit line GBLL and a global bit line GBLR form one global bit line pair. In the description hereinafter, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The control signal from the sense amplifier driver circuit 1414 drives each of the plurality of local sense amplifier arrays 1426 independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference between the global bit line pair (GBLL, GBLR), and a function of retaining the voltage difference. Data are written to and read from the global bit line pair (GBLL, GBLR) by the input/output circuit 1417.

A write operation of the DOSRAM 1400 is briefly described. Data are written to the global bit line pair by the input/output circuit 1417. The data of the global bit line pair are retained by the global sense amplifier array 1416. By the switch array 1444 of the local sense amplifier array 1426 specified by the address signal, the data of the global bit line pair are written to the bit line pair of the column where data are to be written. The local sense amplifier array 1426 amplifies the written data, and then retains the amplified data. In the specified local memory cell array 1425, the word line WL of the row where data are to be written is selected by the row circuit 1410, and the data retained at the local sense amplifier array 1426 are written to the memory cell 1445 of the selected row.

A read operation of the DOSRAM 1400 is briefly described. One row of the local memory cell array 1425 is specified with the address signal. In the specified local memory cell array 1425, the word line WL of the row where data are to be read is selected, and data of the memory cell 1445 are written to the bit line. The local sense amplifier array 1426 detects a voltage difference between the bit line pair of each column as data, and retains the data. The switch array 1444 writes the data of a column specified by the address signal to the global bit line pair; the data are chosen from the data retained at the local sense amplifier array 1426. The global sense amplifier array 1416 detects and retains the data of the global bit line pair. The data retained at the global sense amplifier array 1416 are output to the input/output circuit 1417. Thus, the read operation is completed.

The DOSRAM 1400 has no limitations on the number of rewrites in principle and data can be read and written with low energy consumption, because data are rewritten by charging and discharging the capacitor CS1. Simple circuit configuration of the memory cell 1445 allows a high memory capacity.

The transistor MW1 is an OS transistor. The extremely low off-state current of the OS transistor can inhibit leakage of charge from the capacitor CS1. Therefore, the retention time of the DOSRAM 1400 is considerably longer than that of DRAM. This allows less frequent refresh, which can reduce power needed for refresh operations. For this reason, the DOSRAM 1400 used as the frame memory can reduce the power consumption of the display controller IC and the source driver IC.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in the energy consumption of the display controller IC and the source driver IC.

The structure described in this embodiment can be used in appropriate combination with any of the structures described in the other embodiments.

Embodiment 4

In this embodiment, a field-programmable gate array (FPGA) is described as an example of a semiconductor device in which a transistor of one embodiment of the present invention whose semiconductor includes an oxide (OS transistor) is used. In an FPGA of this embodiment, an OS memory is used for a configuration memory and a register. Here, such an FPGA is referred to as an "OS-FPGA".

The OS memory is a memory including at least a capacitor and an OS transistor that controls charge and discharge of the capacitor. The OS memory has excellent retention characteristics because the OS transistor has an extremely low off-state current and thus can function as a nonvolatile memory.

Figure 25A:
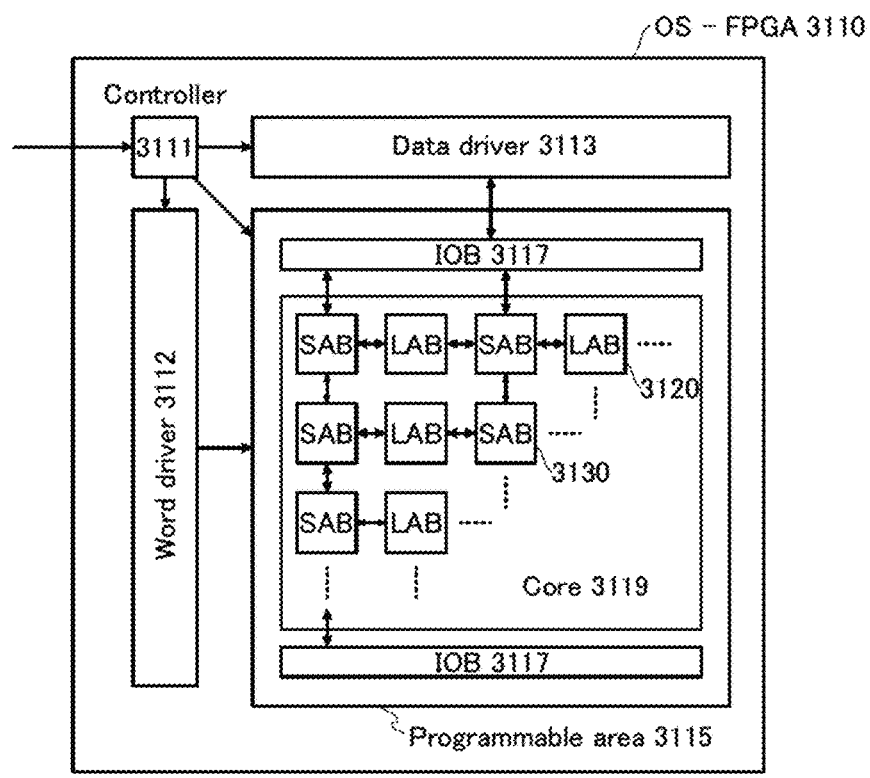
FIGS. 25A to 25C are block diagrams illustrating a structural example of a semiconductor device of one embodiment of the present invention.

FIG. 25A illustrates a configuration example of an OS-FPGA. An OS-FPGA 3110 illustrated in FIG. 25A is capable of normally-off computing for context switching by a multi-context configuration and fine-grained power gating in each PLE. The OS-FPGA 3110 includes a controller 3111, a word driver 3112, a data driver 3113, and a programmable area 3115.

Figures 25B, 25C:
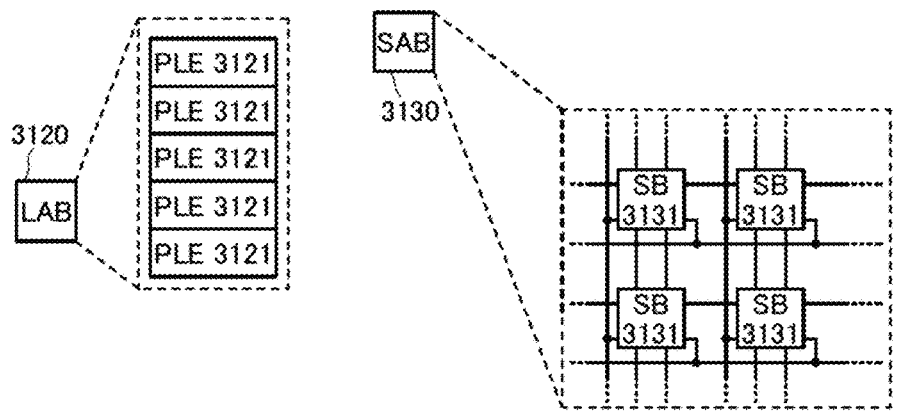

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 25B illustrates an example in which the LAB 3120 includes five PLEs 3121. As illustrated in FIG. 25C, the SAB 3130 includes a plurality of switch blocks (SBs) 3131 arranged in array. The LAB 3120 is connected to the LABs 3120 in four directions (on the left, right, top, and bottom sides) through its input terminals and the SABs 3130.

Figure 26A:
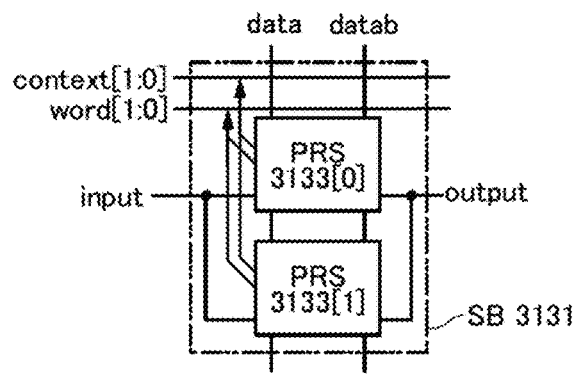
FIGS. 26A and 26B are a block diagram and a circuit diagram illustrating a structural example of a semiconductor device of one embodiment of the present invention and FIG. 26C is a timing chart showing an operation example of the semiconductor device.

The SB 3131 is described with reference to FIGS. 26A to 26C. To the SB 3131 in FIG. 26A, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word [1:0] are word line selection signals, and wirings to which the signals word[1:0] are input are each a word line.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 26B:
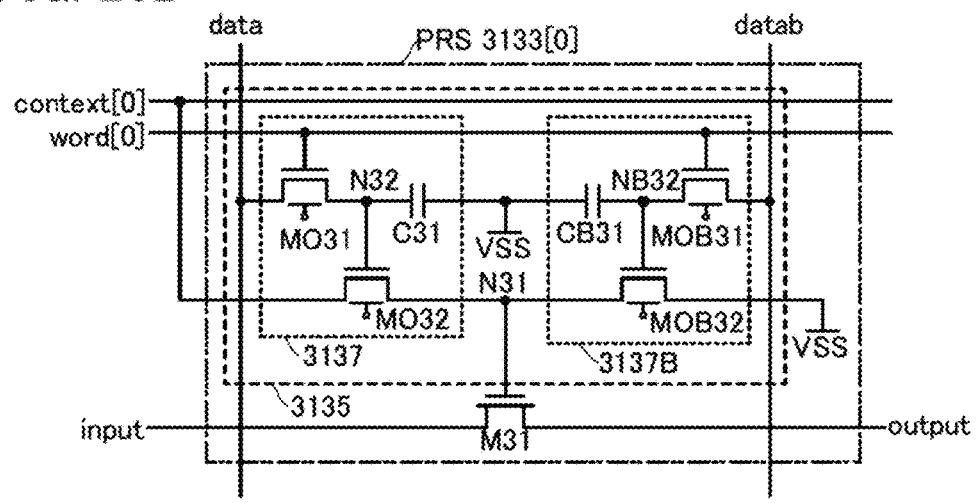
Figure 26C:
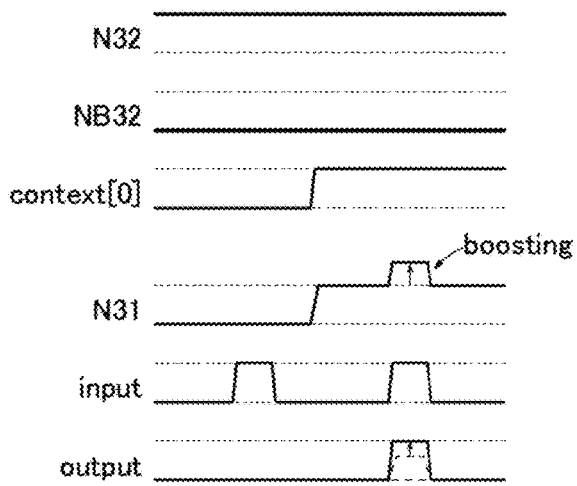

FIG. 26B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal which are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

The OS transistors MO31, MO32, MOB31, and MOB32 each include a back gate, and these back gates are electrically connected to power supply lines that each supply a fixed voltage.

A gate of the Si transistor M31, a gate of the OS transistor MO32, and a gate of the OS transistor MOB32 correspond to a node N31, a node N32, and a node NB32, respectively. The node 32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

A logic of data that the memory circuit 3137 retains and a logic of data that the memory circuit 3137B retains are complementary to each other. Thus, either the OS transistor MO32 or the OS transistor MOB32 is turned on.

The operation example of the PRS 3133[0] is described with reference to FIG. 26C. In the PRS 3133[0], in which configuration data has already been written, the node N32 of the PRS 3133[0] is at "H", whereas the node NB32 is at "L".

The PRS 3133[0] is inactivated while the signal context [0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is activated while the signal context[0] is at "H". When the signal context[0] is transferred to "H", the gate of the Si transistor M31 is transferred to "H" by the configuration data stored in the CM 3135.

While the PRS 3133[0] is active, when the potential of the input terminal is changed to "H", the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 27:
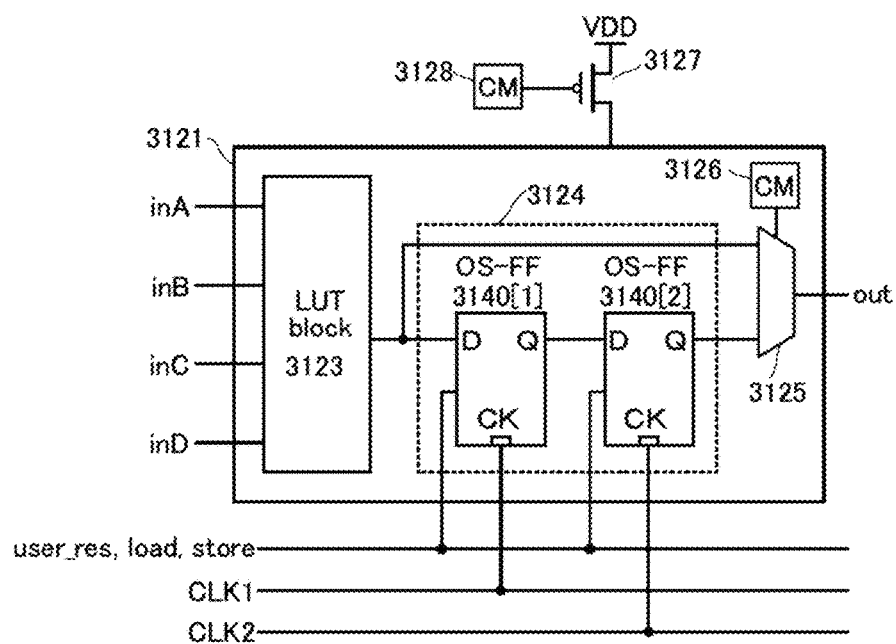
FIG. 27 is a block diagram illustrating a structural example of a semiconductor device of one embodiment of the present invention.

FIG. 27 illustrates a configuration example of the PLE 3121. The PLE 3121 includes a lookup table (LUT) block 3123, a register block 3124, a selector 3125, and a CM 3126. The LUT block 3123 is configured to select and output data in the LUT block in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with configuration data stored in a CM 3128. Fine-grained power gating can be performed by providing the power switch 3127 for each PLE 3121. The PLE 3121 which is not used after context switching can be power gated owing to the fine-grained power gating function; thus, standby power can be effectively reduced.

The register block 3124 is formed by nonvolatile registers to achieve normally-off computing. The nonvolatile registers in the PLE 3121 are each a flip-flop provided with an OS memory (hereinafter referred to as OS-FF).

Figure 28A:
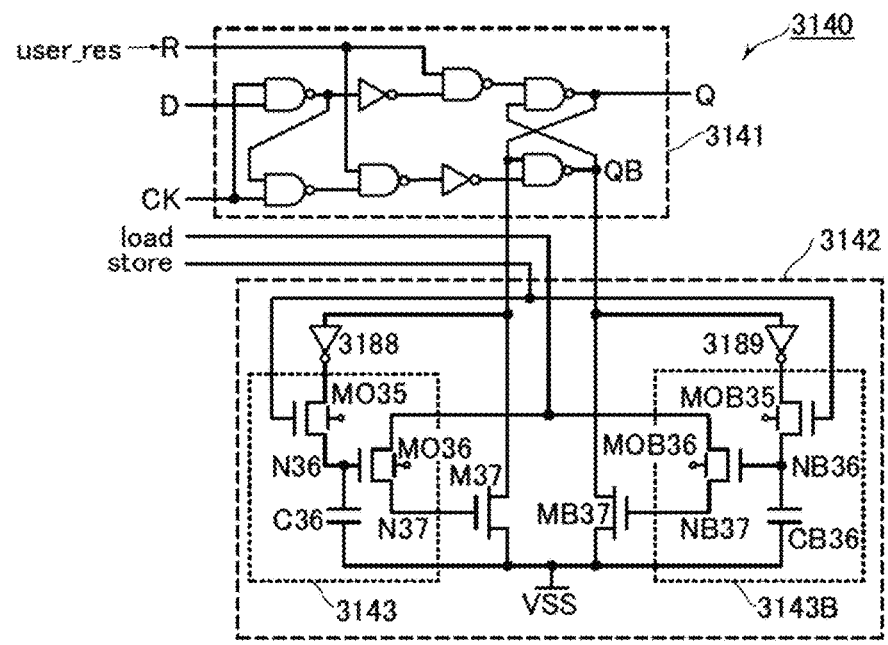
FIG. 28A is a circuit diagram illustrating a structural example of a semiconductor device of one embodiment of the present invention and FIG. 28B is a timing chart showing an operation example of the semiconductor device.

The register block 3124 includes an OS-FF 3140[1] and an OS-FF 3140[2]. A signal user_res, a signal load, and a signal store are input to the OS-FF 3140[1] and the OS-FF 3140[2]. A clock signal CLK1 is input to the OS-FF 3140[1] and a clock signal CLK2 is input to the OS-FF 3140[2]. FIG. 28A illustrates a configuration example of the OS-FF 3140.

The OS-FF 3140 includes a FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 can function as a backup circuit of the FF 3141. The shadow register 3142 backs up data of the node Q and data of the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

The OS transistors MO35, MO36, MOB35, and MOB36 each include a back gate, and these back gates are electrically connected to power supply lines that each supply a fixed voltage.

Figure 28B:
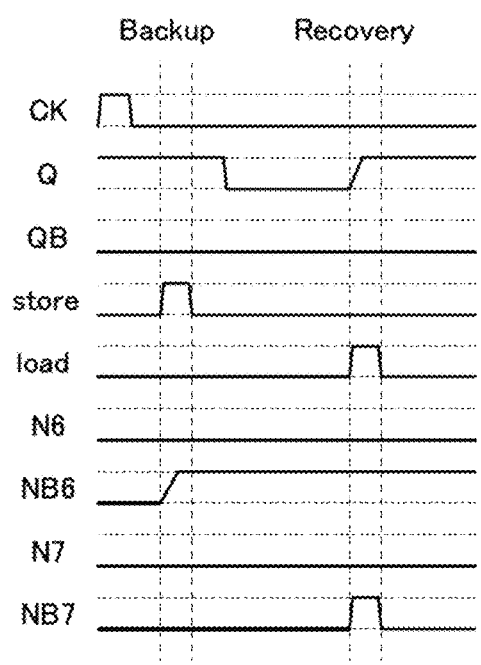

An example of an operation method of the OS-FF 3140 will be described with reference to FIG. 28B.

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the node Q and the data of the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

A possible error in a memory circuit is a soft error due to the entry of radiation. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory including an OS transistor has a high soft-error tolerance. Therefore, the OS-FPGA 3110 including an OS memory can have high reliability.

The structure described in this embodiment can be used in appropriate combination with any of the structures described in the other embodiments.

Embodiment 5

In this embodiment, an example of a CPU including the semiconductor device of one embodiment of the present invention, such as the above-described memory device, is described.

<Configuration of CPU>

Figure 29:
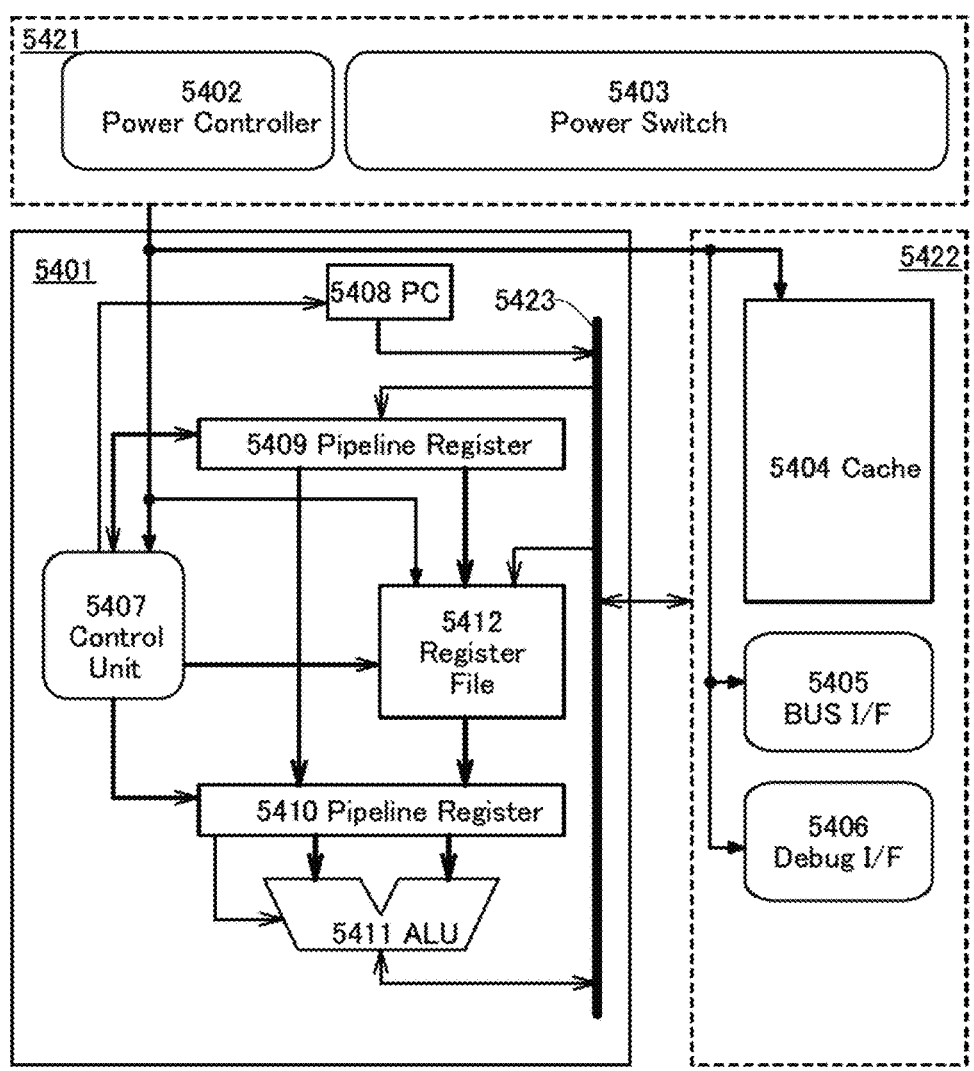
FIG. 29 is a block diagram illustrating a semiconductor device of one embodiment of the present invention.

A semiconductor device 5400 shown in FIG. 29 includes a CPU core 5401, a power management unit 5421, and a peripheral circuit 5422. The power management unit 5421 includes a power controller 5402 and a power switch 5403. The peripheral circuit 5422 includes a cache 5404 including cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of decoding and executing instructions contained in a program such as inputted applications by controlling the overall operations of the PC 5408, the pipeline registers 5409 and 5410, the ALU 5411, the register file 5412, the cache 5404, the bus interface 5405, the debug interface 5406, and the power controller 5402.

The ALU 5411 has a function of performing a variety of arithmetic operations such as four arithmetic operations and logic operations.

The cache 5404 has a function of temporarily storing frequently used data. The PC 5408 is a register having a function of storing an address of an instruction to be executed next. Note that although not shown in FIG. 29, the cache 5404 is provided with a cache controller for controlling the operation of the cache memory.

The pipeline register 5409 has a function of temporarily storing instruction data.

The register file 5412 includes a plurality of registers including a general purpose register and can store data that is read from the main memory, data obtained as a result of arithmetic operations in the ALU 5411, or the like.

The pipeline register 5410 has a function of temporarily storing data used for arithmetic operations of the ALU 5411, data obtained as a result of arithmetic operations of the ALU 5411, or the like.

The bus interface 5405 has a function of a path for data between the semiconductor device 5400 and various devices outside the semiconductor device 5400. The debug interface 5406 has a function of a path of a signal for inputting an instruction to control debugging to the semiconductor device 5400.

The power switch 5403 has a function of controlling supply of a power supply voltage to various circuits included in the semiconductor device 5400 other than the power controller 5402. The above various circuits belong to several different power domains. The power switch 5403 controls whether the power supply voltage is supplied to the various circuits in the same power domain. In addition, the power controller 5402 has a function of controlling the operation of the power switch 5403.

The semiconductor device 5400 having the above structure is capable of performing power gating. A description will be given of an example of the power gating operation sequence.

First, by the CPU core 5401, timing for stopping the supply of the power supply voltage is set in a register of the power controller 5402. Then, an instruction of starting power gating is sent from the CPU core 5401 to the power controller 5402. Then, various registers and the cache 5404 included in the semiconductor device 5400 start data saving. Then, the power switch 5403 stops the supply of a power supply voltage to the various circuits other than the power controller 5402 included in the semiconductor device 5400. Then, an interrupt signal is input to the power controller 5402, whereby the supply of the power supply voltage to the various circuits included in the semiconductor device 5400 is started. Note that a counter may be provided in the power controller 5402 to be used to determine the timing of starting the supply of the power supply voltage regardless of input of an interrupt signal. Next, the various registers and the cache 5404 start data restoration. Then, execution of an instruction is resumed in the control unit 5407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data held by the CPU core 5401 or the peripheral circuit 5422 is preferably saved in a short time. In that case, the power can be turned on or off in a short time, and an effect of saving power becomes significant.

In order that the data held by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

An example of the flip-flop circuit capable of backup operation is described with reference to FIG. 30.

Figure 30:
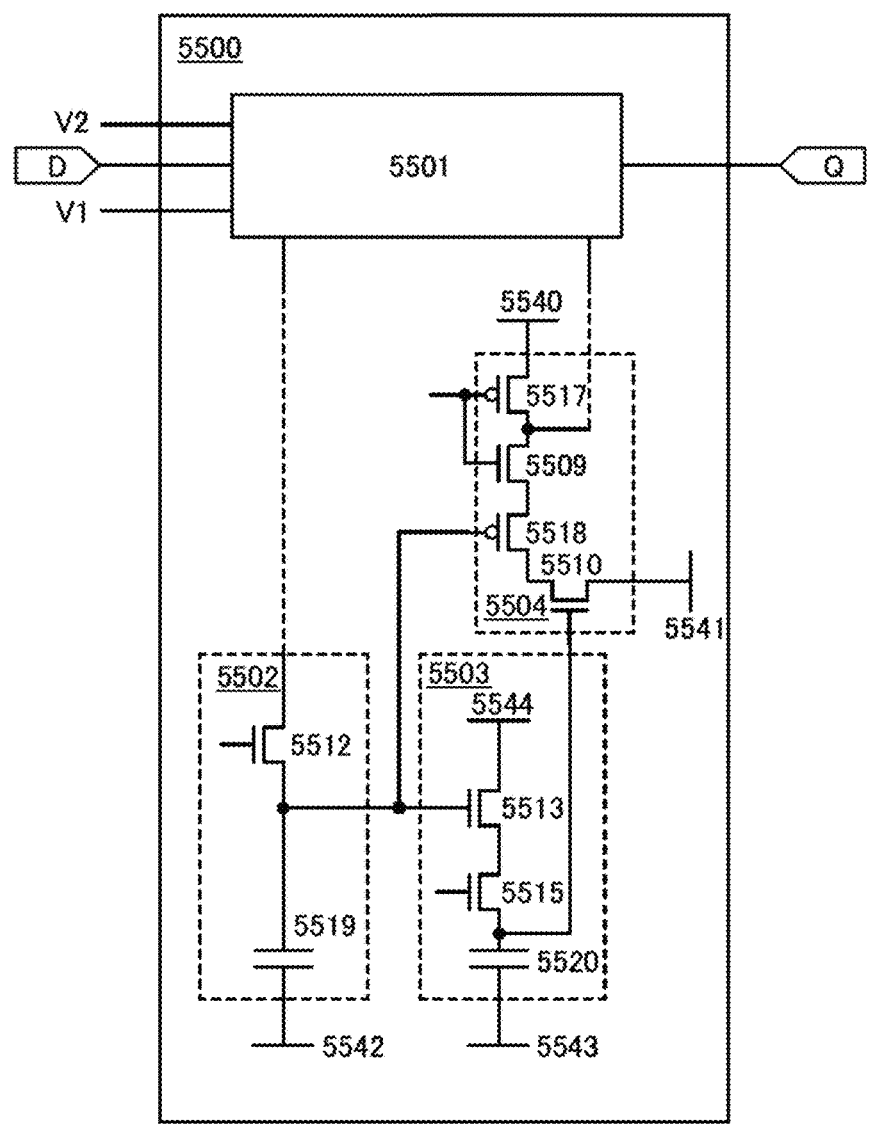
FIG. 30 is a circuit diagram illustrating a semiconductor device of one embodiment of the present invention.

A semiconductor device 5500 shown in FIG. 30 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is supplied to the semiconductor device 5500. One of the potential V1 and the potential V2 is at a high level, and the other is at a low level. An example of the structure of the semiconductor device 5500 when the potential V1 is at a low level and the potential V2 is at a high level will be described below.

The first memory circuit 5501 has a function of retaining data when a signal D including the data is input in a period during which the power supply voltage is supplied to the semiconductor device 5500. Furthermore, the first memory circuit 5501 outputs a signal Q including the retained data in the period during which the power supply voltage is supplied to the semiconductor device 5500. On the other hand, the first memory circuit 5501 cannot retain data in a period during which the power supply voltage is not supplied to the semiconductor device 5500. That is, the first memory circuit 5501 can be referred to as a volatile memory circuit.

The second memory circuit 5502 has a function of reading the data held in the first memory circuit 5501 to store (or save) it. The third memory circuit 5503 has a function of reading the data held in the second memory circuit 5502 to store (or save) it. The read circuit 5504 has a function of reading the data held in the second memory circuit 5502 or the third memory circuit 5503 to store (or restore) it in the first memory circuit 5501.

In particular, the third memory circuit 5503 has a function of reading the data held in the second memory circuit 5502 to store (or save) it even in the period during which the power supply voltage is not supplied to the semiconductor device 5500.

As shown in FIG. 30, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data held in the first memory circuit 5501. The transistor 5512 is desirably capable of charging and discharging the capacitor 5519 at a high speed in accordance with data held in the first memory circuit 5501. Specifically, the transistor 5512 desirably contains crystalline silicon (preferably polycrystalline silicon, further preferably single crystal silicon) in a channel formation region.

The conduction state or the non-conduction state of the transistor 5513 is determined in accordance with the charge held in the capacitor 5519. The transistor 5515 has a function of charging and discharging the capacitor 5520 in accordance with the potential of a wiring 5544 when the transistor 5513 is in a conduction state. It is desirable that the off-state current of the transistor 5515 be extremely low. Specifically, the transistor 5515 desirably contains an oxide semiconductor (preferably an oxide containing In, Ga, and Zn) in a channel formation region.

Specific connection relations between the elements will be described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543. One of a source and a drain of the transistor 5510 is connected to a wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Although a gate of the transistor 5509 is connected to a gate of the transistor 5517 in FIG. 30, it is not necessarily connected to the gate of the transistor 5517.

The transistor described in the above embodiment as an example can be applied to the transistor 5515. Because of the low off-state current of the transistor 5515, the semiconductor device 5500 can retain data for a long time without power supply. The favorable switching characteristics of the transistor 5515 allow the semiconductor device 5500 to perform high-speed backup and recovery.

The structure described in this embodiment can be used in appropriate combination with any of the structures described in the other embodiments.

Embodiment 6

In this embodiment, one mode of a semiconductor device of one embodiment of the present invention will be described with reference to FIGS. 31A and 31B and FIGS. 32A and 32B.

<Semiconductor Wafer and Chip>

Figure 31A:
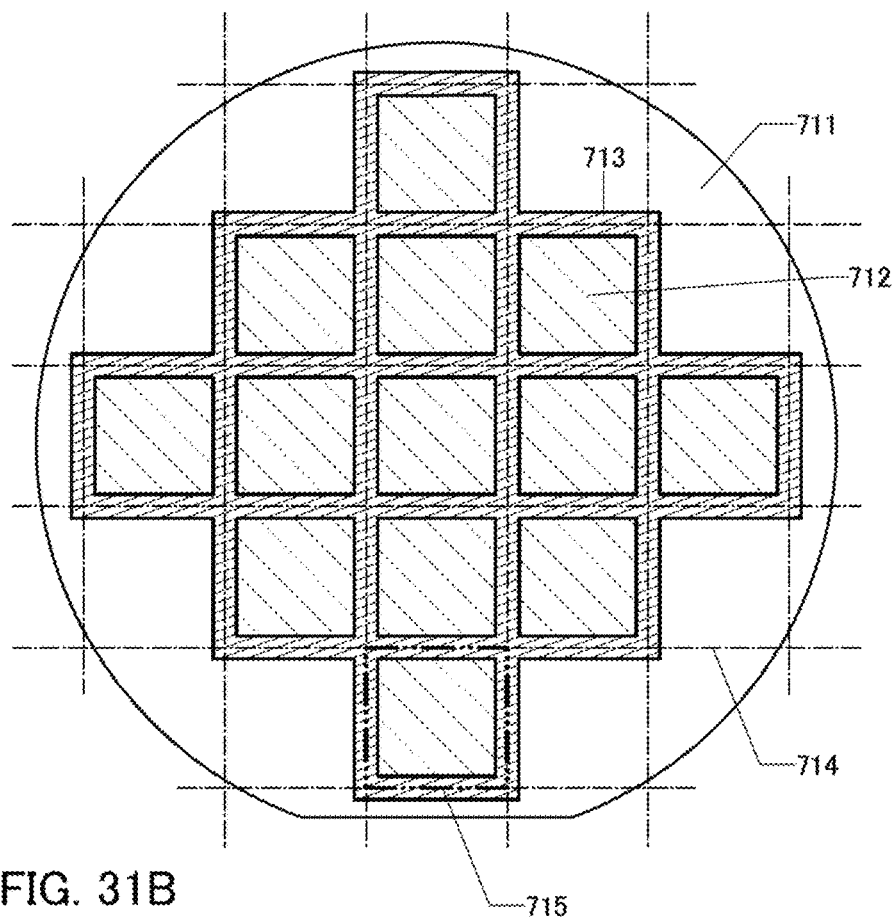
FIGS. 31A and 31B are top views illustrating a semiconductor wafer of one embodiment of the present invention.

FIG. 31A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention or the like can be provided in the circuit region 712.

Figure 31B:
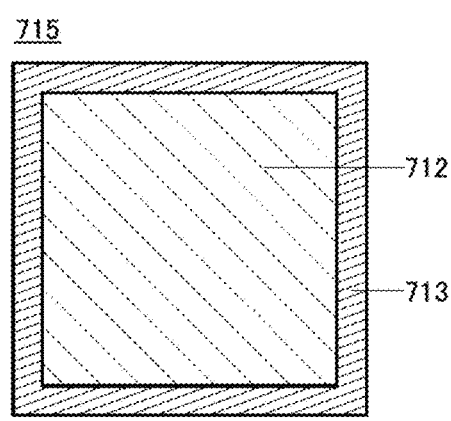

Each of the circuit regions 712 is surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 31B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down the substrate, remove swarf, and prevent electrification, for example. Providing a conductive layer, a semiconductor layer, or the like in the separation regions 713 allows a reduction in the usage of the pure water. Thus, the cost of manufacturing semiconductor devices can be reduced. In addition, semiconductor devices can be manufactured with improved productivity.

<Electronic Component>

Figure 32A:
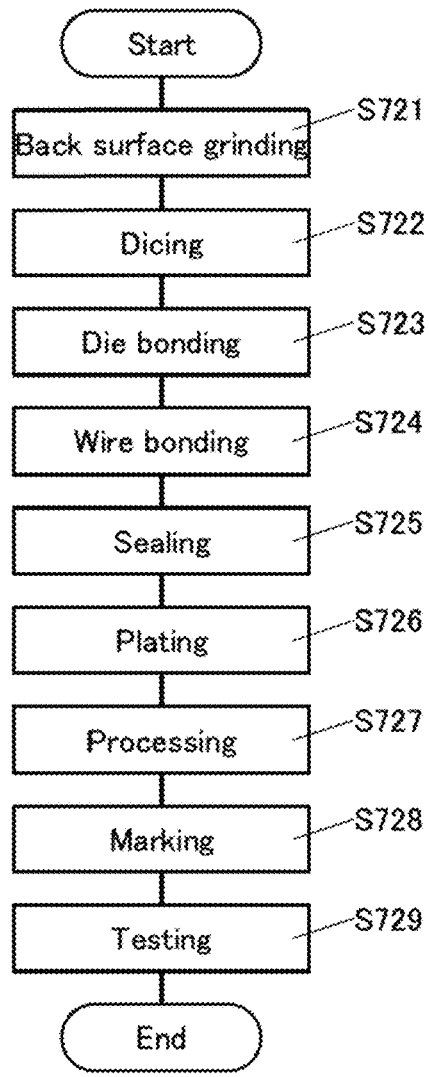
FIG. 32A is a flowchart showing an example of a process of manufacturing an electronic component.

An example of an electronic component using the chip 715 will be described with reference to FIGS. 32A and 32B. Note that an electronic component is also referred to as a semiconductor package or an IC package. For electronic components, there are various standards, names, and the like in accordance with the direction in which terminals are extracted, the shapes of terminals, and the like.

The electronic component is completed when the semiconductor device described in any of the above embodiments is combined with components other than the semiconductor device in an assembly process (post-process).

The post-process is described with reference to a flow chart in FIG. 32A. After the semiconductor device of one embodiment of the present invention and the like are formed over the substrate 711 in a pre-process, a back surface grinding step in which the back surface (the surface where a semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating process, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 32B:
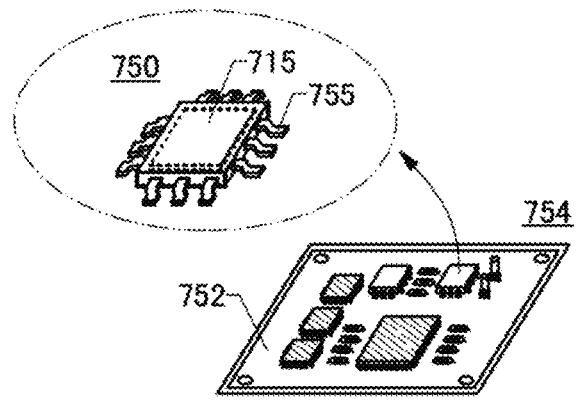
FIG. 32B is a schematic perspective view illustrating the electronic component.

FIG. 32B is a perspective schematic diagram of a completed electronic component. FIG. 32B shows a perspective schematic diagram of a quad flat package (QFP) as an example of an electronic component. An electronic component 750 in FIG. 32B includes a lead 755 and the chip 715. The electronic component 750 may include multiple chips 715.

The electronic component 750 in FIG. 32B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Embodiment 7

<Electronic Device>

A semiconductor device of one embodiment of the present invention can be used for a variety of electronic devices. FIGS. 33A to 33F each illustrate a specific example of an electronic device including the semiconductor device of one embodiment of the present invention.

Figure 33A:
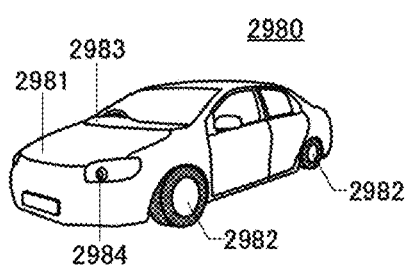
FIGS. 33A to 33F are views illustrating electronic devices of embodiments of the present invention.

FIG. 33A is an external view illustrating an example of a car. A car 2980 includes a car body 2981, wheels 2982, a dashboard 2983, lights 2984, and the like. The car 2980 also includes an antenna, a battery, and the like.

Figure 33B:
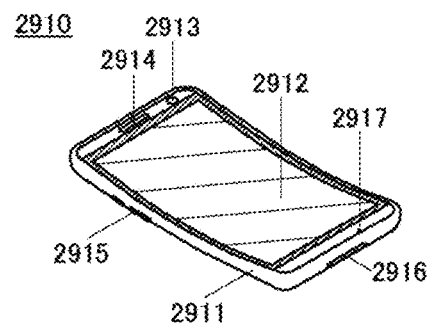

An information terminal 2910 illustrated in FIG. 33B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 33C:
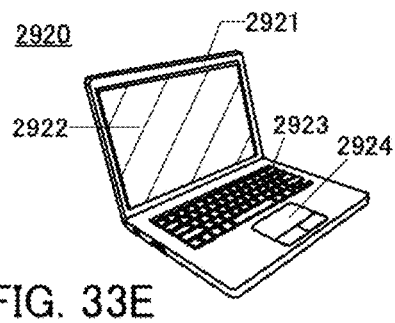

A notebook personal computer 2920 illustrated in FIG. 33C includes a housing 2921, a display portion 2922, a keyboard 2923, a pointing device 2924, and the like. The notebook personal computer 2920 also includes an antenna, a battery, and the like inside the housing 2921.

Figure 33D:
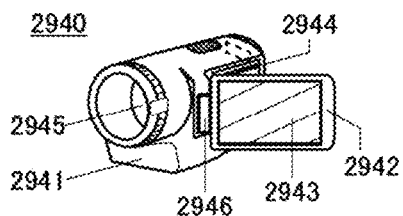

A video camera 2940 illustrated in FIG. 33D includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. By changing the angle between the housings 2941 and 2942, the orientation of an image displayed on the display portion 2943 may be changed or display and non-display of an image may be switched.

Figure 33E:
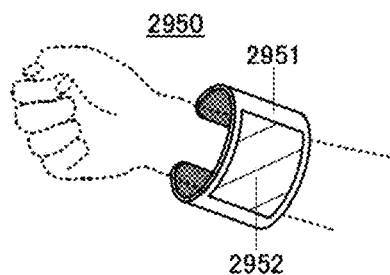

FIG. 33E illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel with a flexible substrate is provided in the display portion 2952, so that the information terminal 2950 can be a user-friendly information terminal that is flexible and lightweight.

Figure 33F:
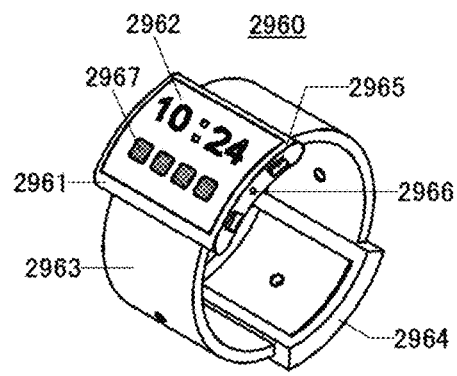

FIG. 33F illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. The functions of the operation switch 2965 can be set by setting the operating system incorporated in the information terminal 2960, for example.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is also possible. The charging operation may be performed by wireless power feeding without using the input/output terminal 2966.

A memory device including the semiconductor device of one embodiment of the present invention, for example, can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments.

This application is based on Japanese Patent Application Serial No. 2016-224546 filed with Japan Patent Office on Nov. 17, 2016 and Japanese Patent Application Serial No. 2016-224503 filed with Japan Patent Office on Nov. 17, 2016, the entire contents of which are hereby incorporated by reference.

What is claimed is:

1. A semiconductor device comprising:
   a first transistor comprising:
      a first conductor over a substrate;
      a first insulator over the first conductor;
      a first oxide over the first insulator;
      a second insulator over the first oxide;
      a second conductor over the second insulator;
      a third insulator over the second conductor;
      a fourth insulator in contact with a side surface of the second insulator, a side surface of the second conductor, and a side surface of the third insulator; and
      a fifth insulator in contact with the first oxide and the fourth insulator,
   a second transistor comprising:
      a third conductor;
      a fourth conductor at least part of which overlaps with the third conductor; and
      a second oxide between the third conductor and the fourth conductor, wherein the third conductor and the fourth conductor are electrically connected to the first conductor.

2. The semiconductor device according to claim 1, wherein each of the first oxide and the second oxide comprises In, an element M, and Zn, and
wherein the element M is Al, Ga, Y, or Sn.

3. The semiconductor device according to claim 1, wherein the first oxide comprises a first region and a second region that overlaps with the second insulator,
wherein at least part of the first region is in contact with the fifth insulator, and
wherein the first region has a higher hydrogen concentration and/or a higher nitrogen concentration than the second region.

4. The semiconductor device according to claim 3, wherein the first region comprises a portion overlapping with the fourth insulator and the second insulator.

5. A semiconductor device comprising:
a first transistor comprising:
   a first conductor over a substrate;
   a first insulator over the first conductor;
   a first oxide over the first insulator;
   a second oxide in contact with at least part of a top surface of the first oxide;
   a third oxide in contact with at least part of a top surface of the second oxide;
   a second insulator over the third oxide;
   a second conductor over the second insulator;
   a third insulator over the second conductor;
   a fourth insulator in contact with a side surface of the second insulator, a side surface of the second conductor, and a side surface of the third insulator; and
   a fifth insulator in contact with the third oxide and the fourth insulator,
a second transistor comprising:
   a third conductor;
   a fourth conductor at least part of which overlaps with the third conductor; and
   a fourth oxide between the third conductor and the fourth conductor,
wherein the third conductor and the fourth conductor are electrically connected to the first conductor.

6. The semiconductor device according to claim 5, wherein each of the first to the fourth oxides comprises In, an element M, and Zn, and
wherein the element M is Al, Ga, Y, or Sn.

7. The semiconductor device according to claim 5, wherein the first oxide comprises a first region and a second region that overlaps with the second insulator,
wherein at least part of the first region is in contact with the fifth insulator, and
wherein the first region has a higher hydrogen concentration and/or a higher nitrogen concentration than the second region.

8. The semiconductor device according to claim 7, wherein the first region comprises a portion overlapping with the fourth insulator and the second insulator.

9. The semiconductor device according to claim 1, wherein the fifth insulator comprises at least one of hydrogen and nitrogen.

10. A semiconductor device comprising:
a first transistor comprising:
   a first conductor over a substrate;
   a first insulator over the first conductor;
   a first oxide over the first insulator;
   a second oxide in contact with at least part of a top surface of the first oxide;
   a third oxide in contact with a side surface of the first oxide and a top surface and a side surface of the second oxide;
   a second insulator over the third oxide;
   a second conductor over the second insulator;
   a third conductor over the second conductor;
   a third insulator over the third conductor;
   a fourth insulator in contact with a side surface of the second insulator, a side surface of the second conductor, a side surface of the third conductor, and a side surface of the third insulator; and
   a fifth insulator in contact with a top surface of the third oxide and a side surface of the fourth insulator,
wherein a top surface of the third insulator and a top surface of the fourth insulator are substantially aligned with each other,
a second transistor comprising:
   a fourth conductor over the substrate;
   a first insulator over the fourth conductor;
   a fourth oxide and a fifth oxide which are apart from each other over the first insulator;
   a sixth oxide in contact with at least part of a top surface of the fourth oxide;
   a seventh oxide in contact with at least part of a top surface of the fifth oxide;
   an eighth oxide in contact with a side surface of the fourth oxide, a side surface of the fifth oxide, a top surface and a side surface of the sixth oxide, and a top surface and a side surface of the seventh oxide and in contact with the first insulator in a region between the fourth oxide and the fifth oxide;
   a sixth insulator over the eighth oxide;
   a fifth conductor which is over the sixth insulator and at least part of which overlaps with a region between the fourth oxide and the fifth oxide;
   a sixth conductor which is over the fifth conductor and at least part of which overlaps with a region between the fourth oxide and the fifth oxide;
   a seventh insulator over the sixth conductor;
   an eighth insulator in contact with a side surface of the sixth insulator, a side surface of the fifth conductor, a side surface of the sixth conductor, and a side surface of the seventh insulator; and
   a fifth insulator in contact with a top surface of the eighth oxide and a side surface of the eighth insulator;
wherein a top surface of the seventh insulator and a top surface of the eighth insulator are substantially aligned with each other.

11. A semiconductor device comprising:
a first transistor comprising:
   a first conductor over a substrate;
   a first insulator over the first conductor;
   a first oxide over the first insulator;
   a second oxide in contact with at least part of a top surface of the first oxide;
   a third oxide in contact with at least part of a top surface of the second oxide;
   a second insulator over the third oxide;
   a second conductor over the second insulator;
   a third conductor over the second conductor;
   a third insulator over the third conductor;
   a fourth insulator in contact with a side surface of the second insulator, a side surface of the second conductor, a side surface of the third conductor, and a side surface of the third insulator; and a fifth insulator in contact with a top surface of the third oxide and a side surface of the fourth insulator, wherein a top surface of the third insulator and a top surface of the fourth insulator are substantially aligned with each other, a second transistor comprising:
- a fourth conductor over the substrate;
- a first insulator over the fourth conductor;
- a fourth oxide and a fifth oxide which are apart from each other over the first insulator;
- a sixth oxide in contact with at least part of a top surface of the fourth oxide;
- a seventh oxide in contact with at least part of a top surface of the fifth oxide;
- an eighth oxide in contact with at least part of a top surface of the sixth oxide and at least part of a top surface of the seventh oxide;
- a sixth insulator over the eighth oxide;
- a fifth conductor which is over the sixth insulator and at least part of which overlaps with a region between the fourth oxide and the fifth oxide;
- a sixth conductor which is over the fifth conductor and at least part of which overlaps with a region between the fourth oxide and the fifth oxide;
- a seventh insulator over the sixth conductor;
- an eighth insulator in contact with a side surface of the sixth insulator, a side surface of the fifth conductor, a side surface of the sixth conductor, and a side surface of the seventh insulator; and
- a fifth insulator in contact with a top surface of the sixth oxide and a side surface of the eighth insulator, wherein a top surface of the seventh insulator and a top surface of the eighth insulator are substantially aligned with each other.

12. The semiconductor device according to claim 10,
wherein each of the first to the eighth oxides comprises In, an element M, and Zn, and
wherein the element M is Al, Ga, Y, or Sn.

13. The semiconductor device according to claim 10,
wherein the second oxide comprises a first region and a second region that overlaps with the second insulator,
wherein at least part of the first region is in contact with the fifth insulator, and
wherein the first region has a higher hydrogen concentration and/or a higher nitrogen concentration than the second region.

14. The semiconductor device according to claim 13,
wherein the first region comprises a portion overlapping with the fourth insulator and the second insulator.

15. The semiconductor device according to claim 10,
wherein the fourth insulator and the eighth insulator comprises aluminum oxide or hafnium oxide.

16. The semiconductor device according to claim 10,
wherein the third insulator and the seventh insulator comprises aluminum oxide or hafnium oxide.

17. The semiconductor device according to claim 10,
wherein the thickness of each of the third insulator and the seventh insulator is larger than the thickness of each of the fourth insulator and the eighth insulator.

18. The semiconductor device according to claim 10,
wherein the second conductor and the fifth conductor comprises conductive oxide.

19. The semiconductor device according to claim 10,
wherein the fifth insulator comprises at least one of hydrogen and nitrogen.

20. The semiconductor device according to claim 10,
wherein the third oxide and the eighth oxide have the same composition.

21. A method of manufacturing a semiconductor device, comprising the steps of:
- forming a first conductor and a second conductor over a substrate;
- forming a first insulator over the first conductor and the second conductor;
- forming a first oxide film and a second oxide film in this order over the first insulator;
- processing the first oxide film and the second oxide film into an island shape, so that a first oxide, a second oxide over the first oxide, a third oxide, a fourth oxide over the third oxide, a fifth oxide, and a sixth oxide over the fifth oxide are formed;
- forming a third oxide film over the first insulator and the first oxide to the sixth oxide;
- processing the third oxide film into an island shape, so that a seventh oxide that covers the first oxide and the second oxide and an eighth oxide that covers the third oxide to the sixth oxide are formed;
- forming a first insulating film, a first conductive film, a second conductive film, and a second insulating film in this order over the first insulator and the first oxide to the eighth oxide;
- etching the first insulating film, the first conductive film, the second conductive film, and the second insulating film, so that a second insulator, a third conductor, a fourth conductor, and a third insulator are formed over the seventh oxide and a fourth insulator, a fifth conductor, a sixth conductor, and a fifth insulator are formed over the eighth oxide;
- forming a third insulating film by an ALD method to cover the seventh oxide, the eighth oxide, the second insulator to the fifth insulator, and the third conductor to the sixth conductor;
- performing dry etching treatment on the third insulating film, so that a sixth insulator is formed in contact with a side surface of the second insulator, a side surface of the third conductor, a side surface of the fourth conductor, and a side surface of the third insulator and a seventh insulator is formed in contact with a side surface of the fourth insulator, a side surface of the fifth conductor, a side surface of the sixth conductor, and a side surface of the fifth insulator; and
- forming an eighth insulator by a PECVD method to cover the seventh oxide, the eighth oxide, the third insulator, the fifth insulator, the sixth insulator, and the seventh insulator.

22. A method of manufacturing a semiconductor device, comprising the steps of:
- forming a first conductor and a second conductor over a substrate;
- forming a first insulator over the first conductor and the second conductor;
- forming a first oxide film and a second oxide film in this order over the first insulator;
- forming an opening in the first oxide film and the second oxide film to expose part of the first insulator;
- forming a third oxide film over the first oxide film and the second oxide film in which the opening is formed and the exposed first insulator;
- processing the first oxide film and the second oxide film in which the opening is formed and the third oxide film into an island shape, so that a first oxide, a second oxide over the first oxide, a seventh oxide over the second oxide, a third oxide, a fourth oxide over the third oxide, a fifth oxide, a sixth oxide over the fifth oxide, and a eighth oxide over the fourth oxide and the sixth oxide are formed;

forming a first insulating film, a first conductive film, a second conductive film, and a second insulating film in this order over the first insulator and the first oxide to the eighth oxide;

etching the first insulating film, the first conductive film, the second conductive film, and the second insulating film, so that a second insulator, a third conductor, a fourth conductor, and a third insulator are formed over the seventh oxide and a fourth insulator, a fifth conductor, a sixth conductor, and a fifth insulator are formed over the eighth oxide;

forming a third insulating film by an ALD method to cover the seventh oxide, the eighth oxide, the second insulator to the fifth insulator, and the third conductor to the sixth conductor;

performing dry etching treatment on the third insulating film, so that a sixth insulator is formed in contact with a side surface of the second insulator, a side surface of the third conductor, a side surface of the fourth conductor, and a side surface of the third insulator and a seventh insulator is formed in contact with a side surface of the fourth insulator, a side surface of the fifth conductor, a side surface of the sixth conductor, and a side surface of the fifth insulator; and forming an eighth insulator by a PECVD method to cover the seventh oxide, the eighth oxide, the third insulator, the fifth insulator, the sixth insulator, and the seventh insulator.

* * * * *